(12) United States Patent
Wu et al.

(10) Patent No.: US 9,116,344 B2
(45) Date of Patent: Aug. 25, 2015

(54) MEMS ANCHORS

(71) Applicant: Pixtronix, Inc., San Diego, CA (US)

(72) Inventors: Joyce H. Wu, Somerville, MA (US);
Mark B. Andersson, Northborough, MA (US); Jasper Lodewyk Steyn, Cupertino, CA (US)

(73) Assignee: Pixtronix, Inc., San Diego, CA (US)

(*) Notice: Subject to any disclaimer, the term of this patent is extended or adjusted under 35 U.S.C. 154(b) by 0 days.

(21) Appl. No.: 14/090,702

(22) Filed: Nov. 26, 2013

(65) Prior Publication Data

US 2014/0085698 A1 Mar. 27, 2014

Related U.S. Application Data

(63) Continuation of application No. 13/449,906, filed on Apr. 18, 2012, now Pat. No. 8,599,463, which is a continuation of application No. 12/606,675, filed on Oct. 27, 2009, now Pat. No. 8,169,679.

(60) Provisional application No. 61/108,783, filed on Oct. 27, 2008.

(51) Int. Cl.
*G02B 26/08* (2006.01)
*G02B 26/02* (2006.01)
*B81B 1/00* (2006.01)
*B81B 3/00* (2006.01)

(52) U.S. Cl.
CPC . *G02B 26/02* (2013.01); *B81B 1/00* (2013.01); *G02B 26/0833* (2013.01); *B81B 3/0035* (2013.01); *B81B 2203/0307* (2013.01)

(58) Field of Classification Search
CPC ........ G02B 26/02; G02B 26/04; G02B 26/06; G02B 26/08; G02B 26/0816; G02B 26/0833; G02B 26/0841
USPC ............. 359/198.1, 214.1, 223.1–226.1, 230, 359/234, 290, 291
See application file for complete search history.

(56) References Cited

U.S. PATENT DOCUMENTS

| 3,864,582 A | 2/1975 | Keeler |
| 4,067,043 A | 1/1978 | Perry |
| 4,074,253 A | 2/1978 | Nadir |
| 4,421,381 A | 12/1983 | Ueda et al. |
| 4,559,535 A | 12/1985 | Watkins et al. |

(Continued)

FOREIGN PATENT DOCUMENTS

| CA | 2241823 A1 | 8/1997 |
| CA | 2334403 A1 | 12/1999 |

(Continued)

OTHER PUBLICATIONS

Boer W.D., "AMLCD Electronics", Active Matrix Liquid Crystal Displays: Fundamentals and Applications, 2005 pp. 87-111, XP055089329, U.S.A, ISBN: 978-0-75-067813-1.

(Continued)

*Primary Examiner* — Euncha Cherry
(74) *Attorney, Agent, or Firm* — Weaver Austin Villeneuve & Sampson, LLP

(57) ABSTRACT

The invention relates to an improved apparatus and method for the design and manufacture of MEMS anchoring structures for light modulators in order to address the stresses of beams mounted on them.

20 Claims, 26 Drawing Sheets

(56) References Cited

U.S. PATENT DOCUMENTS

| | | |
|---|---|---|
| 4,563,836 A | 1/1986 | Woodruff et al. |
| 4,564,836 A | 1/1986 | Vuilleumier et al. |
| 4,582,396 A | 4/1986 | Bos et al. |
| 4,673,253 A | 6/1987 | Tanabe et al. |
| 4,728,936 A | 3/1988 | Guscott et al. |
| 4,744,640 A | 5/1988 | Phillips |
| 4,889,603 A | 12/1989 | DiSanto et al. |
| 4,958,911 A | 9/1990 | Beiswenger et al. |
| 4,991,941 A | 2/1991 | Kalmanash |
| 5,005,108 A | 4/1991 | Pristash et al. |
| 5,025,346 A | 6/1991 | Tang et al. |
| 5,025,356 A | 6/1991 | Gawad |
| 5,042,900 A | 8/1991 | Parker |
| 5,044,734 A | 9/1991 | Sperl et al. |
| 5,050,946 A | 9/1991 | Hathaway et al. |
| 5,061,049 A | 10/1991 | Hornbeck |
| 5,062,689 A | 11/1991 | Koehler |
| 5,078,479 A | 1/1992 | Vuilleumier |
| 5,093,652 A | 3/1992 | Bull et al. |
| 5,096,279 A | 3/1992 | Hornbeck et al. |
| 5,128,787 A | 7/1992 | Blonder |
| 5,136,480 A | 8/1992 | Pristash et al. |
| 5,136,751 A | 8/1992 | Coyne et al. |
| 5,142,405 A | 8/1992 | Hornbeck |
| 5,184,248 A | 2/1993 | De Vaan et al. |
| 5,184,428 A | 2/1993 | Feldt et al. |
| 5,198,730 A | 3/1993 | Vancil |
| 5,202,950 A | 4/1993 | Arego et al. |
| 5,233,385 A | 8/1993 | Sampsell |
| 5,233,459 A | 8/1993 | Bozler et al. |
| 5,245,454 A | 9/1993 | Blonder |
| 5,266,612 A | 11/1993 | Kim et al. |
| 5,278,652 A | 1/1994 | Urbanus et al. |
| 5,280,277 A | 1/1994 | Hornbeck |
| 5,319,061 A | 6/1994 | Ramaswamy |
| 5,319,491 A | 6/1994 | Selbrede |
| 5,339,116 A | 8/1994 | Urbanus et al. |
| 5,339,179 A | 8/1994 | Rudisill et al. |
| 5,359,345 A | 10/1994 | Hunter |
| 5,379,135 A | 1/1995 | Nakagaki et al. |
| 5,393,710 A | 2/1995 | Park et al. |
| 5,396,350 A | 3/1995 | Beeson et al. |
| 5,405,490 A | 4/1995 | Park et al. |
| 5,416,631 A | 5/1995 | Yagi |
| 5,440,197 A | 8/1995 | Gleckman |
| 5,452,024 A | 9/1995 | Sampsell |
| 5,461,411 A | 10/1995 | Florence et al. |
| 5,465,175 A | 11/1995 | Woodgate et al. |
| 5,467,104 A | 11/1995 | Furness, III et al. |
| 5,477,086 A | 12/1995 | Rostoker et al. |
| 5,479,279 A | 12/1995 | Barbier et al. |
| 5,491,347 A | 2/1996 | Allen et al. |
| 5,493,439 A | 2/1996 | Engle |
| 5,497,172 A | 3/1996 | Doherty et al. |
| 5,497,258 A | 3/1996 | Ju et al. |
| 5,499,127 A | 3/1996 | Tsubota et al. |
| 5,504,389 A | 4/1996 | Dickey |
| 5,504,614 A | 4/1996 | Webb et al. |
| 5,510,824 A | 4/1996 | Nelson |
| 5,517,341 A | 5/1996 | Kim et al. |
| 5,517,347 A | 5/1996 | Sampsell |
| 5,519,240 A | 5/1996 | Suzuki |
| 5,519,565 A | 5/1996 | Kalt et al. |
| 5,523,803 A | 6/1996 | Urbanus et al. |
| 5,526,051 A | 6/1996 | Gove et al. |
| 5,528,262 A | 6/1996 | McDowall et al. |
| 5,548,301 A | 8/1996 | Kornher et al. |
| 5,548,670 A | 8/1996 | Koike |
| 5,552,925 A | 9/1996 | Worley |
| 5,559,389 A | 9/1996 | Spindt et al. |
| 5,568,964 A | 10/1996 | Parker et al. |
| 5,578,185 A | 11/1996 | Bergeron et al. |
| 5,579,035 A | 11/1996 | Beiswenger |
| 5,579,240 A | 11/1996 | Buus |
| 5,591,049 A | 1/1997 | Dohnishi |
| 5,596,339 A | 1/1997 | Furness, III et al. |
| 5,596,369 A | 1/1997 | Chau |
| 5,613,751 A | 3/1997 | Parker et al. |
| 5,618,096 A | 4/1997 | Parker et al. |
| 5,619,266 A | 4/1997 | Tomita et al. |
| 5,622,612 A | 4/1997 | Mihara et al. |
| 5,629,784 A | 5/1997 | Abileah et al. |
| 5,629,787 A | 5/1997 | Tsubota et al. |
| 5,655,832 A | 8/1997 | Pelka et al. |
| 5,655,838 A | 8/1997 | Ridley et al. |
| 5,659,327 A | 8/1997 | Furness, III et al. |
| 5,663,917 A | 9/1997 | Oka et al. |
| 5,666,226 A | 9/1997 | Ezra et al. |
| 5,677,749 A | 10/1997 | Tsubota et al. |
| 5,684,354 A | 11/1997 | Gleckman |
| 5,687,465 A | 11/1997 | Hinata et al. |
| 5,691,695 A | 11/1997 | Lahiff |
| 5,694,227 A | 12/1997 | Starkweather |
| 5,724,062 A | 3/1998 | Hunter |
| 5,731,802 A | 3/1998 | Aras et al. |
| 5,745,193 A | 4/1998 | Urbanus et al. |
| 5,745,203 A | 4/1998 | Valliath et al. |
| 5,745,281 A | 4/1998 | Yi et al. |
| 5,745,284 A | 4/1998 | Goldberg et al. |
| 5,771,321 A | 6/1998 | Stern |
| 5,781,331 A | 7/1998 | Carr et al. |
| 5,781,333 A | 7/1998 | Lanzillotta et al. |
| 5,784,189 A | 7/1998 | Bozler et al. |
| 5,794,761 A | 8/1998 | Renaud et al. |
| 5,798,746 A | 8/1998 | Koyama |
| 5,801,792 A | 9/1998 | Smith et al. |
| 5,808,800 A | 9/1998 | Handschy et al. |
| 5,810,469 A | 9/1998 | Weinreich |
| 5,815,134 A | 9/1998 | Nishi |
| 5,835,255 A | 11/1998 | Miles |
| 5,835,256 A | 11/1998 | Huibers |
| 5,854,872 A | 12/1998 | Tai |
| 5,867,302 A | 2/1999 | Fleming |
| 5,876,107 A | 3/1999 | Parker et al. |
| 5,884,872 A | 3/1999 | Greenhalgh |
| 5,889,625 A | 3/1999 | Chen et al. |
| 5,894,686 A | 4/1999 | Parker et al. |
| 5,895,115 A | 4/1999 | Parker et al. |
| 5,917,692 A | 6/1999 | Schmitz et al. |
| 5,921,652 A | 7/1999 | Parker et al. |
| 5,923,480 A | 7/1999 | Labeye |
| 5,926,591 A | 7/1999 | Labeye et al. |
| 5,936,596 A | 8/1999 | Yoshida et al. |
| 5,943,223 A | 8/1999 | Pond |
| 5,953,469 A | 9/1999 | Zhou |
| 5,959,763 A | 9/1999 | Bozler et al. |
| 5,963,367 A | 10/1999 | Aksyuk et al. |
| 5,973,727 A | 10/1999 | McGrew et al. |
| 5,975,711 A | 11/1999 | Parker et al. |
| 5,986,628 A | 11/1999 | Tuenge et al. |
| 5,986,796 A | 11/1999 | Miles |
| 5,986,828 A | 11/1999 | Wood et al. |
| 5,990,990 A | 11/1999 | Crabtree |
| 5,994,204 A | 11/1999 | Young et al. |
| 5,995,688 A | 11/1999 | Aksyuk et al. |
| 6,008,781 A | 12/1999 | Furness, III et al. |
| 6,008,929 A | 12/1999 | Akimoto et al. |
| 6,028,656 A | 2/2000 | Buhrer et al. |
| 6,030,089 A | 2/2000 | Parker et al. |
| 6,034,807 A | 3/2000 | Little et al. |
| 6,040,796 A | 3/2000 | Matsugatani et al. |
| 6,040,937 A | 3/2000 | Miles |
| 6,046,836 A | 4/2000 | Tuchman |
| 6,046,840 A | 4/2000 | Huibers |
| 6,049,317 A | 4/2000 | Thompson et al. |
| 6,055,090 A | 4/2000 | Miles |
| 6,069,676 A | 5/2000 | Yuyama |
| 6,079,838 A | 6/2000 | Parker et al. |
| 6,111,560 A | 8/2000 | May |
| 6,130,527 A | 10/2000 | Bontempo et al. |
| 6,130,735 A | 10/2000 | Hatanaka et al. |
| 6,137,313 A | 10/2000 | Wong et al. |
| 6,154,586 A | 11/2000 | MacDonald et al. |
| 6,158,867 A | 12/2000 | Parker et al. |

(56) References Cited

U.S. PATENT DOCUMENTS

| | | |
|---|---|---|
| 6,162,657 A | 12/2000 | Schiele et al. |
| 6,168,395 B1 | 1/2001 | Quenzer et al. |
| 6,172,657 B1 | 1/2001 | Kamakura et al. |
| 6,172,797 B1 | 1/2001 | Huibers |
| 6,174,064 B1 | 1/2001 | Kalantar et al. |
| 6,195,196 B1 | 2/2001 | Kimura et al. |
| 6,201,633 B1 | 3/2001 | Peeters et al. |
| 6,201,664 B1 | 3/2001 | Le et al. |
| 6,206,550 B1 | 3/2001 | Fukushima et al. |
| 6,215,536 B1 | 4/2001 | Ebihara et al. |
| 6,219,119 B1 | 4/2001 | Nakai |
| 6,225,991 B1 | 5/2001 | McKnight |
| 6,227,677 B1 | 5/2001 | Willis |
| 6,239,777 B1 | 5/2001 | Sugahara et al. |
| 6,249,169 B1 | 6/2001 | Okada |
| 6,249,269 B1 | 6/2001 | Blalock et al. |
| 6,249,370 B1 | 6/2001 | Takeuchi et al. |
| 6,266,240 B1 | 7/2001 | Urban et al. |
| 6,275,320 B1 | 8/2001 | Dhuler et al. |
| 6,282,951 B1 | 9/2001 | Loga et al. |
| 6,285,270 B1 | 9/2001 | Lane et al. |
| 6,288,824 B1 | 9/2001 | Kastalsky |
| 6,288,829 B1 | 9/2001 | Kimura |
| 6,295,054 B1 | 9/2001 | McKnight |
| 6,296,383 B1 | 10/2001 | Henningsen |
| 6,296,838 B1 | 10/2001 | Bindra et al. |
| 6,300,154 B2 | 10/2001 | Clark et al. |
| 6,300,294 B1 | 10/2001 | Robbins et al. |
| 6,317,103 B1 | 11/2001 | Furness, III et al. |
| 6,323,834 B1 | 11/2001 | Colgan et al. |
| 6,329,967 B1 | 12/2001 | Little et al. |
| 6,329,971 B2 | 12/2001 | McKnight |
| 6,329,974 B1 | 12/2001 | Walker et al. |
| 6,360,033 B1 | 3/2002 | Lee et al. |
| 6,367,940 B1 | 4/2002 | Parker et al. |
| 6,388,661 B1 | 5/2002 | Richards |
| 6,392,736 B1 | 5/2002 | Furukawa et al. |
| 6,402,335 B1 | 6/2002 | Kalantar et al. |
| 6,402,355 B1 | 6/2002 | Kinouchi |
| 6,404,942 B1 | 6/2002 | Edwards et al. |
| 6,407,851 B1 | 6/2002 | Islam et al. |
| 6,411,423 B2 | 6/2002 | Ham |
| 6,424,329 B1 | 7/2002 | Okita |
| 6,424,388 B1 | 7/2002 | Colgan et al. |
| 6,428,173 B1 | 8/2002 | Dhuler et al. |
| 6,429,625 B1 | 8/2002 | LeFevre et al. |
| 6,429,628 B2 | 8/2002 | Nakagawa |
| 6,459,467 B1 | 10/2002 | Hashimoto et al. |
| 6,471,879 B2 | 10/2002 | Hanson et al. |
| 6,473,220 B1 | 10/2002 | Clikeman et al. |
| 6,476,886 B2 | 11/2002 | Krusius et al. |
| 6,483,613 B1 | 11/2002 | Woodgate et al. |
| 6,486,997 B1 | 11/2002 | Bruzzone et al. |
| 6,498,685 B1 | 12/2002 | Johnson |
| 6,504,985 B2 | 1/2003 | Parker et al. |
| 6,507,138 B1 | 1/2003 | Rodgers et al. |
| 6,508,563 B2 | 1/2003 | Parker et al. |
| 6,514,111 B2 | 2/2003 | Ebihara et al. |
| 6,523,961 B2 | 2/2003 | Ilkov et al. |
| 6,529,250 B1 | 3/2003 | Murakami et al. |
| 6,529,265 B1 | 3/2003 | Henningsen |
| 6,531,329 B2 | 3/2003 | Asakura et al. |
| 6,531,947 B1 | 3/2003 | Weaver et al. |
| 6,532,044 B1 | 3/2003 | Conner et al. |
| 6,535,256 B1 | 3/2003 | Ishihara et al. |
| 6,535,311 B1 | 3/2003 | Lindquist |
| 6,556,258 B1 | 4/2003 | Yoshida et al. |
| 6,556,261 B1 | 4/2003 | Krusius et al. |
| RE38,108 E | 5/2003 | Chee et al. |
| 6,559,827 B1 | 5/2003 | Mangerson |
| 6,567,063 B1 | 5/2003 | Okita |
| 6,567,138 B1 | 5/2003 | Krusius et al. |
| 6,574,033 B1 | 6/2003 | Chui et al. |
| 6,576,887 B2 | 6/2003 | Whitney et al. |
| 6,582,095 B1 | 6/2003 | Toyoda |
| 6,583,915 B1 | 6/2003 | Hong et al. |
| 6,589,625 B1 | 7/2003 | Kothari et al. |
| 6,591,049 B2 | 7/2003 | Williams et al. |
| 6,593,677 B2 | 7/2003 | Behin et al. |
| 6,600,474 B1 | 7/2003 | Heines et al. |
| 6,621,488 B1 | 9/2003 | Takeuchi et al. |
| 6,626,540 B2 | 9/2003 | Ouchi et al. |
| 6,633,301 B1 | 10/2003 | Dallas et al. |
| 6,639,570 B2 | 10/2003 | Furness, III et al. |
| 6,639,572 B1 | 10/2003 | Little et al. |
| 6,650,455 B2 | 11/2003 | Miles |
| 6,650,822 B1 | 11/2003 | Zhou |
| 6,664,779 B2 | 12/2003 | Lopes et al. |
| 6,666,561 B1 | 12/2003 | Blakley |
| 6,671,078 B2 | 12/2003 | Flanders et al. |
| 6,674,562 B1 | 1/2004 | Miles |
| 6,677,709 B1 | 1/2004 | Ma et al. |
| 6,677,936 B2 | 1/2004 | Jacobsen et al. |
| 6,678,029 B2 | 1/2004 | Suzuki |
| 6,680,792 B2 | 1/2004 | Miles |
| 6,687,040 B2 | 2/2004 | Kimura |
| 6,687,896 B1 | 2/2004 | Royce et al. |
| 6,690,422 B1 | 2/2004 | Daly et al. |
| 6,697,035 B2 | 2/2004 | Sugahara et al. |
| 6,698,348 B1 | 3/2004 | Bloss |
| 6,698,349 B2 | 3/2004 | Komata |
| 6,700,554 B2 | 3/2004 | Ham et al. |
| 6,701,039 B2 | 3/2004 | Bourgeois et al. |
| 6,707,176 B1 | 3/2004 | Rodgers |
| 6,710,008 B2 | 3/2004 | Chang et al. |
| 6,710,538 B1 | 3/2004 | Ahn et al. |
| 6,710,908 B2 | 3/2004 | Miles et al. |
| 6,710,920 B1 | 3/2004 | Mashitani et al. |
| 6,712,071 B1 | 3/2004 | Parker |
| 6,712,481 B2 | 3/2004 | Parker et al. |
| 6,731,355 B2 | 5/2004 | Miyashita |
| 6,731,492 B2 | 5/2004 | Goodwin-Johansson |
| 6,733,354 B1 | 5/2004 | Cathey et al. |
| 6,738,177 B1 | 5/2004 | Gutierrez et al. |
| 6,741,377 B2 | 5/2004 | Miles |
| 6,746,886 B2 | 6/2004 | Duncan et al. |
| 6,749,312 B2 | 6/2004 | Parker et al. |
| 6,750,930 B2 | 6/2004 | Yoshii et al. |
| 6,752,505 B2 | 6/2004 | Parker et al. |
| 6,755,534 B2 | 6/2004 | Veligdan et al. |
| 6,755,547 B2 | 6/2004 | Parker |
| 6,760,081 B2 | 7/2004 | Takagi |
| 6,760,505 B1 | 7/2004 | Street et al. |
| 6,762,743 B2 | 7/2004 | Yoshihara et al. |
| 6,762,868 B2 | 7/2004 | Liu et al. |
| 6,764,796 B2 | 7/2004 | Fries |
| 6,774,964 B2 | 8/2004 | Funamoto et al. |
| 6,775,048 B1 | 8/2004 | Starkweather et al. |
| 6,778,162 B2 | 8/2004 | Kimura et al. |
| 6,778,228 B2 | 8/2004 | Murakami et al. |
| 6,778,248 B1 | 8/2004 | Ootaguro et al. |
| 6,785,454 B2 | 8/2004 | Abe |
| 6,787,969 B2 | 9/2004 | Grade et al. |
| 6,788,371 B2 | 9/2004 | Tanada et al. |
| 6,794,119 B2 | 9/2004 | Miles |
| 6,795,064 B2 | 9/2004 | Walker et al. |
| 6,796,668 B2 | 9/2004 | Parker et al. |
| 6,798,935 B2 | 9/2004 | Bourgeois et al. |
| 6,800,996 B2 | 10/2004 | Nagai et al. |
| 6,809,851 B1 | 10/2004 | Gurcan |
| 6,819,386 B2 | 11/2004 | Roosendaal et al. |
| 6,819,465 B2 | 11/2004 | Clikeman et al. |
| 6,822,734 B1 | 11/2004 | Eidelman et al. |
| 6,825,470 B1 | 11/2004 | Bawolek et al. |
| 6,825,499 B2 | 11/2004 | Nakajima et al. |
| 6,827,456 B2 | 12/2004 | Parker et al. |
| 6,831,678 B1 | 12/2004 | Travis |
| 6,832,511 B2 | 12/2004 | Samoto et al. |
| 6,835,111 B2 | 12/2004 | Ahn et al. |
| 6,844,959 B2 | 1/2005 | Huibers et al. |
| 6,846,082 B2 | 1/2005 | Glent-Madsen et al. |
| 6,846,089 B2 | 1/2005 | Stevenson et al. |
| 6,847,425 B2 | 1/2005 | Tanada et al. |
| 6,847,428 B1 | 1/2005 | Sekiguchi et al. |

(56) References Cited

U.S. PATENT DOCUMENTS

| | | |
|---|---|---|
| 6,852,095 B1 | 2/2005 | Ray |
| 6,857,751 B2 | 2/2005 | Penn et al. |
| 6,859,625 B2 | 2/2005 | Sawada |
| 6,862,072 B2 | 3/2005 | Liu et al. |
| 6,863,219 B1 | 3/2005 | Jacobsen et al. |
| 6,864,618 B2 | 3/2005 | Miller et al. |
| 6,867,192 B1 | 3/2005 | Armour et al. |
| 6,867,896 B2 | 3/2005 | Miles |
| 6,873,311 B2 | 3/2005 | Yoshihara et al. |
| 6,879,307 B1 | 4/2005 | Stern |
| 6,886,956 B2 | 5/2005 | Parker et al. |
| 6,887,202 B2 | 5/2005 | Currie et al. |
| 6,888,678 B2 | 5/2005 | Nishiyama et al. |
| 6,889,565 B2 | 5/2005 | DeConde et al. |
| 6,893,677 B2 | 5/2005 | Yamada et al. |
| 6,897,164 B2 | 5/2005 | Baude et al. |
| 6,897,843 B2 | 5/2005 | Ayres et al. |
| 6,900,072 B2 | 5/2005 | Patel et al. |
| 6,906,847 B2 | 6/2005 | Huibers et al. |
| 6,911,891 B2 | 6/2005 | Qiu et al. |
| 6,911,964 B2 | 6/2005 | Lee et al. |
| 6,912,082 B1 | 6/2005 | Lu et al. |
| 6,919,981 B2 | 7/2005 | Clikeman et al. |
| 6,934,080 B2 | 8/2005 | Saccomanno et al. |
| 6,936,013 B2 | 8/2005 | Pevoto |
| 6,936,968 B2 | 8/2005 | Cross et al. |
| 6,939,013 B2 | 9/2005 | Asao |
| 6,940,631 B2 | 9/2005 | Ishikawa |
| 6,943,495 B2 | 9/2005 | Ma et al. |
| 6,947,107 B2 | 9/2005 | Yoshii et al. |
| 6,947,195 B2 | 9/2005 | Ohtaka et al. |
| 6,950,240 B2 | 9/2005 | Matsuo |
| 6,952,301 B2 | 10/2005 | Huibers |
| 6,953,375 B2 | 10/2005 | Ahn et al. |
| 6,961,167 B2 | 11/2005 | Prins et al. |
| 6,962,418 B2 | 11/2005 | Utsumi et al. |
| 6,962,419 B2 | 11/2005 | Huibers |
| 6,963,330 B2 | 11/2005 | Sugahara et al. |
| 6,965,375 B1 | 11/2005 | Gettemy et al. |
| 6,967,698 B2 | 11/2005 | Tanoue et al. |
| 6,967,763 B2 | 11/2005 | Fujii et al. |
| 6,969,635 B2 | 11/2005 | Patel et al. |
| 6,970,227 B2 | 11/2005 | Kida et al. |
| 6,972,889 B2 | 12/2005 | Goodwin-Johansson et al. |
| 6,977,710 B2 | 12/2005 | Akiyama et al. |
| 6,980,349 B1 | 12/2005 | Huibers et al. |
| 6,985,205 B2 | 1/2006 | Chol et al. |
| 6,992,375 B2 | 1/2006 | Robbins et al. |
| 6,996,306 B2 | 2/2006 | Chen et al. |
| 7,004,610 B2 | 2/2006 | Yamashita et al. |
| 7,004,611 B2 | 2/2006 | Parker et al. |
| 7,012,726 B1 | 3/2006 | Miles |
| 7,012,732 B2 | 3/2006 | Miles |
| 7,014,349 B2 | 3/2006 | Shinohara et al. |
| 7,019,809 B2 | 3/2006 | Sekiguchi |
| 7,026,821 B2 | 4/2006 | Martin et al. |
| 7,038,758 B2 | 5/2006 | Suzuki |
| 7,042,618 B2 | 5/2006 | Selbrede et al. |
| 7,042,643 B2 | 5/2006 | Miles |
| 7,046,221 B1 | 5/2006 | Malzbender |
| 7,046,905 B1 | 5/2006 | Gardiner et al. |
| 7,048,905 B2 | 5/2006 | Paparatto et al. |
| 7,050,035 B2 | 5/2006 | Iisaka |
| 7,050,141 B2 | 5/2006 | Yokoue |
| 7,050,219 B2 | 5/2006 | Kimura |
| 7,050,790 B2 | 5/2006 | Yamaga |
| 7,057,790 B2 | 6/2006 | Selbrede |
| 7,060,895 B2 | 6/2006 | Kothari et al. |
| 7,071,611 B2 | 7/2006 | Yonekubo et al. |
| 7,072,096 B2 | 7/2006 | Holman et al. |
| 7,075,702 B2 | 7/2006 | Huibers et al. |
| 7,092,142 B2 | 8/2006 | Selebrede et al. |
| 7,110,158 B2 | 9/2006 | Miles |
| 7,116,464 B2 | 10/2006 | Osawa |
| 7,119,944 B2 | 10/2006 | Patel et al. |
| 7,123,216 B1 | 10/2006 | Miles |
| 7,123,796 B2 | 10/2006 | Steckl et al. |
| 7,126,738 B2 | 10/2006 | Miles |
| 7,140,751 B2 | 11/2006 | Lin |
| 7,156,548 B2 | 1/2007 | Teng et al. |
| 7,161,094 B2 | 1/2007 | Kothari et al. |
| 7,164,250 B2 | 1/2007 | Boscolo et al. |
| 7,164,520 B2 | 1/2007 | Palmateer et al. |
| 7,180,677 B2 | 2/2007 | Fujii et al. |
| 7,184,202 B2 | 2/2007 | Miles et al. |
| 7,196,837 B2 | 3/2007 | Sampsell et al. |
| 7,198,982 B2 | 4/2007 | Patel et al. |
| 7,199,916 B2 | 4/2007 | Faase et al. |
| 7,215,459 B2 | 5/2007 | Huibers et al. |
| 7,217,588 B2 | 5/2007 | Hartzell et al. |
| 7,218,437 B2 | 5/2007 | Selbrede |
| 7,227,677 B2 | 6/2007 | Ravnkilde et al. |
| 7,233,304 B1 | 6/2007 | Aratani et al. |
| 7,271,945 B2 | 9/2007 | Hagood et al. |
| 7,274,416 B2 | 9/2007 | Feenstra et al. |
| 7,291,363 B2 | 11/2007 | Miller |
| 7,292,235 B2 | 11/2007 | Nose |
| 7,298,448 B2 | 11/2007 | Wu |
| 7,304,785 B2 | 12/2007 | Hagood et al. |
| 7,304,786 B2 | 12/2007 | Hagood et al. |
| 7,315,294 B2 | 1/2008 | Richards |
| 7,345,805 B2 | 3/2008 | Chui |
| 7,359,108 B2 | 4/2008 | Hayes et al. |
| 7,365,897 B2 | 4/2008 | Hagood et al. |
| 7,374,328 B2 | 5/2008 | Kuroda et al. |
| 7,391,493 B2 | 6/2008 | Kim |
| 7,391,552 B2 | 6/2008 | Barton et al. |
| 7,405,852 B2 | 7/2008 | Hagood, IV et al. |
| 7,417,735 B2 | 8/2008 | Cummings et al. |
| 7,417,782 B2 | 8/2008 | Hagood et al. |
| 7,420,725 B2 | 9/2008 | Kothari |
| 7,460,290 B2 | 12/2008 | Hagood, IV et al. |
| 7,463,227 B2 | 12/2008 | Van Gorkom et al. |
| 7,463,398 B2 | 12/2008 | Feenstra et al. |
| 7,502,159 B2 * | 3/2009 | Hagood et al. .............. 359/290 |
| 7,529,012 B2 | 5/2009 | Hayes et al. |
| 7,551,344 B2 | 6/2009 | Hagood et al. |
| 7,573,547 B2 | 8/2009 | Palmateer et al. |
| 7,601,942 B2 | 10/2009 | Underwood et al. |
| 7,616,368 B2 | 11/2009 | Hagood, IV |
| 7,619,806 B2 | 11/2009 | Hagood, IV et al. |
| 7,636,189 B2 | 12/2009 | Hagood, IV et al. |
| 7,666,049 B2 | 2/2010 | Saito et al. |
| 7,675,665 B2 | 3/2010 | Hagood et al. |
| 7,715,080 B2 | 5/2010 | Natarajan et al. |
| 7,729,037 B2 | 6/2010 | Hagood et al. |
| 7,742,016 B2 | 6/2010 | Hagood et al. |
| 7,742,215 B2 | 6/2010 | Hagood, IV |
| 7,746,529 B2 | 6/2010 | Hagood et al. |
| 7,755,582 B2 | 7/2010 | Hagood et al. |
| 7,826,127 B2 | 11/2010 | Khonsari et al. |
| 7,839,356 B2 | 11/2010 | Hagood et al. |
| 7,852,546 B2 | 12/2010 | Fijol et al. |
| 7,876,489 B2 | 1/2011 | Gandhi et al. |
| 7,898,714 B2 | 3/2011 | Hagood, IV et al. |
| 7,920,317 B2 | 4/2011 | Lee et al. |
| 7,927,654 B2 | 4/2011 | Hagood et al. |
| 7,975,665 B2 | 7/2011 | Mori |
| 7,999,994 B2 | 8/2011 | Hagood, IV et al. |
| 8,159,428 B2 | 4/2012 | Hagood et al. |
| 8,169,679 B2 | 5/2012 | Wu et al. |
| 8,310,442 B2 | 11/2012 | Hagood et al. |
| 8,482,496 B2 | 7/2013 | Lewis |
| 8,519,923 B2 | 8/2013 | Hagood et al. |
| 8,519,945 B2 | 8/2013 | Hagood et al. |
| 8,526,096 B2 | 9/2013 | Steyn et al. |
| 8,599,463 B2 | 12/2013 | Wu et al. |
| 8,698,980 B2 | 4/2014 | Chao et al. |
| 2001/0001260 A1 | 5/2001 | Parker et al. |
| 2001/0028422 A1 | 10/2001 | Tsujimura et al. |
| 2001/0028993 A1 | 10/2001 | Sanford |
| 2001/0030488 A1 | 10/2001 | Jerman et al. |
| 2001/0040538 A1 | 11/2001 | Quanrud |
| 2001/0043177 A1 | 11/2001 | Huston et al. |

(56) References Cited

U.S. PATENT DOCUMENTS

| | | |
|---|---|---|
| 2001/0043208 A1 | 11/2001 | Furness et al. |
| 2001/0048265 A1 | 12/2001 | Miller et al. |
| 2001/0048431 A1 | 12/2001 | Laffargue et al. |
| 2001/0050661 A1 | 12/2001 | Noda et al. |
| 2001/0053075 A1 | 12/2001 | Parker et al. |
| 2002/0000959 A1 | 1/2002 | Colgan et al. |
| 2002/0001051 A1 | 1/2002 | Krusius et al. |
| 2002/0009275 A1 | 1/2002 | Williams et al. |
| 2002/0012159 A1 | 1/2002 | Tew |
| 2002/0015215 A1 | 2/2002 | Miles |
| 2002/0024641 A1 | 2/2002 | Ilkov et al. |
| 2002/0024711 A1 | 2/2002 | Miles |
| 2002/0030566 A1 | 3/2002 | Bozler et al. |
| 2002/0047172 A1 | 4/2002 | Reid |
| 2002/0051096 A1 | 5/2002 | Yamazaki et al. |
| 2002/0054424 A1 | 5/2002 | Miles |
| 2002/0054487 A1 | 5/2002 | Parker et al. |
| 2002/0056900 A1 | 5/2002 | Liu et al. |
| 2002/0063218 A1 | 5/2002 | Maydanich et al. |
| 2002/0063661 A1 | 5/2002 | Comiskey et al. |
| 2002/0070931 A1 | 6/2002 | Ishikawa |
| 2002/0075555 A1 | 6/2002 | Miles |
| 2002/0080598 A1 | 6/2002 | Parker et al. |
| 2002/0093722 A1 | 7/2002 | Chan et al. |
| 2002/0109903 A1 | 8/2002 | Kaeriyama |
| 2002/0113281 A1 | 8/2002 | Cunningham et al. |
| 2002/0126364 A1 | 9/2002 | Miles |
| 2002/0126387 A1 | 9/2002 | Ishikawa et al. |
| 2002/0132389 A1 | 9/2002 | Patel et al. |
| 2002/0135553 A1 | 9/2002 | Nagai et al. |
| 2002/0141174 A1 | 10/2002 | Parker et al. |
| 2002/0149828 A1 | 10/2002 | Miles et al. |
| 2002/0150698 A1 | 10/2002 | Kawabata |
| 2002/0163482 A1 | 11/2002 | Sullivan |
| 2002/0163484 A1 | 11/2002 | Furness, III |
| 2002/0163709 A1 | 11/2002 | Mirza |
| 2002/0171327 A1 | 11/2002 | Miller et al. |
| 2002/0181597 A1 | 12/2002 | Okada |
| 2002/0185699 A1 | 12/2002 | Reid |
| 2002/0191267 A1 | 12/2002 | Flanders et al. |
| 2002/0195423 A1 | 12/2002 | Patel et al. |
| 2002/0196522 A1 | 12/2002 | Little et al. |
| 2003/0001815 A1 | 1/2003 | Cui |
| 2003/0007344 A1 | 1/2003 | Parker |
| 2003/0009898 A1 | 1/2003 | Slocum et al. |
| 2003/0023110 A1 | 1/2003 | Tam et al. |
| 2003/0029705 A1 | 2/2003 | Qiu et al. |
| 2003/0036215 A1 | 2/2003 | Reid |
| 2003/0042157 A1 | 3/2003 | Mays |
| 2003/0043157 A1 | 3/2003 | Miles |
| 2003/0043337 A1 | 3/2003 | Takabayashi |
| 2003/0048036 A1 | 3/2003 | Lemkin |
| 2003/0048370 A1 | 3/2003 | Koyama |
| 2003/0058543 A1 | 3/2003 | Sheedy et al. |
| 2003/0063233 A1 | 4/2003 | Takagi |
| 2003/0063234 A1 | 4/2003 | Oda et al. |
| 2003/0067565 A1 | 4/2003 | Yamamura |
| 2003/0068118 A1 | 4/2003 | Bourgeois et al. |
| 2003/0071686 A1 | 4/2003 | Lemkin |
| 2003/0072070 A1 | 4/2003 | Miles |
| 2003/0076649 A1 | 4/2003 | Speakman |
| 2003/0081315 A1 | 5/2003 | Kobayashi |
| 2003/0081402 A1 | 5/2003 | Jeon et al. |
| 2003/0085650 A1 | 5/2003 | Cathey et al. |
| 2003/0085867 A1 | 5/2003 | Grabert |
| 2003/0095081 A1 | 5/2003 | Furness, III |
| 2003/0095398 A1 | 5/2003 | Parker et al. |
| 2003/0102810 A1 | 6/2003 | Cross et al. |
| 2003/0123245 A1 | 7/2003 | Parker et al. |
| 2003/0123246 A1 | 7/2003 | Parker |
| 2003/0123247 A1 | 7/2003 | Parker et al. |
| 2003/0128218 A1 | 7/2003 | Struyk |
| 2003/0128416 A1 | 7/2003 | Caracci et al. |
| 2003/0133284 A1 | 7/2003 | Chipchase et al. |
| 2003/0137499 A1 | 7/2003 | Lisaka |
| 2003/0152872 A1 | 8/2003 | Miles |
| 2003/0156422 A1 | 8/2003 | Tatewaki et al. |
| 2003/0164814 A1 | 9/2003 | Starkweather et al. |
| 2003/0174422 A1 | 9/2003 | Miller et al. |
| 2003/0174931 A1 | 9/2003 | Rodgers et al. |
| 2003/0183008 A1 | 10/2003 | Bang et al. |
| 2003/0184189 A1 | 10/2003 | Sinclair |
| 2003/0190535 A1 | 10/2003 | Fries |
| 2003/0190536 A1 | 10/2003 | Fries |
| 2003/0196590 A1 | 10/2003 | Hartzell |
| 2003/0202338 A1 | 10/2003 | Parker |
| 2003/0210811 A1 | 11/2003 | Dubowsky et al. |
| 2003/0218793 A1 | 11/2003 | Soneda et al. |
| 2003/0231160 A1 | 12/2003 | Yoshihara et al. |
| 2004/0001033 A1 | 1/2004 | Goodwin-Johansson et al. |
| 2004/0012946 A1 | 1/2004 | Parker et al. |
| 2004/0027636 A1 | 2/2004 | Miles |
| 2004/0036668 A1 | 2/2004 | Nakanishi |
| 2004/0051929 A1 | 3/2004 | Sampsell et al. |
| 2004/0058532 A1 | 3/2004 | Miles et al. |
| 2004/0076008 A1 | 4/2004 | Ikeda |
| 2004/0080240 A1 | 4/2004 | Miller et al. |
| 2004/0080484 A1 | 4/2004 | Heines et al. |
| 2004/0080927 A1 | 4/2004 | Parker et al. |
| 2004/0085608 A1 | 5/2004 | Theil et al. |
| 2004/0085749 A1 | 5/2004 | Parker et al. |
| 2004/0088629 A1 | 5/2004 | Ott |
| 2004/0090144 A1 | 5/2004 | Miller et al. |
| 2004/0090599 A1 | 5/2004 | Kowarz et al. |
| 2004/0095739 A1 | 5/2004 | Parker et al. |
| 2004/0100677 A1 | 5/2004 | Huibers et al. |
| 2004/0113903 A1 | 6/2004 | Mikami et al. |
| 2004/0114346 A1 | 6/2004 | Parker et al. |
| 2004/0122328 A1 | 6/2004 | Wang et al. |
| 2004/0125062 A1 | 7/2004 | Yamamoto et al. |
| 2004/0125346 A1 | 7/2004 | Huibers |
| 2004/0135273 A1 | 7/2004 | Parker et al. |
| 2004/0135951 A1 | 7/2004 | Stumbo et al. |
| 2004/0136204 A1 | 7/2004 | Asao |
| 2004/0136680 A1 | 7/2004 | Medina et al. |
| 2004/0141700 A1 | 7/2004 | Yang |
| 2004/0145580 A1 | 7/2004 | Perlman |
| 2004/0145793 A1 | 7/2004 | Barbour et al. |
| 2004/0145854 A1 | 7/2004 | Tamura |
| 2004/0156246 A1 | 8/2004 | Nakamura |
| 2004/0157664 A1 | 8/2004 | Link |
| 2004/0165372 A1 | 8/2004 | Parker |
| 2004/0171206 A1 | 9/2004 | Rodgers |
| 2004/0173872 A1 | 9/2004 | Park et al. |
| 2004/0179146 A1 | 9/2004 | Nilsson |
| 2004/0184710 A1 | 9/2004 | Kubby et al. |
| 2004/0196215 A1 | 10/2004 | Duthaler et al. |
| 2004/0196525 A1 | 10/2004 | Fujii et al. |
| 2004/0207768 A1 | 10/2004 | Liu |
| 2004/0207815 A1 | 10/2004 | Allen et al. |
| 2004/0212759 A1 | 10/2004 | Hayashi |
| 2004/0212907 A1 | 10/2004 | Mala et al. |
| 2004/0217919 A1 | 11/2004 | Piehl et al. |
| 2004/0218149 A1 | 11/2004 | Huibers |
| 2004/0218154 A1 | 11/2004 | Huibers |
| 2004/0218292 A1 | 11/2004 | Huibers |
| 2004/0218293 A1 | 11/2004 | Huibers |
| 2004/0223088 A1 | 11/2004 | Huibers |
| 2004/0223240 A1 | 11/2004 | Huibers |
| 2004/0227428 A1 | 11/2004 | Sinclair |
| 2004/0233354 A1 | 11/2004 | Uehara et al. |
| 2004/0233392 A1 | 11/2004 | Huibers |
| 2004/0233498 A1 | 11/2004 | Starkweather et al. |
| 2004/0233503 A1 | 11/2004 | Kimura |
| 2004/0240032 A1 | 12/2004 | Miles |
| 2004/0240138 A1 | 12/2004 | Martin et al. |
| 2004/0246275 A1 | 12/2004 | Yoshihara et al. |
| 2004/0263076 A1 | 12/2004 | De Zwart et al. |
| 2004/0263502 A1 | 12/2004 | Dallas et al. |
| 2004/0263944 A1 | 12/2004 | Miles et al. |
| 2005/0002082 A1 | 1/2005 | Miles |
| 2005/0002086 A1 | 1/2005 | Starkweather et al. |
| 2005/0007671 A1 | 1/2005 | Onvlee |
| 2005/0007759 A1 | 1/2005 | Parker |

(56) References Cited

U.S. PATENT DOCUMENTS

| | | |
|---|---|---|
| 2005/0012197 A1 | 1/2005 | Smith et al. |
| 2005/0018322 A1 | 1/2005 | Ben-Gad et al. |
| 2005/0024849 A1 | 2/2005 | Parker et al. |
| 2005/0052681 A1 | 3/2005 | Kogi |
| 2005/0052723 A1 | 3/2005 | Watanabe et al. |
| 2005/0059184 A1 | 3/2005 | Sniegowski et al. |
| 2005/0062708 A1 | 3/2005 | Yoshihara et al. |
| 2005/0063037 A1 | 3/2005 | Selbrede et al. |
| 2005/0072032 A1 | 4/2005 | McCollum et al. |
| 2005/0073471 A1 | 4/2005 | Selbrede |
| 2005/0088404 A1 | 4/2005 | Heines et al. |
| 2005/0093465 A1 | 5/2005 | Yonekubo et al. |
| 2005/0094240 A1 | 5/2005 | Huibers et al. |
| 2005/0094418 A1 | 5/2005 | Parker |
| 2005/0104804 A1 | 5/2005 | Feenstra et al. |
| 2005/0111238 A1 | 5/2005 | Parker |
| 2005/0111241 A1 | 5/2005 | Parker |
| 2005/0116798 A1 | 6/2005 | Bintoro et al. |
| 2005/0122560 A1 | 6/2005 | Sampsell et al. |
| 2005/0122591 A1 | 6/2005 | Parker et al. |
| 2005/0123243 A1 | 6/2005 | Steckl et al. |
| 2005/0123249 A1 | 6/2005 | Yun et al. |
| 2005/0123349 A1 | 6/2005 | Koch |
| 2005/0128370 A1 | 6/2005 | Moon |
| 2005/0134768 A1 | 6/2005 | Sugiura et al. |
| 2005/0134805 A1 | 6/2005 | Conner et al. |
| 2005/0139542 A1 | 6/2005 | Dickensheets et al. |
| 2005/0140636 A1 | 6/2005 | Chung et al. |
| 2005/0141076 A1 | 6/2005 | Bausenwein et al. |
| 2005/0151940 A1 | 7/2005 | Asao |
| 2005/0157365 A1 | 7/2005 | Ravnkilde et al. |
| 2005/0157376 A1 | 7/2005 | Huibers et al. |
| 2005/0168431 A1 | 8/2005 | Chui |
| 2005/0168789 A1 | 8/2005 | Glent-Madsen |
| 2005/0171408 A1 | 8/2005 | Parker |
| 2005/0172625 A1 | 8/2005 | Starkweather et al. |
| 2005/0179977 A1 | 8/2005 | Chui et al. |
| 2005/0195467 A1 | 9/2005 | Kothari et al. |
| 2005/0195468 A1 | 9/2005 | Sampsell |
| 2005/0206991 A1 | 9/2005 | Chui et al. |
| 2005/0207154 A1 | 9/2005 | Parker |
| 2005/0207178 A1 | 9/2005 | Parker |
| 2005/0212734 A1 | 9/2005 | Kimura |
| 2005/0212738 A1 | 9/2005 | Gally |
| 2005/0213322 A1 | 9/2005 | Parker |
| 2005/0213323 A1 | 9/2005 | Parker |
| 2005/0213349 A1 | 9/2005 | Parker |
| 2005/0219676 A1 | 10/2005 | Kimura et al. |
| 2005/0219679 A1 | 10/2005 | Ishikawa |
| 2005/0219680 A1 | 10/2005 | Ishikawa |
| 2005/0225501 A1 | 10/2005 | Srinivasan et al. |
| 2005/0225519 A1 | 10/2005 | Naugler, Jr. |
| 2005/0225732 A1 | 10/2005 | Conner et al. |
| 2005/0225827 A1 | 10/2005 | Kastalsky |
| 2005/0231790 A1 | 10/2005 | Miles |
| 2005/0231791 A1 | 10/2005 | Sampsell et al. |
| 2005/0236928 A1 | 10/2005 | Kurozuka et al. |
| 2005/0237596 A1 | 10/2005 | Selbrede |
| 2005/0242710 A1 | 11/2005 | Yamazaki et al. |
| 2005/0243023 A1 | 11/2005 | Reddy et al. |
| 2005/0244099 A1 | 11/2005 | Pasch et al. |
| 2005/0244949 A1 | 11/2005 | Miles |
| 2005/0245313 A1 | 11/2005 | Yoshino et al. |
| 2005/0247477 A1 | 11/2005 | Kothari et al. |
| 2005/0249966 A1 | 11/2005 | Tung et al. |
| 2005/0253779 A1 | 11/2005 | Feenstra et al. |
| 2005/0254115 A1 | 11/2005 | Palmateer et al. |
| 2005/0258571 A1 | 11/2005 | Dumond et al. |
| 2005/0259198 A1 | 11/2005 | Lubart et al. |
| 2005/0263866 A1 | 12/2005 | Wan |
| 2005/0265029 A1 | 12/2005 | Epstein et al. |
| 2005/0275072 A1 | 12/2005 | Haluzak et al. |
| 2005/0275930 A1 | 12/2005 | Patel et al. |
| 2005/0285816 A1 | 12/2005 | Glass |
| 2005/0286113 A1 | 12/2005 | Miles |
| 2005/0286114 A1 | 12/2005 | Miles |
| 2006/0001942 A1 | 1/2006 | Chui et al. |
| 2006/0003676 A1 | 1/2006 | Bernard et al. |
| 2006/0004928 A1 | 1/2006 | Hess et al. |
| 2006/0007514 A1 | 1/2006 | Desai |
| 2006/0007701 A1 | 1/2006 | Schoellmann et al. |
| 2006/0012781 A1 | 1/2006 | Fradkin et al. |
| 2006/0023287 A1 | 2/2006 | Przybyla et al. |
| 2006/0028708 A1 | 2/2006 | Miles |
| 2006/0028811 A1 | 2/2006 | Ross, Jr. et al. |
| 2006/0028817 A1 | 2/2006 | Parker |
| 2006/0028840 A1 | 2/2006 | Parker |
| 2006/0028841 A1 | 2/2006 | Parker |
| 2006/0028843 A1 | 2/2006 | Parker |
| 2006/0028844 A1 | 2/2006 | Parker |
| 2006/0033676 A1 | 2/2006 | Faase et al. |
| 2006/0033975 A1 | 2/2006 | Miles |
| 2006/0038766 A1 | 2/2006 | Morita |
| 2006/0038768 A1 | 2/2006 | Sagawa et al. |
| 2006/0044246 A1 | 3/2006 | Mignard |
| 2006/0044298 A1 | 3/2006 | Mignard et al. |
| 2006/0044508 A1 | 3/2006 | Mochizuki |
| 2006/0044928 A1 | 3/2006 | Chui et al. |
| 2006/0061559 A1 | 3/2006 | King |
| 2006/0066504 A1 | 3/2006 | Sampsell et al. |
| 2006/0066540 A1 | 3/2006 | Hewlett et al. |
| 2006/0066560 A1 | 3/2006 | Gally et al. |
| 2006/0066598 A1 | 3/2006 | Floyd |
| 2006/0066934 A1 | 3/2006 | Selbrede |
| 2006/0066937 A1 | 3/2006 | Chui |
| 2006/0077125 A1 | 4/2006 | Floyd |
| 2006/0077153 A1 | 4/2006 | Cummings et al. |
| 2006/0077533 A1 | 4/2006 | Miles et al. |
| 2006/0092490 A1 | 5/2006 | McCollum et al. |
| 2006/0104061 A1 | 5/2006 | Lerner et al. |
| 2006/0132383 A1 | 6/2006 | Gally et al. |
| 2006/0132404 A1 | 6/2006 | Hayes et al. |
| 2006/0139734 A1 | 6/2006 | Selbrede et al. |
| 2006/0146389 A1 | 7/2006 | Selbrede |
| 2006/0152476 A1 | 7/2006 | Van Gorkom et al. |
| 2006/0154078 A1 | 7/2006 | Watanabe et al. |
| 2006/0172745 A1 | 8/2006 | Knowles |
| 2006/0187190 A1 | 8/2006 | Hagood et al. |
| 2006/0187191 A1 | 8/2006 | Hagood et al. |
| 2006/0187290 A1 | 8/2006 | Nakashima |
| 2006/0187528 A1 | 8/2006 | Hagood et al. |
| 2006/0209000 A1 | 9/2006 | Sumiyoshi et al. |
| 2006/0209012 A1 | 9/2006 | Hagood |
| 2006/0215540 A1 | 9/2006 | Krishnamoorthi et al. |
| 2006/0238443 A1 | 10/2006 | Derichs |
| 2006/0250325 A1 | 11/2006 | Hagood et al. |
| 2006/0250676 A1 | 11/2006 | Hagood |
| 2006/0256039 A1 | 11/2006 | Hagood et al. |
| 2006/0262060 A1 | 11/2006 | Amundson |
| 2006/0262380 A1 | 11/2006 | Miles |
| 2006/0268386 A1 | 11/2006 | Selbrede et al. |
| 2006/0268568 A1 | 11/2006 | Oku et al. |
| 2006/0270179 A1 | 11/2006 | Yang |
| 2006/0280319 A1 | 12/2006 | Wang et al. |
| 2006/0291034 A1 | 12/2006 | Patry et al. |
| 2006/0291771 A1 | 12/2006 | Braunisch et al. |
| 2006/0291774 A1 | 12/2006 | Schoellmann et al. |
| 2007/0002156 A1 | 1/2007 | Hagood et al. |
| 2007/0002413 A1 | 1/2007 | Psaltis et al. |
| 2007/0003055 A1 | 1/2007 | Bark et al. |
| 2007/0007889 A1 | 1/2007 | Bongaerts et al. |
| 2007/0024701 A1 | 2/2007 | Prechtl et al. |
| 2007/0030555 A1 | 2/2007 | Barton et al. |
| 2007/0031097 A1 | 2/2007 | Heikenfeld et al. |
| 2007/0035808 A1 | 2/2007 | Amundson et al. |
| 2007/0040982 A1 | 2/2007 | Nakano et al. |
| 2007/0047051 A1 | 3/2007 | Selbrede et al. |
| 2007/0047887 A1 | 3/2007 | Selbrede |
| 2007/0052636 A1 | 3/2007 | Kalt et al. |
| 2007/0052660 A1 | 3/2007 | Montbach et al. |
| 2007/0053652 A1 | 3/2007 | Mignard et al. |
| 2007/0086078 A1 | 4/2007 | Hagood et al. |
| 2007/0091011 A1 | 4/2007 | Selbrede |
| 2007/0091038 A1 | 4/2007 | Hagood et al. |

(56) References Cited

U.S. PATENT DOCUMENTS

| | | |
|---|---|---|
| 2007/0103209 A1 | 5/2007 | Lee |
| 2007/0132680 A1 | 6/2007 | Kagawa et al. |
| 2007/0150813 A1 | 6/2007 | Selebrede et al. |
| 2007/0159679 A1 | 7/2007 | Hagood et al. |
| 2007/0172171 A1 | 7/2007 | Van Ostrand et al. |
| 2007/0190265 A1 | 8/2007 | Aoki et al. |
| 2007/0195026 A1 | 8/2007 | Hagood et al. |
| 2007/0205969 A1 | 9/2007 | Hagood, IV et al. |
| 2007/0216987 A1 | 9/2007 | Hagood et al. |
| 2007/0217108 A1 | 9/2007 | Ozawa et al. |
| 2007/0223080 A1 | 9/2007 | Hagood et al. |
| 2007/0247401 A1 | 10/2007 | Sasagawa et al. |
| 2007/0279727 A1 | 12/2007 | Ghandi et al. |
| 2007/0297747 A1 | 12/2007 | Biernath et al. |
| 2008/0014557 A1 | 1/2008 | Kuhn et al. |
| 2008/0026066 A1 | 1/2008 | Roser |
| 2008/0030827 A1 | 2/2008 | Hagood et al. |
| 2008/0037104 A1 | 2/2008 | Hagood et al. |
| 2008/0043726 A1 | 2/2008 | Herrero-Veron et al. |
| 2008/0062500 A1 | 3/2008 | Hagood |
| 2008/0094853 A1 | 4/2008 | Kim et al. |
| 2008/0123175 A1 | 5/2008 | Hagood et al. |
| 2008/0129681 A1 | 6/2008 | Hagood et al. |
| 2008/0145527 A1 | 6/2008 | Hagood et al. |
| 2008/0158635 A1 | 7/2008 | Hagood et al. |
| 2008/0158636 A1 | 7/2008 | Hagood et al. |
| 2008/0165122 A1 | 7/2008 | Duthaler et al. |
| 2008/0174532 A1 | 7/2008 | Lewis |
| 2008/0278798 A1 | 11/2008 | Hagood et al. |
| 2008/0279727 A1 | 11/2008 | Haushalter |
| 2008/0283175 A1 | 11/2008 | Hagood et al. |
| 2008/0297880 A1 | 12/2008 | Steckl et al. |
| 2009/0034052 A1 | 2/2009 | Hagood et al. |
| 2009/0091561 A1 | 4/2009 | Koyama |
| 2009/0103164 A1 | 4/2009 | Fijol et al. |
| 2009/0103281 A1 | 4/2009 | Koh |
| 2009/0141335 A1 | 6/2009 | Feenstra et al. |
| 2009/0195855 A1 | 8/2009 | Steyn et al. |
| 2009/0284824 A1 | 11/2009 | Feenstra et al. |
| 2010/0110518 A1 | 5/2010 | Wu et al. |
| 2010/0328608 A1 | 12/2010 | Fujii et al. |
| 2011/0122474 A1 | 5/2011 | Payne et al. |
| 2011/0148948 A1 | 6/2011 | Gandhi et al. |
| 2011/0164067 A1 | 7/2011 | Lewis et al. |
| 2011/0205259 A1 | 8/2011 | Hagood, IV |
| 2011/0255146 A1 | 10/2011 | Brosnihan et al. |
| 2011/0267668 A1 | 11/2011 | Hagood, IV et al. |
| 2012/0133006 A1 | 5/2012 | Hasselbach et al. |
| 2012/0169795 A1 | 7/2012 | Hagood et al. |
| 2012/0200906 A1 | 8/2012 | Wu et al. |
| 2012/0229226 A1 | 9/2012 | Oja et al. |
| 2012/0280971 A1 | 11/2012 | Hagood et al. |
| 2012/0320111 A1 | 12/2012 | Hagood, IV et al. |
| 2012/0320112 A1 | 12/2012 | Hagood, IV et al. |
| 2012/0320113 A1 | 12/2012 | Hagood, IV et al. |
| 2013/0010341 A1 | 1/2013 | Hagood et al. |
| 2013/0010342 A1 | 1/2013 | Hagood, IV et al. |
| 2013/0010344 A1 | 1/2013 | Hagood et al. |
| 2013/0335806 A1 | 12/2013 | Steyn et al. |
| 2013/0342522 A1 | 12/2013 | Hagood |
| 2014/0078154 A1 | 3/2014 | Payne et al. |
| 2014/0085698 A1 | 3/2014 | Wu et al. |
| 2014/0145926 A1 | 5/2014 | Wu et al. |
| 2014/0184573 A1 | 7/2014 | Nemchuk et al. |
| 2014/0184621 A1 | 7/2014 | Brosnihan et al. |
| 2014/0267196 A1 | 9/2014 | Villarreal et al. |
| 2014/0267331 A1 | 9/2014 | Villarreal et al. |
| 2014/0268293 A1 | 9/2014 | Chleirigh et al. |

FOREIGN PATENT DOCUMENTS

| | | |
|---|---|---|
| CN | 1206218 A | 1/1999 |
| CN | 1309782 A | 8/2001 |
| CN | 1390045 A | 1/2003 |
| CN | 1402033 A | 3/2003 |
| CN | 1476664 A | 2/2004 |
| CN | 1491030 A | 4/2004 |
| CN | 1498408 A | 5/2004 |
| CN | 1541483 A | 10/2004 |
| CN | 1542499 A | 11/2004 |
| CN | 1555472 A | 12/2004 |
| CN | 1573525 A | 2/2005 |
| CN | 1584731 A | 2/2005 |
| CN | 1599522 A | 3/2005 |
| CN | 1623111 A | 6/2005 |
| CN | 1898969 A | 1/2007 |
| DE | 10332647 A1 | 2/2005 |
| EP | 0366847 A2 | 5/1990 |
| EP | 0438614 A1 | 7/1991 |
| EP | 359450 | 11/1994 |
| EP | 0359450 B1 | 11/1994 |
| EP | 495273 | 9/1996 |
| EP | 0495273 B1 | 9/1996 |
| EP | 415625 | 1/1997 |
| EP | 0415625 B1 | 1/1997 |
| EP | 0757958 A1 | 2/1997 |
| EP | 0786679 A2 | 7/1997 |
| EP | 0884525 A2 | 12/1998 |
| EP | 0889458 A2 | 1/1999 |
| EP | 751340 | 5/2000 |
| EP | 0751340 B1 | 5/2000 |
| EP | 1022598 A2 | 7/2000 |
| EP | 1091342 A2 | 4/2001 |
| EP | 1091343 A2 | 4/2001 |
| EP | 1091842 A1 | 4/2001 |
| EP | 1093142 A2 | 4/2001 |
| EP | 1168051 A1 | 1/2002 |
| EP | 1202096 A2 | 5/2002 |
| EP | 1202244 A1 | 5/2002 |
| EP | 1426190 A1 | 6/2004 |
| EP | 1429310 A2 | 6/2004 |
| EP | 1471495 A2 | 10/2004 |
| EP | 1522883 A1 | 4/2005 |
| EP | 1533853 A2 | 5/2005 |
| EP | 1551002 A2 | 7/2005 |
| EP | 1674893 A1 | 6/2006 |
| EP | 1734502 A1 | 12/2006 |
| EP | 1757958 A1 | 2/2007 |
| EP | 2263968 | 12/2010 |
| EP | 1858796 | 1/2011 |
| EP | 2287110 | 2/2011 |
| EP | 1640770 | 4/2012 |
| EP | 2459777 A1 | 6/2012 |
| FR | 2726135 A1 | 4/1996 |
| GB | 2071896 A | 9/1981 |
| GB | 2343980 A | 5/2000 |
| JP | 556137386 A | 10/1981 |
| JP | 57062028 A | 4/1982 |
| JP | S5774730 A | 5/1982 |
| JP | 57127264 U | 8/1982 |
| JP | S5933077 U | 2/1984 |
| JP | 562275230 A | 11/1987 |
| JP | 3142409 A | 6/1991 |
| JP | 4249203 A | 9/1992 |
| JP | 5045648 A | 2/1993 |
| JP | H06174929 A | 6/1994 |
| JP | 6194649 A | 7/1994 |
| JP | H06202009 A | 7/1994 |
| JP | H06222290 A | 8/1994 |
| JP | H06250593 A | 9/1994 |
| JP | H0836161 A | 2/1996 |
| JP | H0895526 A | 4/1996 |
| JP | 8234158 A | 9/1996 |
| JP | 8334752 A | 12/1996 |
| JP | 9080386 A | 3/1997 |
| JP | 09189869 A | 7/1997 |
| JP | 9198906 A | 7/1997 |
| JP | H09218360 A | 8/1997 |
| JP | H09292576 A | 11/1997 |
| JP | H1054916 A | 2/1998 |
| JP | H1054947 A | 2/1998 |
| JP | 10282474 A | 10/1998 |
| JP | H10282521 A | 10/1998 |

(56) References Cited

FOREIGN PATENT DOCUMENTS

| | | |
|---|---|---|
| JP | H10333145 A | 12/1998 |
| JP | 11015393 A | 1/1999 |
| JP | 11024038 A | 1/1999 |
| JP | H1184419 A | 3/1999 |
| JP | H1195693 A | 4/1999 |
| JP | H11126118 A | 5/1999 |
| JP | H11202325 A | 7/1999 |
| JP | 2000028933 A | 1/2000 |
| JP | 2000028938 A | 1/2000 |
| JP | 2000057832 A | 2/2000 |
| JP | 2000105547 A | 4/2000 |
| JP | 2000111813 A | 4/2000 |
| JP | 2000121970 A | 4/2000 |
| JP | 2000131627 A | 5/2000 |
| JP | 2000172219 A | 6/2000 |
| JP | 2000214393 A | 8/2000 |
| JP | 2000214394 A | 8/2000 |
| JP | 2000214395 A | 8/2000 |
| JP | 2000214397 A | 8/2000 |
| JP | 2000214831 A | 8/2000 |
| JP | 2000235152 A | 8/2000 |
| JP | 2000259116 A | 9/2000 |
| JP | 2000105547 | 11/2000 |
| JP | 2000321566 A | 11/2000 |
| JP | 2001067010 A | 3/2001 |
| JP | 2001075534 A | 3/2001 |
| JP | 2001100121 A | 4/2001 |
| JP | 2001125014 A | 5/2001 |
| JP | 2001154642 A | 6/2001 |
| JP | 2001175216 A | 6/2001 |
| JP | 2001201698 A | 7/2001 |
| JP | 2001201767 A | 7/2001 |
| JP | 2001242826 A | 9/2001 |
| JP | 2001281563 A | 10/2001 |
| JP | 2001318377 A | 11/2001 |
| JP | 2001331142 A | 11/2001 |
| JP | 2001331144 A | 11/2001 |
| JP | 2001337649 A | 12/2001 |
| JP | 2001356281 A | 12/2001 |
| JP | 2001356327 A | 12/2001 |
| JP | 2002040336 A | 2/2002 |
| JP | 2002040337 A | 2/2002 |
| JP | 2002139683 A | 5/2002 |
| JP | 2002140038 A | 5/2002 |
| JP | 2002214543 A | 7/2002 |
| JP | 2002279812 A | 9/2002 |
| JP | 2002528763 A | 9/2002 |
| JP | 2002287718 A | 10/2002 |
| JP | 2002297085 A | 10/2002 |
| JP | 2002318564 A | 10/2002 |
| JP | 2002333619 A | 11/2002 |
| JP | 2002341343 A | 11/2002 |
| JP | 2002351431 A | 12/2002 |
| JP | 2002365650 A | 12/2002 |
| JP | 2003029295 A | 1/2003 |
| JP | 2003036057 A | 2/2003 |
| JP | 2003506755 A | 2/2003 |
| JP | 2003084314 A | 3/2003 |
| JP | 2003086233 A | 3/2003 |
| JP | 2003086233 A | 3/2003 |
| JP | 2003098984 A | 4/2003 |
| JP | 2003121824 A | 4/2003 |
| JP | 2003162904 A | 6/2003 |
| JP | 2003202519 A | 7/2003 |
| JP | 2003248463 A | 9/2003 |
| JP | 2003344785 A | 12/2003 |
| JP | 2004004216 A | 1/2004 |
| JP | 2004053839 A | 2/2004 |
| JP | 2004069788 A | 3/2004 |
| JP | 2004117833 A | 4/2004 |
| JP | 2004140800 A | 5/2004 |
| JP | 2004151722 A | 5/2004 |
| JP | 2004163915 A | 6/2004 |
| JP | 2004191736 A | 7/2004 |
| JP | 2004205973 A | 7/2004 |
| JP | 2004212673 A | 7/2004 |
| JP | 2004221051 A | 8/2004 |
| JP | 2004287215 A | 10/2004 |
| JP | 2004287431 A | 10/2004 |
| JP | 2004302270 A | 10/2004 |
| JP | 2004317557 A | 11/2004 |
| JP | 2004317785 A | 11/2004 |
| JP | 2004325909 A | 11/2004 |
| JP | 2004327025 A | 11/2004 |
| JP | 2004534280 | 11/2004 |
| JP | 2004347982 A | 12/2004 |
| JP | 2005010786 A | 1/2005 |
| JP | 2005043674 A | 2/2005 |
| JP | 2005043726 A | 2/2005 |
| JP | 2005504355 A | 2/2005 |
| JP | 2005512119 A | 4/2005 |
| JP | 2005134896 A | 5/2005 |
| JP | 2005309416 A | 11/2005 |
| JP | 2006098990 A | 4/2006 |
| JP | 2006522360 A | 9/2006 |
| JP | 2007155983 A | 6/2007 |
| JP | 2007517488 A | 6/2007 |
| JP | 2008015081 A | 1/2008 |
| JP | 2008098984 A | 4/2008 |
| JP | 2008233898 A | 10/2008 |
| JP | 2009111813 A | 5/2009 |
| JP | 2012128451 A | 7/2012 |
| JP | 2012186782 A | 9/2012 |
| JP | 2012230079 A | 11/2012 |
| JP | 2013061658 A | 4/2013 |
| WO | WO-9401716 A1 | 1/1994 |
| WO | WO-9528035 A1 | 10/1995 |
| WO | WO-9704436 A1 | 2/1997 |
| WO | WO-9804950 A1 | 2/1998 |
| WO | WO-9819201 A1 | 5/1998 |
| WO | WO-9901696 A1 | 1/1999 |
| WO | 0017695 A1 | 3/2000 |
| WO | WO-0050807 A1 | 8/2000 |
| WO | WO-0052674 A1 | 9/2000 |
| WO | WO-0055916 A1 | 9/2000 |
| WO | WO-0169584 A1 | 9/2001 |
| WO | 0189986 A1 | 11/2001 |
| WO | WO-0207482 A2 | 1/2002 |
| WO | WO-03004836 A1 | 1/2003 |
| WO | WO-03007049 | 1/2003 |
| WO | WO-03008860 A1 | 1/2003 |
| WO | WO-03029874 A2 | 4/2003 |
| WO | WO-03040802 A2 | 5/2003 |
| WO | WO-03048836 A2 | 6/2003 |
| WO | WO-03050448 A1 | 6/2003 |
| WO | 03061007 A1 | 7/2003 |
| WO | WO-03061329 A2 | 7/2003 |
| WO | WO-03069593 A2 | 8/2003 |
| WO | WO-03081315 A1 | 10/2003 |
| WO | 03105198 A1 | 12/2003 |
| WO | WO-2004008629 A1 | 1/2004 |
| WO | WO-2004019120 A1 | 3/2004 |
| WO | WO-2004034136 A1 | 4/2004 |
| WO | WO-2004038496 A1 | 5/2004 |
| WO | WO-2004086098 A2 | 10/2004 |
| WO | WO-2004088629 A1 | 10/2004 |
| WO | WO-2004097506 A2 | 11/2004 |
| WO | WO-2005001892 A2 | 1/2005 |
| WO | 2005015287 A1 | 2/2005 |
| WO | WO-2005062908 A2 | 7/2005 |
| WO | WO-2005073950 | 8/2005 |
| WO | WO-2005082908 A1 | 9/2005 |
| WO | WO-2006017129 A2 | 2/2006 |
| WO | WO-2006023077 A2 | 3/2006 |
| WO | WO-2006039315 A2 | 4/2006 |
| WO | WO-2006052755 A2 | 5/2006 |
| WO | WO-2006091738 A1 | 8/2006 |
| WO | WO-2006091791 | 8/2006 |
| WO | WO-2006091860 A2 | 8/2006 |
| WO | WO-2006091904 | 8/2006 |
| WO | WO-2007075832 | 7/2007 |
| WO | WO-2007123173 A1 | 11/2007 |
| WO | WO-2007145973 | 12/2007 |
| WO | WO-2008026066 A1 | 3/2008 |

(56) References Cited

FOREIGN PATENT DOCUMENTS

| | | |
|---|---|---|
| WO | WO-2008091339 A2 | 7/2008 |
| WO | WO-2009102471 A1 | 8/2009 |
| WO | WO-2010062647 A2 | 6/2010 |
| WO | WO-2013032865 A1 | 3/2013 |

OTHER PUBLICATIONS

Boer W.D., "Improvement of Image Quality in AMLCDs", Active Matrix Liquid Crystal Displays: Fundamentals and Applications, 2005, pp. 139-177, XP055089313, U.S.A, ISBN: 978-0-75-067813-1.

Akimoto O. et al., "15.1: A 0.9-in UXGA/HDTV FLC Microdisplay," Society for Information Display, 2000, pp. 194-197.

Alt P.M., et al., "A Gray-Scale Addressing Technique for Thin-Film-Transistor/Liquid Crystal Displays," IBM J. Res. Develop., 36 (1), Jan. 1992, pp. 11-22.

AZ Displays, Inc., "Complete LCD Solutions," ATM3224C-NC-FTH, pp. 1-15 (Oct. 2, 2003).

Bergquist et al., "Field Sequential Colour Display with Adaptive Gamut", Society for Information Display, Digest of Technical Papers, 2006, pp. 1594-1597.

Birch et al, "31.1: SXGA Resolution FLC Microdisplays," SID 02 Digest, 954-957 (2002).

B.J. Feenstra et. al. "A Reflective Display Based on Electrowetting: Principle and Properties", International Display Research Conference Proceedings 2003, p. 322.

Blackstone, "Making MEMS Reliable," SPIE's OEMagazine, 32-34 (Sep. 2002).

"BLU," Heesung Precision Ltd., http://www.hspr.co.kr/eng/product/blu.asp Retrieved on Aug. 3, 2006.

den Boer W.D., "Active Matrix Liquid Crystal Displays", Elsevier Science & Technology Books, ISBN #0750678135, Aug. 2005, Publisher's annotation in 2 pages.

Boeuf, J.P., "Plasma display panels: physics,recent deveopments and key issues," J. Phys. D: Appl. Phys. 36 (2003) R53-R79 (received Aug. 29, 2002: published Feb. 26, 2003).

Boucinha M., et al., "Air-gap amorphous silicon thin film transistors", Applied Physics Letters, AIP, American Institute of Physics, Melville, NY, US, vol. 73, No. 4, Jul. 27, 1998, pp. 502-504, XP012021821, ISSN: 0003-6951, DOI: 10.1063/1.121914.

Bozler et al, "Arrays of gated field-emitter cones having 0.32 mm tip-to-tip spacing," J. Vec. Sci. Technol. B, 12 (2): 629-632 (Mar./Apr. 1994).

Bryan-Brown, "Ultra Low Power Bistable LCDs," SID 00, 76-79 (2000).

Chino E. et al., "25.1: Invited Paper: Development of Wide-Color-Gamut Mobile Displays with Four-primary-color LCDs," Society for Information Display, 37 (2), 2006, pp. 1221-1224.

Clark N. A., et al., "FLC Microdisplays", Ferroelectrics, 246, 2000, pp. 97-110.

Conde, J.P., et. al., "Amorphous and microcrystalline silicon deposited by hot-wire chemical vapor deposition at low substrate temperatures: application to devices and thin-film microelectromechanical systems," Thin Solid Films 395: 105-111 (2001).

Conde, J.P., et al., "Low-temperature Thin-film Silicon MEMS", in Thin Solid Films 427, p. 181 (2003).

Davis, "Light Emitting Diode Source Modeling for Optical Design," Reflexite Display Optics (Oct. 2004).

Davis, "Microstructured Optics for LED Applications," Reflexite Display Optics (2002).

Doane, et al, "Display Technologies in Russia, Ukraine, and Belarus," World Technology Evaluation Center Panel Report (Dec. 1994) http://www.wtec.org/loyola/displays/toc.htm, retrieved on Nov. 22, 2005.

Doherty D. et al., "Pulse Width Modulation Control of DLP Projectors", TI Technical Journal, Jul.-Sep. 1998, No. 3, pp. 115-121.

"Electronic Display Lighting Tutorials," 3M Corporation,file//D:/Optical/Vikuiti Tutorial.htm. retrieved on Aug. 10, 2006.

Feenstra J. et al., "Electrowetting Displays", Liquavista BV, http://www.liquavista.com/documents/electrowetting_displays_whitepaper.pdf, Retrieved on Aug. 17, 2006, pp. 1-16.

Feng, et al, "Novel Integrated Light-Guide Plates for Liquid Crystal Display Backlight," Journal of optics a Pure and applied optics, 2005, 7, 111-117.

Feng, "High Quality Light Guide Plates that Can Control the Illumination Angle Based on Microprism Structures," Applied Physics Letters, 85 (24): 6016-6018 (Dec. 2004).

Flat Panel Display (FPD) Manufacturing Equipment that Cuts Production Costs by Half, Shibaura Mechatronics Corporation, product brochure for panel processing.

Foley, "NE04-21: Microstructured Plastic Optics for Display, Lighting, and Telecommunications Applications," Fresnel Optics (2001).

Funamoto et al, "Diffusive-sheetless Backlight System for Mobile Phone," IDW/AD, 1277-1280 (2005).

Funamoto et. al. "LED Backlight System with Double-Prism Pattern", Journal of the Society for Information Display v. 14, pp. 1045-1051 (2006).

Goddhue et al, "Bright-field analysis of field-emission cones using high-resolution tranmission electron microscopy and the effect of structural properties on current stability," J. Vac. Sci. Technol. B, 12 (2): 693-696 (Mar.Apr. 1994).

Hartman, "4.1: Invited paper: Two-Terminal Devices Technologies for AMLCDs," SID 95 Digest, 7-10 (1995).

Hewlett et al, "DLP CinemaTM projection: A hybrid frame-rate technique for flicker-free performance," Journ of the SID 9/3, 221-226 (2001).

Hornbeck J. "Digital Light Processing TM: A New MEMS-Based Display Technology," Technical Digest of the IEEJ 14th Sensor Symposium, Jun. 4-5, 1996, pp. 297-304.

J. Heikenfeld et. al., "Contrast Enhancement in Black Dielectric Electroluminescent Devices", IEEE Transactions on Electron Devices, 49: 8, 1348-52 (2002).

Jepsen et al, "4.11: 0.9" SXGA Liquid Crystal on Silicon Panel with 450 Hz. Field Rate," SID MicroDisplay Corporation, pp. 106-109 (Sep. 2001).

Joaquirn, M., "Polyphenyl Ether Lubricants" Synthetic Lubricants and High-performance Functional Fluids, R. L. Rudnick and R. L. Shubkin, Eds., p. 239, Marcel Dekker, Inc., NY, 1999.

Johnstone et al, "Theoretical limits on the freestanding length of cantilevers produced by surface micromachining technology," J. Micromech. Microeng. 12: 855-861 (Published Oct. 3, 2002).

Jones et al, "29-1: Addressing TVmin Ferroelectric Liquid Crystal Displays," (1998).

Judy, et al, "Self-Adjusting Microstructures(SAMS)," Proceedings of the Workshop on Micro Electro Mechanical Systems, New York, Jan. 30, 1991, vol. Workshop 4, pp. 51-56.

Judy, M. W., "Micromechanisms Using Sidewall Beams," Dissertation, University of California at Berkeley, 1994.

Kalantar et al, "Optical Micro Deflector Based Functional Light-Guide Plate for Backlight Unit," SID 00 Digest, 1029-1031 (2000).

Kalantar, K., et al., "Backlight Unit with Double Surface Light Emission Using a Single Micro-structured Light-guide Plate," p. 1182, Society for Information Display Digest (2004).

Kalantar, "Modulation of viewing angle on an LCD surface through backlight optics," Journal of the SID, 11 (4): 647-652 (2003).

Kim, C.W., et al., "Manufacturing Technologies for the Next Generation a-Si TFT-LCD," Proceedings of the Intl. Display Mfg. Cnf. Seoul, Korea (2000).

Koden et al., "Ferroelectric Liquid Crystal Display," (Sep. 17, 1997).

Kuang et al., "Dynamic characteristics of shaped micro-actuators solved using the differential quadrature method," Journal of Micromechanics and Microengineering, 14: 647-655, (2004).

Kunzman A. et al., "10.3 White Enhancement for Color Sequential DLP", Society for Information Display, Digest of Technical Papers, 1998.

Lee, et al., "40.1: Distingusihed Contributed Paper: Integrated Amorphous Silicon Color Sensor on LCD Panel for LED Backlight Feedback Control System", Society for Information Display, Digest of Technical Papers, 2005, pp. 1376-1379.

Lee et al, "P-25: A LCOS Microdisplay Driver with Frame Buffering Pixels," SID 02 Digest, 292-295 (2002).

(56) References Cited

OTHER PUBLICATIONS

Legtenberg, et al., "Electrostatic Curved Electrode Actuators," Journal of Microelectromechanical Systems, 6 (3): 257-265 (Sep. 1997).
Li, J., et al., "DRIE-Fabricated Curved-Electrode Zipping Actuators with Low Pull-In Voltage," 12th International Conference on Solid State Sensors, Actuators and Microsystems, IEE, 480-483 (2003).
Liang et al, "Observation of electric field gradients near field-emission cathode arrays," Appl Phys. Lett., 66 (9): 1147-1149 (Feb. 27, 1995).
Liu et al, "Scaling Laws of Microactuators and Potential Applications of Electroactive Polymers in MEMS," SPIE, 3669: 345-354 (Mar. 1999).
"Low Temperature Polysilicon TFT Reflective Color LCD" by Techno World.
Maboudian et al., "Stiction reduction processes for surface micromachines," Tribology Letters, 3: 215-221 (1997).
Markandey V. et al., "Video Processing for DLP Display Systems," Texas Instruments Corporation, Mar. 13, 1996, pp. 21-32.
Mastrangelo et al, "Mechanical Stability and Adhesion of Microstructures Under Capillary Forces—Part I: Basic Theory," Journal of Microelectromechanical Systems, 2 (1): 33-43 (Mar. 1993).
Mastrangelo et al, "Mechanical Stability and Adhesion of Microstructures Under Capillary Forces—Part II: Experiments," Journal of Microelectromechanical Systems, 2 (1): 44-55 (Mar. 1993).
McLaughlin, "Progress in Projection and Large-Area Displays," Proceedings of the IEEE, 90 (4): 521-532 (Apr. 2002).
"MicroLensTm—Re-Inventing LCD Backlighting," Global Lighting Technologies Inc., http://www.glthome.com/tech.htm, 1-2; retrieved on Aug. 3, 2006.
"Microprism Technology for Luminaires," Reflexite Display Optics, Reflexite Corporation, Technical Publication RLO-181, Rev. 2 (2003).
"Nano TM Su-8 2000 Negative Tone Photoresist Formulations 2002-2025," Micro Che, Rev. 2/02m.
Okumura et al, "Highly-efficient backlight for liquid crystal display having no optical films," Applied Physics Letters, 83 (13): 2515-2517 (Sep. 29, 2003).
"Optical Design Tools for Backlight Displays," Light Tools, Optical Research Associates, 1-8.
Park, Y.I., et al., "Active Matrix OLED Displays Using Simple Poly-Si TFT Process," Society of Information Display, Digest, pp. 487-489 (2003).
Pasricha S. et al., "Dynamic Backlight Adaptation for Low Power Handheld Devices" IEEE Design and Test v. 21, 2004, pp. 398.
Perregaux, G., et al., "Arrays of Addressable High-Speed Optical Microshutters," CSEM Swiss Center for Electronics and Microtechnology Inc., Microsystems Division, pp. 232-235 (2001).
"Prism Brightness Enhancement Films," 3M Corporation, http://products3.3m.com/catalog/us/en001/electronics_mfg/vikuiti/node_V6G78RBQ5Tbe/root_GST1T4S9TCgv/vroot_S6Q2FD9X0Jge/gvel_GD378DOHGJgl/theme_us_vikuiti_3_0/command_AbcPageHandler/ output_html Retrieved on Aug. 3, 2006.
"Prism Sheet," Mitsubishi Rayon America Inc., http://www.mrany.com/data/HTML/29.htm Retrieved on Aug. 4, 2006.
Qiu et al, "A Curved-Beam Bistable Mechanism," Journal of Microelectromechanical Systems, 13 (2): 137-145 (Apr. 2004).
Qiu et al, "A High-Current Electrothermal Bistable MEMS Relay," Micro Electro Mechanical Systems, MEMS-03 Kyoto, pp. 64-67 (Jan. 19-23, 2003).
Ravnkilde J., et al., "Fabrication of Nickel Microshutter Arrays for Spatial Light Modulation", Mesomechanics, 2002, pp. 161-165. Also on their web site: http://www2.mic.dtu.dk/research/mems/publications/Papers/Dicon_Meso2002.pdf.
Roosendaal et al, "25.2: A Wide Gamut, High Aperture Mobile Spectrum Sequential Liquid Crystal Display," SID 05 Digest, 1116-1119 (2005).
Saeedi, et. al. "Molten-Alloy Driven Self-Assembly for Nano and Micro Scale System Integration" Fluid Dynamics and Materials Processing, vol. 2, No. 4, pp. 221-245 (2006).
Sato, "Research on Flexible Display Systems," Broadcast Technology, 21: 10-15 (Winter, 2005).
Sharp Specification No. LCP-03015 for Mobile Liquid Crystal Display Group, Sharp Corporation, Jun. 13, 2003.
Shikida et al, "Fabrication of an S-shaped Microactuator," Journal of Microelectromechanical Systems, 6 (1): 18-24 (Mar. 1997).
Sony Corporation, "ACX705AKM, 6.92cm Diagonal Reflective Color LCD Module".
Steyn, Lodewyck, "Electroquasistatic Zipper Actuators: A Technology Review", Dec. 2004.
Tagaya et al., "Thin Liquid-Crystal Display Backlight System with Highly Scattering Optical Transmission Polymers," Applied Optics, 40 (34): 6274-6280 (Dec. 2001).
Takatori, et al., "6.3: Field-Sequential Smectic LCD with TFT Pixel Amplifier," SID 01, 2001, Digest, pp. 48-51.
Tan et al "Soldering Technology for Optoelectronics Packaging", 1996 Electronic Components and Technology Conference, pp. 26-36 (1996).
Teijido, J.M., "Conception and Design of Illumination Light Pipes," Thesis No. 1498 for University of Neuchatel, http://www.unige.ch/cyberdocuments/unine/theses2000/TeijidoJM/these_front.htm 1: 1-99 Retrieved on Aug. 3, 2006.
Tien et al, "MEMS Actuators for Silicon Micro-Optical Elements," Proc. of SPIE, 4178: 256-269, (2000).
"Two Proprietary Technologies Supporting OMRON Backlight," OMRON Electronics Corporation, OMRON Electronics Components Web, www.omron.co.jp/ecb/products/bklight/english/genri/index.html, retrieved on Aug. 3, 2006.
Underwood, "A review of microdisplay technologies," SID© EID, (Nov. 21-23, 2000).
Underwood, "LCoS through the looking glass," SID (2001).
van de Biggelaar, et. al. "Passive and Active Matrix Addressed Polymer Light-emitting Diode Displays", Proc. SPIE vol. 4295, p. 134 (2001).
Vangbo et al, "A lateral symmetrically bistable buckled beam," J. Micromech. Microeng., 8: 29-32 (1998).
Wang et al., "A highly efficient system for automatic face region detection in MPEG video." IEEE Trans. on Circuits and Systems for Video Technology, vol. 7 Issue 4, Aug. 1997, pp. 615-628.
Wang K., et al., "Highly Space-Efficient Electrostatic Zigzag Transmissive Micro-Optic Switches for an Integrated MEMS Optical Display System", Transducers 03 Conference, Jun. 8-12, 2003, vol. 1, pp. 575-575.
Yamada et al, "52.2: Invited Paper: Color Sequential LCD Based on OCB with an LED Backlight," SID 00 Digest, 1180-1183 (2000).
Yasumura et al, "Fluid Damping of an Electrostatic Actuator for Optical Switching Applications," Transducers Research Foundation (2002).
Microchem "Nano SU 8 2000", product brochure for thick polymer, Rev. Feb. 2002.
"Microprism Technology for Luminaires," Reflexite Display Optics (2004).
Uchida T. et al., "Encyclopedia of Flat Panel Displays", Japan, Kogyo Chosakai Publishing Co., Ltd./Yukio Shimura, Dec. 25, 2001, pp. 617 to 619.
Co-pending U.S. Appl. No. 14/508,342, filed on Oct. 7, 2014.
US Office Action dated Mar. 24, 2011 issued in U.S. Appl. No. 12/370,471.
US Office Action dated Dec. 2, 2011 issued in U.S. Appl. No. 12/370,471.
US Office Action dated Sep. 14, 2012 issued in U.S. Appl. No. 12/370,471.
US Notice of Allowance dated Feb. 21, 2013 issued in U.S. Appl. No. 12/370,471.
US Notice of Allowance dated Apr. 30, 2013 issued in U.S. Appl. No. 12/370,471.
US Office Action dated Sep. 11, 2014 issued in U.S. Appl. No. 14/012,505.
US Notice of Allowance dated Feb. 3, 2015 issued in U.S. Appl. No. 14/012,505.

(56) References Cited

OTHER PUBLICATIONS

US Notice of Allowance dated Dec. 28, 2011 issued in U.S. Appl. No. 12/606,675.
US Office Action (Ex Parte Quayle Action) dated Jun. 14, 2013 issued in U.S. Appl. No. 13/449,906.
US Notice of Allowance dated Jul. 29, 2013 issued in U.S. Appl. No. 13/449,906.
US Notice of Allowance dated Jan. 31, 2008 issued in U.S. Appl. No. 11/361,785.
US Non Final Office Action dated Nov. 1, 2006, U.S. Appl. No. 11/218,690.
US Final Office Action dated May 18, 2007, U.S. Appl. No. 11/218,690.
US Final Office Action Dated Oct. 3, 2007, U.S. Appl. No. 11/218,690.
US Non Final Office Action Dated Mar. 22, 2007, U.S. Appl. No. 11/546,937.
US Final Office Action dated Sep. 21, 2007, U.S. Appl. No. 11/546,937.
PCT International Search Report and Written Opinion dated Jun. 29, 2009 in International Application No. PCT/US2009/000922.
PCT International Preliminary Report on Patentability dated Aug. 26, 2010, in International Application No. PCT/US2009/000922.
Chinese First Office Action dated Jun. 3, 2014 issued in CN Patent Application No. CN 201310293759.9.
Chinese Second Office Action dated Jan. 20, 2015 issued in CN Patent Application No. CN 201310293759.9.
PCT International Search Report and Written Opinion dated Jul. 21, 2009 in International Application No. PCT/US2009/002288.
PCT International Preliminary Report on Patentability and Written Opinion dated Oct. 28, 2010 in International Application No. PCT/US2009/002288.
PCT International Search Report (Partial) dated May 11, 2011 in International Application No. PCT/US2011/023387.
European Office Action dated Mar. 28, 2012 in European Patent Office Application No. EP 07795777.7.
European Patent Office Examination Report dated Sep. 7, 2009 in European Patent Application No. 06847859.3.
European Search Opinion for EP Patent Application No. EP08005944, European Patent Office, Munich filed on Dec. 4, 2012.
European Search Opinion for EP Patent Application No. EP08005973, European Patent Office, Munich filed on Oct. 4, 2012.
European Search Opinion for EP Patent Application No. EP10175901, European Patent Office, Munich filed on Feb. 5, 2012.
European Search Report—EP10177217—Search Authority—Munich—Mar. 3, 2012.
European Search Report—EP10176478—Search Authority—Munich—May 4, 2012.
European Extended Search Report—EP10177223 dated Mar. 6, 2012.
European Search Opinion for EP Patent Application No. EP10175920, European Patent Office, Munich filed on Sep. 5, 2012.
European Extended Search Report—EP12181160.8 dated Mar. 15, 2013.
Japanese Office Action dated Oct. 12, 2010 in Japanese Patent Application No. 2008-058190.
Japanese Office Action dated Dec. 5, 2011 issued in Japanese Patent Application No. 2008-058190.
Japanese Office Action dated Jul. 15, 2010 issued in Japanese Patent Application No. 2007-556428.
Japanese Office Action dated Sep. 16, 2011 in Japanese Patent Application No. 2007-556428.
Boer W.D., "Active Matrix Liquid Crystal Displays," Elsevier Science & Technology Books, ISBN #0750678135, Aug. 2005, Publisher's Annotation in 2 pages.
US Notice of Allowance dated May 14, 2015 issued in U.S. Appl. No. 14/012,505.

\* cited by examiner

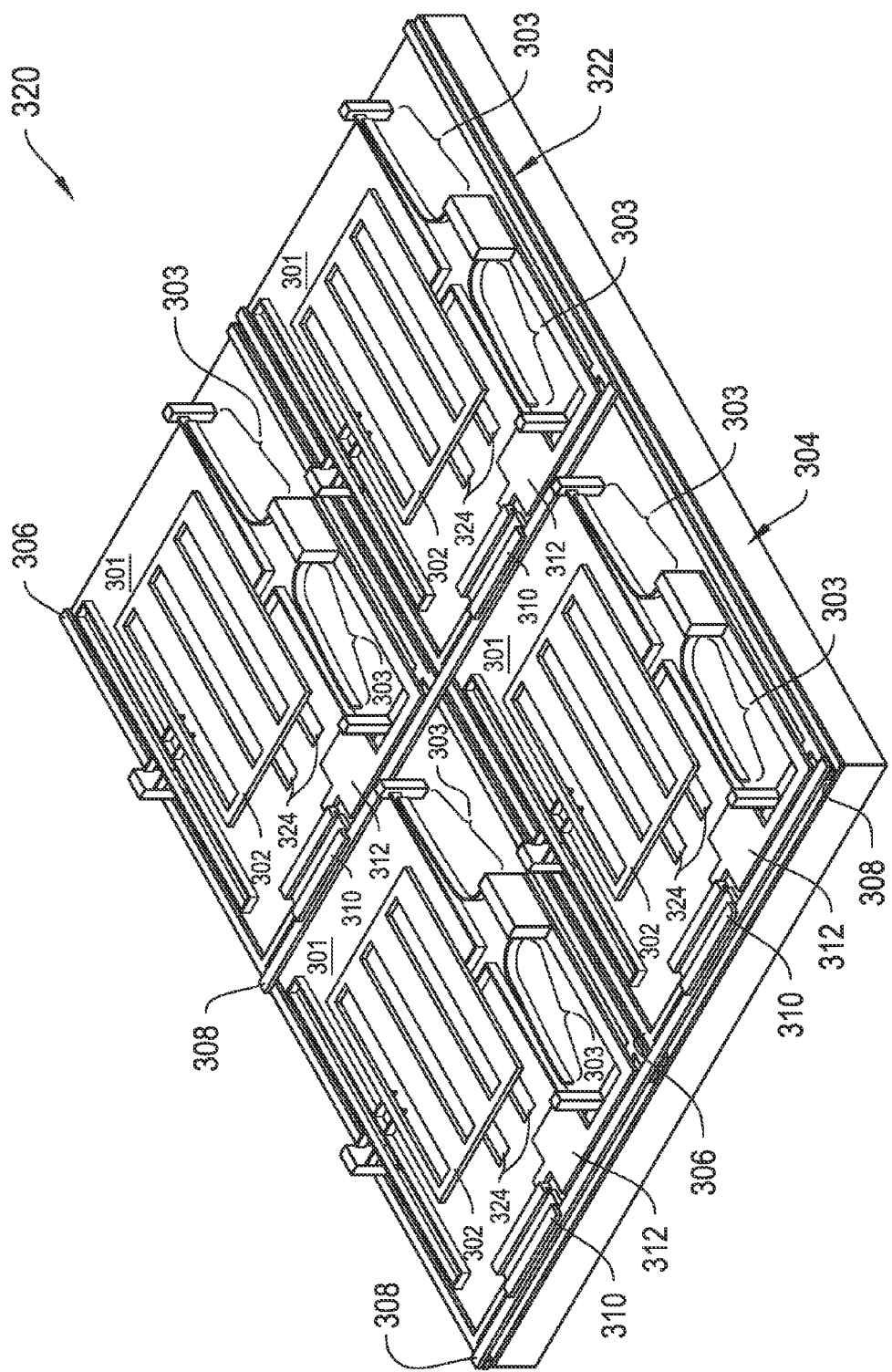

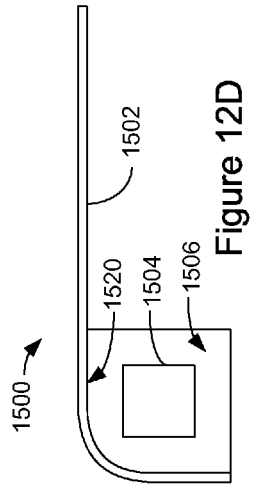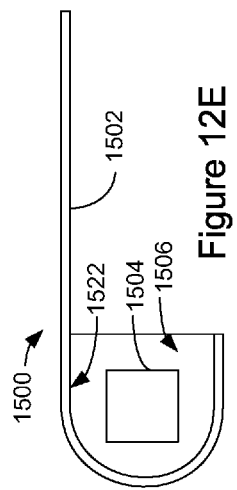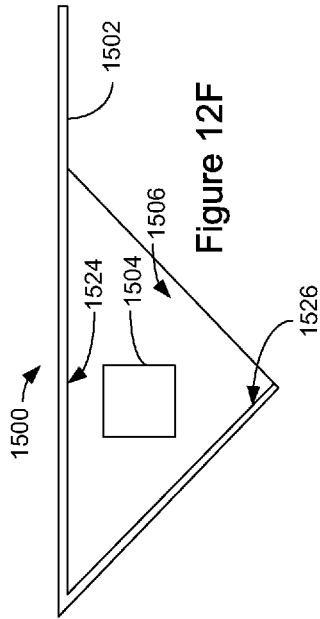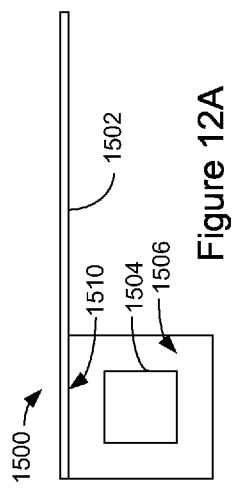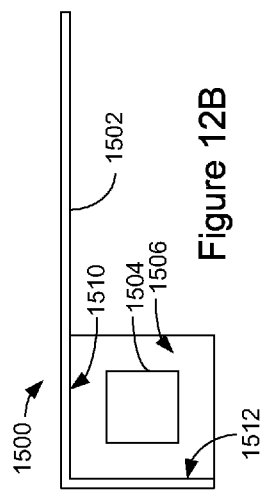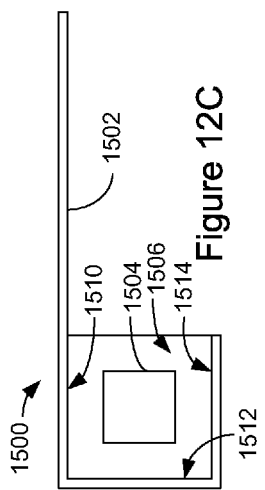

MEMS ANCHORS

REFERENCE TO RELATED APPLICATION

This application is a continuation of U.S. application Ser. No. 13/449,906, filed Apr. 18, 2012, which is a continuation of U.S. application Ser. No. 12/606,675, filed Oct. 27, 2009, now U.S. Pat. No. 8,169,679, which claims the benefit of U.S. Provisional Patent Application Ser. No. 61/108,783, filed on Oct. 27, 2008, entitled "MEMS Anchors", all of which are incorporated by reference herein in their entirety.

FIELD OF THE INVENTION

The present invention generally relates to the field of displays, such as imaging and projection displays. In particular, the invention relates to the design and manufacture of anchor structures for light modulators to address the deflection of beams mounted on them.

BACKGROUND OF THE INVENTION

There is a need in the art for fast, bright, low-powered actuated displays. Displays built from mechanical light modulators are an attractive alternative to displays based on liquid crystal technology. Mechanical light modulators are fast enough to display video content with good viewing angles and with a wide range of color and grey scale. Mechanical light modulators have been successful in projection display applications, and have recently been proposed for direct view applications. Specifically there is a need for mechanically actuated displays that use mechanical light modulators and can be driven at high speeds and at low voltages for improved image quality and reduced power consumption.

A mechanical light modulator comprises a shutter and a plurality of actuators. The actuators are used to move the shutter from one state to another state. Of the two states, one can be a state where light is transmitted and another state where light is blocked. The shutter is suspended above a substrate by a plurality of compliant beams, and the actuators are also formed using compliant beams. A display is formed by fabricating an array of mechanical light modulators on a substrate. The compliant beams are attached to the substrate with anchor structures.

The anchor structures need to be sufficiently stiff to limit undesired deflections of the actuators and of the shutter. An example of an undesired deflection would be a deflection towards or away from the substrate for a shutter that is designed to move parallel to the substrate. Such a deflection can occur due to mechanical shock applied to the shutter or due to attraction between the shutter and the substrate. A deflection can also be caused by stresses in the films that are used to form the shutter, the actuators, and the anchors A need exists in the art for an anchoring structure for these compliant beams that can be built using MEMS fabrication techniques while at the same time preventing or minimizing any undesired beam or shutter deflection.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In one aspect, the present invention relates to a MEMS device comprising a substrate having a primary surface upon which the MEMS device is formed, a beam suspended over the substrate by an anchor having a shell structure, the shell structure comprising: a non-horizontal elevating portion is coupled (or connected) to the primary face of the substrate, a substantially horizontal shelf portion elevated over the substrate by the non-horizontal elevating portion, and a non-horizontal shell stiffening portion, from which the beam extends, extending from the shelf portion.

In some embodiments a shutter being connected to the beams. In one embodiment, this is accomplished by coupling the beam to a plurality of beams, each connected to its own anchor. In another aspect, the invention relates to an anchoring structure where the non-horizontal shell stiffening portion comprises at least two unit normal vectors that are substantially different. In another aspect, the invention relates to an anchoring structure where at least two non-horizontal shell stiffening portions are coupled to each other as well as to the substantially horizontal shelf portion and where the normal vectors of said non-horizontal shell stiffening portions are substantially different. In another aspect, the invention relates to an anchoring structure where one or more substantially horizontal shelf portions are further coupled to one or more non-horizontal shell stiffening portions. In some embodiments, the non-horizontal elevating portions form a closed space or a well. In another aspect, the invention relates to an anchoring structure where the suspended beam has a height that is at least 1.4 times its width. In another aspect, the invention relates to an anchoring structure where the non-horizontal stiffening portion is made from the same material as the horizontal shelf portion. In another aspect, the invention relates to an anchoring structure where the beam is made from a different material than the horizontal shelf portion. In some embodiments, the beam is couple to the horizontal portion. In certain embodiments, two or more beams extend from the anchor structure. In one aspect, the non-horizontal shell stiffening portion extends above the shelf. In another aspect, the non-horizontal shell stiffening portion extends below the shelf. In certain embodiments, the beam is situated on the side of the horizontal shelf opposite to the substrate. In one aspect, the non-horizontal shell stiffening portion is substantially perpendicular to the horizontal shelf portion.

In another aspect, the invention relates to a method for manufacturing a MEMS device using a shell structure made by a sidewall process comprising the steps of forming a mold on a substrate, wherein the mold includes a lower horizontal surface, an upper horizontal surface and a wall, depositing a beam material on the lower horizontal surface and the wall of the mold, removing the beam material deposited on the lower horizontal surface of the mold while leaving the majority of the beam material deposited on the wall of the mold in place to form the compliant beam, forming the shutter coupled to the compliant beam, and removing the mold, thereby releasing the shutter and remaining beam material.

In some embodiments, the non-horizontal elevating portion is manufactured from a first mold material. In some embodiments, the non-horizontal elevating portion is manufactured from a second mold material. In one aspect, the shell structure and the beam are manufactured from at least two different materials. In certain embodiments, the shell structure and the beam are manufactured from a composite material.

Other objects, features and advantages of the present invention will become apparent upon examining the following detailed description of an embodiment thereof, taken in conjunction with the attached drawings. The present invention may be implemented in many forms including a device, method, or part of a device.

BRIEF DESCRIPTION OF THE DRAWINGS

The foregoing discussion will be understood more readily from the following detailed description of the invention with reference to the following drawings

FIG. 3 is a perspective view of an array of shutter-based light modulators according to an illustrative embodiment of the invention;

FIGS. 12A-12F represent plan views of illustrative embodiments of the anchor structure elements.

DESCRIPTION OF CERTAIN ILLUSTRATIVE EMBODIMENTS

To provide an overall understanding of the invention, certain illustrative embodiments will now be described, including apparatus and methods for displaying images. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

Figure 1:
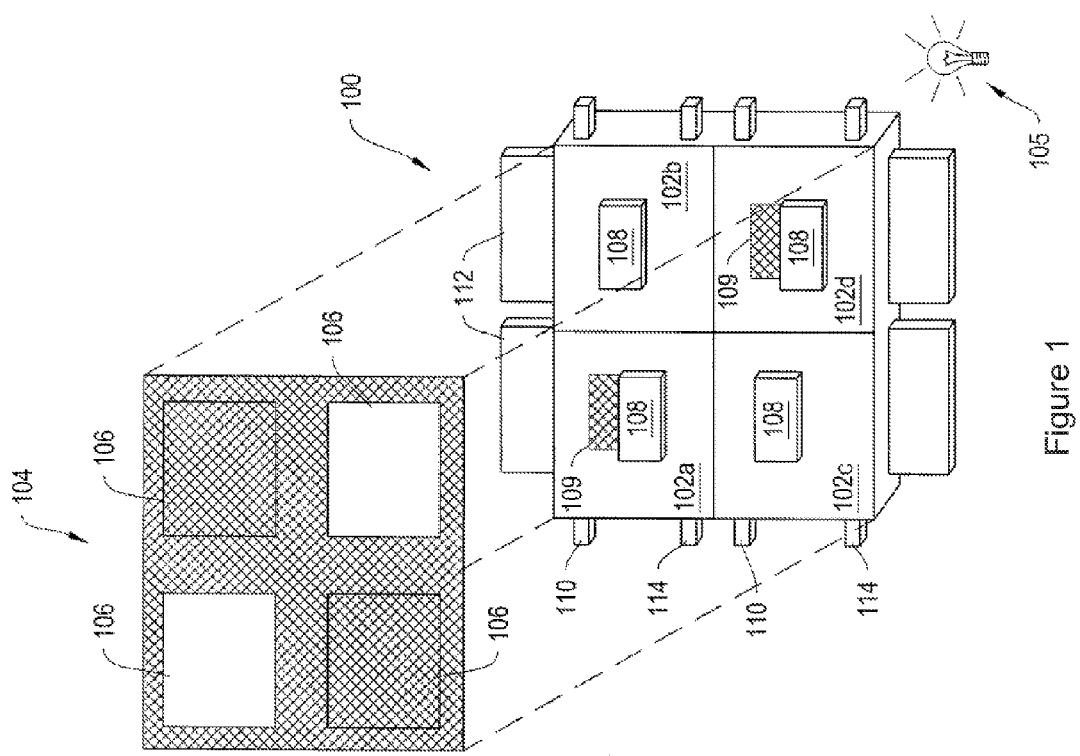
FIG. 1 is an trimetric view of display apparatus, according to an illustrative embodiment of the invention.

FIG. 1 is a schematic diagram of a direct-view MEMS-based display apparatus 100, according to an illustrative embodiment of the invention. The display apparatus 100 includes a plurality of light modulators 102a-102d (generally "light modulators 102") arranged in rows and columns. In the display apparatus 100, light modulators 102a and 102d are in the open state, allowing light to pass. Light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e. by use of a front light. In one of the closed or open states, the light modulators 102 interfere with light in an optical path by, for example, and without limitation, blocking, reflecting, absorbing, filtering, polarizing, diffracting, or otherwise altering a property or path of the light.

In the display apparatus 100, each light modulator 102 corresponds to a pixel 106 in the image 104. In other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide grayscale in an image 104. With respect to an image, a "pixel" corresponds to the smallest picture element defined by the resolution of the image. With respect to structural components of the display apparatus 100, the term "pixel" refers to the combined mechanical and electrical components utilized to modulate the light that forms a single pixel of the image.

Display apparatus 100 is a direct-view display in that it does not require imaging optics. The user sees an image by looking directly at the display apparatus 100. In alternate embodiments the display apparatus 100 is incorporated into a projection display. In such embodiments, the display forms an image by projecting light onto a screen or onto a wall. In projection applications the display apparatus 100 is substantially smaller than the projected image 104.

Direct-view displays may operate in either a transmissive or reflective mode. In a transmissive display, the light modulators filter or selectively block light which originates from a lamp or lamps positioned behind the display. The light from the lamps is optionally injected into a light guide or "backlight". Transmissive direct-view display embodiments are often built onto transparent or glass substrates to facilitate a sandwich assembly arrangement where one substrate, containing the light modulators, is positioned directly on top of the backlight. In some transmissive display embodiments, a color specific light modulator is created by associating a color filter material with each modulator 102. In other transmissive display embodiments colors can be generated, as described below, using a field sequential color method by alternating illumination of lamps with different primary colors.

Each light modulator 102 includes a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light absorbing material. The display apparatus also includes a control matrix connected to the substrate and to the light modulators for controlling the movement of the shutters. The control matrix includes a series of electrical interconnects (e.g., interconnects 110, 112, and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, $V_{we}$"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

MEMS Light Modulators

Figure 2:
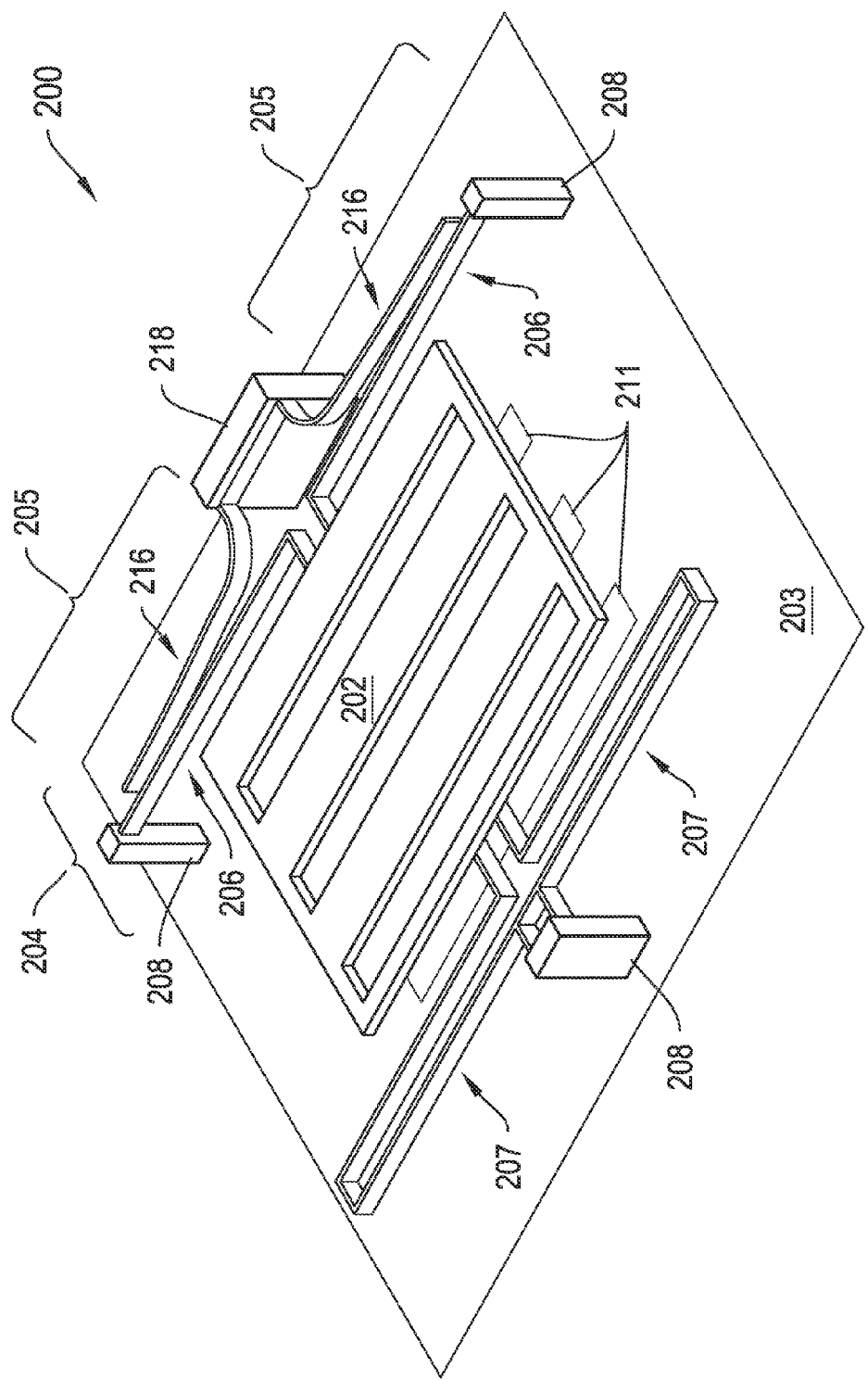
FIG. 2 is a trimetric view of an illustrative shutter-based light modulator suitable for incorporation into the MEMS-based display of FIG. 1, according to an illustrative embodiment of the invention.

FIG. 2 is a perspective view of an illustrative shutter-based light modulator 200 suitable for incorporation into the MEMS-based display apparatus 100 of FIG. 1, according to an illustrative embodiment of the invention. The shutter-based light modulator 200 (also referred to as shutter assembly 200) includes a shutter 202 coupled to an actuator 204. The actuator 204 is formed from two separate compliant electrode beam actuators 205 (the "actuators 205"), as described in Hagood et al (U.S. Pat. No. 7,271,945, incorporated herein by reference in its entirety). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The load anchors 208 physically connect the compliant load beams 206 and the shutter 202 to the surface 203 and electrically connect the load beams 206 to a bias voltage, in some instances, ground.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

The surface 203 includes one or more apertures 211 for admitting the passage of light. If the shutter assembly 200 is formed on an opaque substrate, made for example from silicon, then the surface 203 is a surface of the substrate, and the apertures 211 are formed by etching an array of holes through the substrate. If the shutter assembly 200 is formed on a transparent substrate, made for example of glass or plastic, then the surface 203 is a surface of a light blocking layer deposited on the substrate, and the apertures are formed by etching the surface 203 into an array of holes 211. The apertures 211 can be generally circular, elliptical, polygonal, serpentine, or irregular in shape.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely towards the drive anchor 218. The compliant members 206 act as springs, such that when the voltage across the beams 206 and 216 is removed, the load beams 206 push the shutter 202 back into its initial position, releasing the stress stored in the load beams 206.

The shutter assembly 200, also referred to as an elastic shutter assembly, incorporates a passive restoring force, such as a spring, for returning a shutter to its rest or relaxed position after voltages have been removed. A number of elastic restore mechanisms and various electrostatic couplings can be designed into or in conjunction with electrostatic actuators, the compliant beams illustrated in shutter assembly 200 being just one example. Other examples are described in Hagood et al (U.S. Pat. No. 7,271,945), and U.S. patent application Ser. No. 11/326,696, both incorporated herein by reference in their entirety. For instance, a highly non-linear voltage-displacement response can be provided which favors an abrupt transition between "open" vs. "closed" states of operation, and which, in many cases, provides a bi-stable or hysteretic operating characteristic for the shutter assembly. Other electrostatic actuators can be designed with more incremental voltage-displacement responses and with considerably reduced hysteresis, as may be preferred for analog gray scale operation.

The actuator 205 within the elastic shutter assembly is said to operate between a closed or actuated position and a relaxed position. The designer, however, can choose to place apertures 211 such that shutter assembly 200 is in either the "open" state, i.e. passing light, or in the "closed" state, i.e. blocking light, whenever actuator 205 is in its relaxed position. For illustrative purposes, it is assumed below that elastic shutter assemblies described herein are designed to be open in their relaxed state.

In many cases it is preferable to provide a dual set of "open" and "closed" actuators as part of a shutter assembly so that the control electronics are capable of electrostatically driving the shutters into each of the open and closed states.

It will be understood that other MEMS light modulators can exist and can be usefully incorporated into the invention. Both Hagood et al (U.S. Pat. No. 7,271,945 and U.S. patent application Ser. No. 11/326,696 (both incorporated herein by reference in their entirety) have described a variety of methods by which an array of shutters can be controlled via a control matrix to produce images, in many cases moving images, with appropriate gray scale. In some cases, control is accomplished by means of a passive matrix array of row and column interconnects connected to driver circuits on the periphery of the display. In other cases it is appropriate to include switching and/or data storage elements within each pixel of the array (the so-called active matrix) to improve either the speed, the gray scale and/or the power dissipation performance of the display.

Referring to FIG. 3, control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write enabling voltage source 307 to the pixels 301 in a corresponding row of pixels 301. Each data interconnect 308 electrically connects a data voltage source, ("$V_d$ source") 309 to the pixels 301 in a corresponding column of pixels 301. In control matrix 300, the data voltage $V_d$ provides the majority of the energy necessary for actuation of the shutter assemblies 302. Thus, the data voltage source 309 also serves as an actuation voltage source.

For each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying $V_{we}$ to each scan-line interconnect 306 in turn. For a write-enabled row, the application of $V_{we}$ to the gates of the transistors 310 of the pixels 301 in the row allows the flow of current through the data interconnects 308 through the transistors 310 to apply a potential to the actuator 303 of the shutter assembly 302. While the row is write-enabled, data voltages $V_d$ are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed Vat (the actuation threshold voltage). In response to the application of Vat to a data interconnect 308, the actuator 303 in the corresponding shutter assembly 302 actuates, opening the shutter in that shutter assembly 302. The voltage applied to the data interconnect 308 remains stored in the capacitor 312 of the pixel 301 even after the control matrix 300 ceases to apply $V_{we}$ to a row. It is not necessary, therefore, to wait and hold the voltage $V_{we}$ on a row for times long enough for the shutter assembly 302 to actuate; such actuation can proceed after the write-enabling voltage has been removed from the row. The capacitors 312 also function as memory elements within the array 320, storing actuation instructions for periods as long as is necessary for the illumination of an image frame.

The pixels 301 as well as the control matrix 300 of the array 320 are formed on a substrate 304. The array includes an aperture layer 322, disposed on the substrate 304, which includes a set of apertures 324 for respective pixels 301 in the array 320. The apertures 324 are aligned with the shutter assemblies 302 in each pixel. In one implementation the substrate 304 is made of a transparent material, such as glass or plastic. In another implementation the substrate 304 is made of an opaque material, but in which holes are etched to form the apertures 324.

Components of shutter assemblies 302 are processed either at the same time as the control matrix 300 or in subsequent processing steps on the same substrate. The electrical components in control matrix 300 are fabricated using many thin film techniques in common with the manufacture of thin film transistor arrays for liquid crystal displays. Available techniques are described in Den Boer, Active Matrix Liquid Crystal Displays (Elsevier, Amsterdam, 2005), incorporated herein by reference. The shutter assemblies are fabricated using techniques similar to the art of micromachining or from the manufacture of micromechanical (i.e., MEMS) devices. Many applicable thin film MEMS techniques are described in Rai-Choudhury, ed., Handbook of Microlithography, Micromachining & Microfabrication (SPIE Optical Engineering Press, Bellingham, Wash. 1997), incorporated herein by reference. Fabrication techniques specific to MEMS light modulators formed on glass substrates can be found in Brosnihan (U.S. Pat. No. 7,405,852) and U.S. application Ser. No. 11/731,628, both incorporated herein by reference in their entirety. For instance, as described in those applications, the shutter assembly 302 can be formed from thin films of amorphous silicon, deposited by a chemical vapor deposition process.

The shutter assembly 302 together with the actuator 303 can be made bi-stable. That is, the shutters can exist in at least two equilibrium positions (e.g. open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 can also be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as spring 207 in shutter-based light modulator 200, or the opposing force may be exerted by an opposing actuator, such as an "open" or "closed" actuator.

The light modulator array 320 is depicted as having a single MEMS light modulator per pixel. Other embodiments are possible in which multiple MEMS light modulators are provided in each pixel, thereby providing the possibility of more than just binary "on" or "off" optical states in each pixel. Certain forms of coded area division gray scale are possible where multiple MEMS light modulators in the pixel are provided, and where apertures 324, which are associated with each of the light modulators, have unequal areas.

In other embodiments the roller-based light modulator 220 and the light tap 250, as well as other MEMS-based light modulators, can be substituted for the shutter assembly 302 within the light modulator array 320.

Figure 4A:
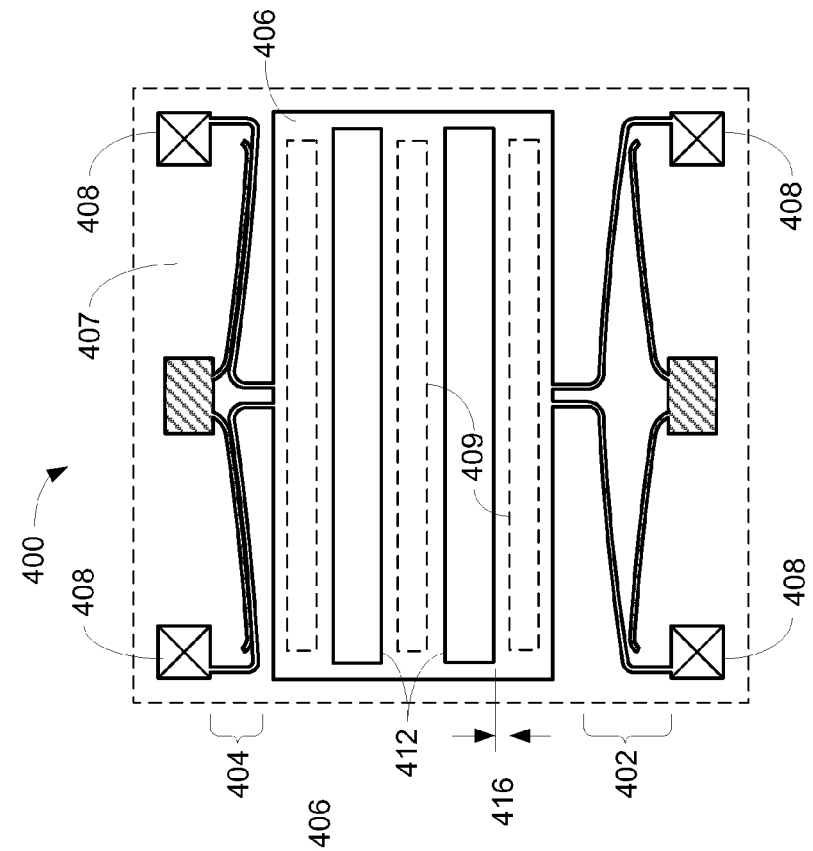
FIGS. 4A-B are plan views of a dual-actuated shutter assembly in the open and closed states respectively, according to an illustrative embodiment of the invention.
Figure 4B:
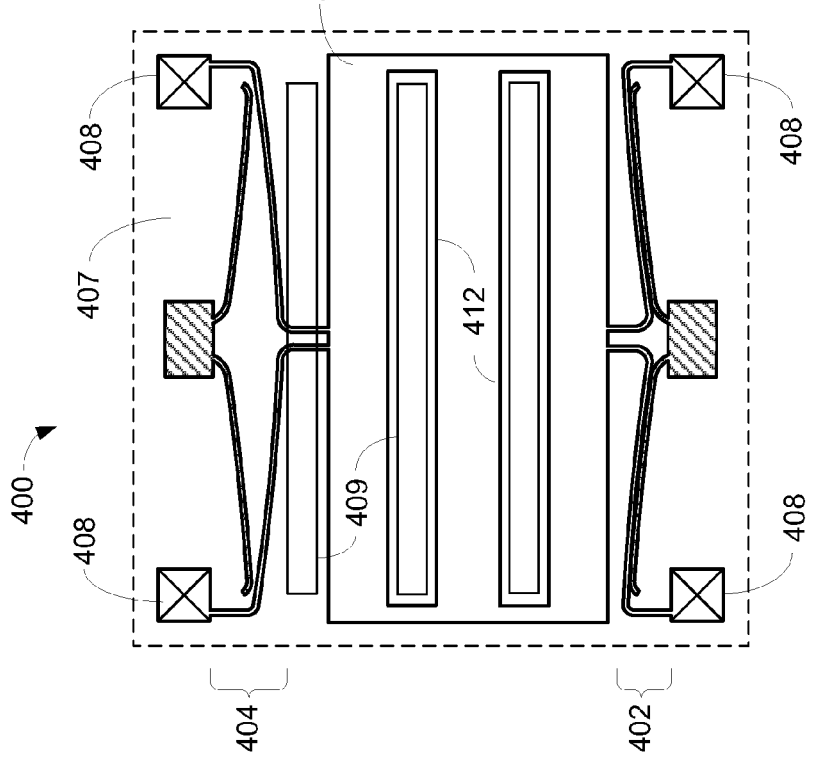

FIGS. 4A and 4B illustrate an alternative shutter-based light modulator (shutter assembly) 400 suitable for inclusion in various embodiments of the invention. Because four actuators accomplish the task of moving the shutter (two per side, making up actuators 402 and 404), this arrangement is referred to as a four-spring shutter. The light modulator 400 is an example of a dual actuator shutter assembly, and is shown in FIG. 4A in an open state. FIG. 4B is a view of the dual actuator shutter assembly 400 in a closed state. Shutter assembly 400 is described in further detail in Hagood et al (U.S. Pat. No. 7,271,945) incorporated herein by reference in its entirety. In contrast to the shutter assembly 200, shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter close actuator 404, serves to close the shutter 406. Both actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of apertures 412 and 409 coincide. In FIG. 4B the shutter assembly 400 has been moved to the closed state and, as such, the shutter-open actuator 402 is in its relaxed position, the shutter-close actuator 404 has been actuated, and the light blocking portions of shutter 406 are now in position to block transmission of light through the apertures 409 (shown as dotted lines).

Each aperture has at least one edge around its periphery. For example, the rectangular apertures 409 have four edges. In alternative implementations in which circular, elliptical, oval, or other curved apertures are formed in the aperture layer 407, each aperture may have only a single edge. In other implementations the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in aperture layer 407.

The electrostatic actuators 402 and 404 are designed so that their voltage displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage $V_m$. A number of control matrices which take advantage of the bi-stable operation characteristic are described in U.S. patent application Ser. No. 11/607,715, referenced above.

Figure 5:
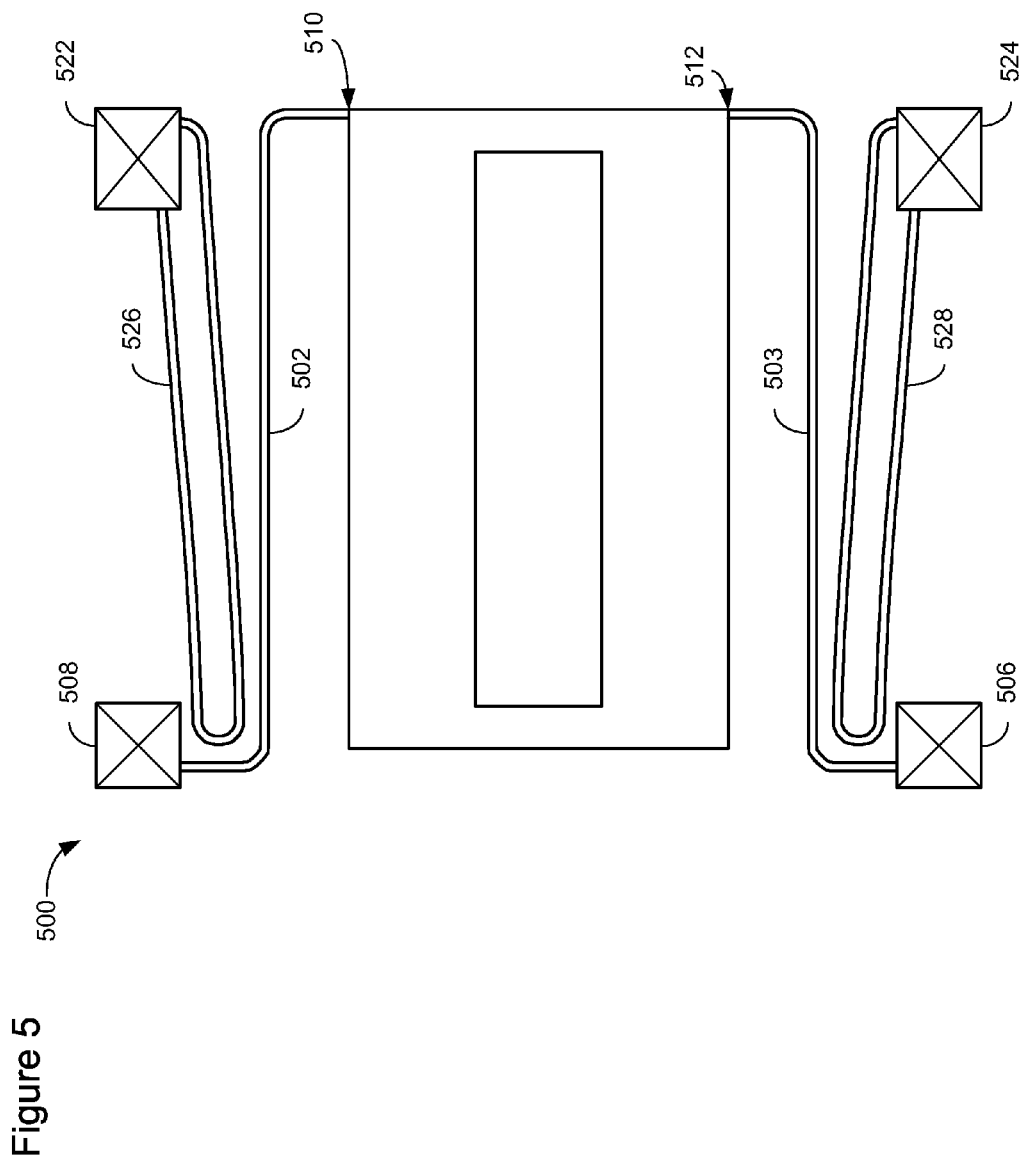
FIG. 5 is a plan view of a two-spring shutter assembly according to an illustrative embodiment of the invention.

FIG. 5 is a plan view of an illustrative embodiment of a light modulation assembly. In this embodiment, a two-spring shutter assembly 500 (so called "two-spring" because there is one load beam (502, 503) each attached to a shutter end (where the shutter end represents either the top or the bottom of the shutter), unlike the "four-spring" shutter assembly 400, where there are two load beams per shutter end. In one embodiment, each load beam (502,503) is connected at one end to the shutter 504 and at the other to an anchor structure (508 for beam 502 and 506 for beam 503).

The shelves within the anchor structures create a reference plane above the substrate to which the load beams are attached. This elevation and connection to the shutter through the load beams (502, 503) help to suspend the shutter 504 a specified distance above the surface. Notice that in one embodiment, these attachment points (510, 512) are on opposite sides of the shutter 504. This embodiment has demonstrated advantages in keeping the shutter from rotating around the axis normal to the substrate surface upon actuation. In other embodiments, the load beams are connected to the other corners of the shutter.

The drive beams (526, 528) are similarly suspended above the surface of the substrate by their anchor structures (522, 524). In operation, the shutter moves from one position to another by the electric attraction of its load beams (502, 503) to their respective drive beams (526, 528). To move the shutter 504 towards drive beam 526, we set the potential of drive beam 526 to a different value than the potential of shutter 504, while keeping drive beam 528 the same potential as shutter 504. Conversely, to drive the shutter in the towards drive beam 528, we set the potential of drive beam 528 to a different value than the potential of shutter 504, while keeping drive beam 526 the same potential as shutter 504. These drive beams are cantilevered beams that are each attached to a respective anchor (522, 524). More is discussed about these in FIGS. 8A and 8B.

The shutter 504 is disposed on a transparent substrate preferably made of glass or plastic. A rear-facing reflective layer disposed on the substrate below the shutter defines a plurality of surface apertures located beneath the shutter. The vertical gap that separates the shutter from the underlying substrate is in the range of 0.1 to 10 microns. The magnitude of the vertical gap is preferably less than the lateral overlap between the edge of shutter and the edge of aperture in the closed state, such as the overlap 416 shown in FIG. 4B.

Shutter Manufacturing

Figure 6A:
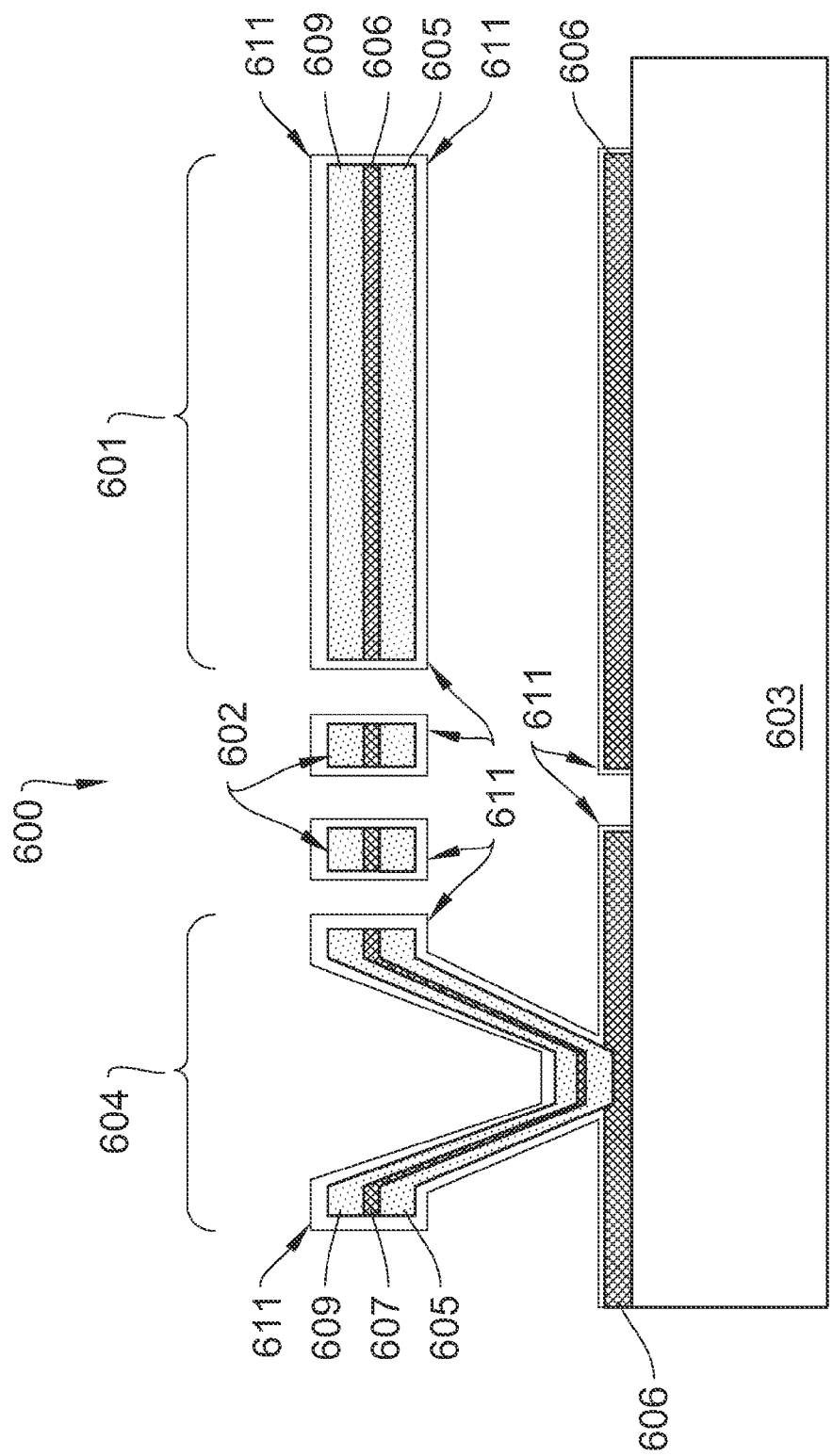
FIGS. 6A-6E are cross sectional views of stages of construction of a composite shutter assembly similar to that shown in FIG. 2, according to an illustrative embodiment of the invention.

FIG. 6A shows cross sectional detail of a composite shutter assembly 600, including shutter 601, a compliant beam 602, and anchor structure 604 built-up on substrate 603 and aperture layer 606 according to one implementation of the MEMS-based shutter display. The elements of the composite shutter assembly include a first mechanical layer 605, a conductor layer 607, a second mechanical layer 609, and an encapsulating dielectric 611. At least one of the mechanical layers 605 or 609 will be deposited to thicknesses in excess of 0.15 microns, as one or both of the mechanical layers will comprise the principle load bearing and mechanical actuation member for the shutter assembly. Candidate materials for the mechanical layers 605 and 609 include, without limitation, metals such as Al, Cu, Ni, Cr, Mo, Ti, Ta, Nb, Nd, or alloys thereof; dielectric materials such as $Al_2O_3$, $TiO_2$, $Ta_2O_5$, or $Si_3N_4$; or semiconducting materials such as diamond-like carbon, Si, Ge, GaAs, CdTe or alloys thereof. At least one of the layers, such as conductor layer 607, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof, especially when the semiconductors are doped with impurities such as phosphorus, arsenic, boron, or aluminum. FIG. 6A shows a sandwich configuration for the composite in which the mechanical layers 605 and 609 with similar thicknesses and mechanical properties are deposited on either side of the conductor layer 607. In some embodiments the sandwich structure helps to ensure that stresses remaining after deposition and/or stresses that are imposed by temperature variations will not act cause bending or warping of the shutter assembly 600.

In some implementations the order of the layers in composite shutter assembly 600 can be inverted, such that the outside of the sandwich is comprised of a conducting layer while the inside of the sandwich is comprised of a mechanical layer.

Further description of materials for use in shutter 601, including the incorporation of materials selected for the absorption or reflection of incident light can be found in Brosnihan (U.S. Pat. No. 7,405,852) incorporated herein in its entirety by reference.

Shutter assembly 600 includes an encapsulating dielectric layer 611. Dielectric coatings can be applied in conformal fashion, such that all bottom, tops, and side surfaces of the shutters and beams are uniformly coated. Such thin films can be grown by thermal oxidation and/or by conformal chemical vapor deposition of an insulator such as $Al_2O_3$, $Cr_2O_3$, $TiO_2$, $HfO_2$, $V_2O_5$, $Nb_2O_5$, $Ta_2O_5$, $SiO_2$, or $Si_3N_4$, or by depositing similar materials by means of atomic layer deposition. The dielectric coating layer can be applied with thicknesses in the range of 5 nm to 1 micron. In some cases sputtering and evaporation can be used to deposit the dielectric coating onto sidewalls.

FIGS. 6B-6E show the process for building shutter assembly 600, including shutter 601, a compliant beam 602, and anchor structure 604 on top of a substrate 603 and aperture layer 606. In many implementations, the shutter assembly is built on top of a pre-existing control matrix, for instance an active matrix array of thin film transistors. The processes used for constructing the control matrix on top of or in conjunction with an aperture layer 606 is described in Brosnihan (U.S. Pat. No. 7,405,852) referred to and incorporated above.

Figure 6B:
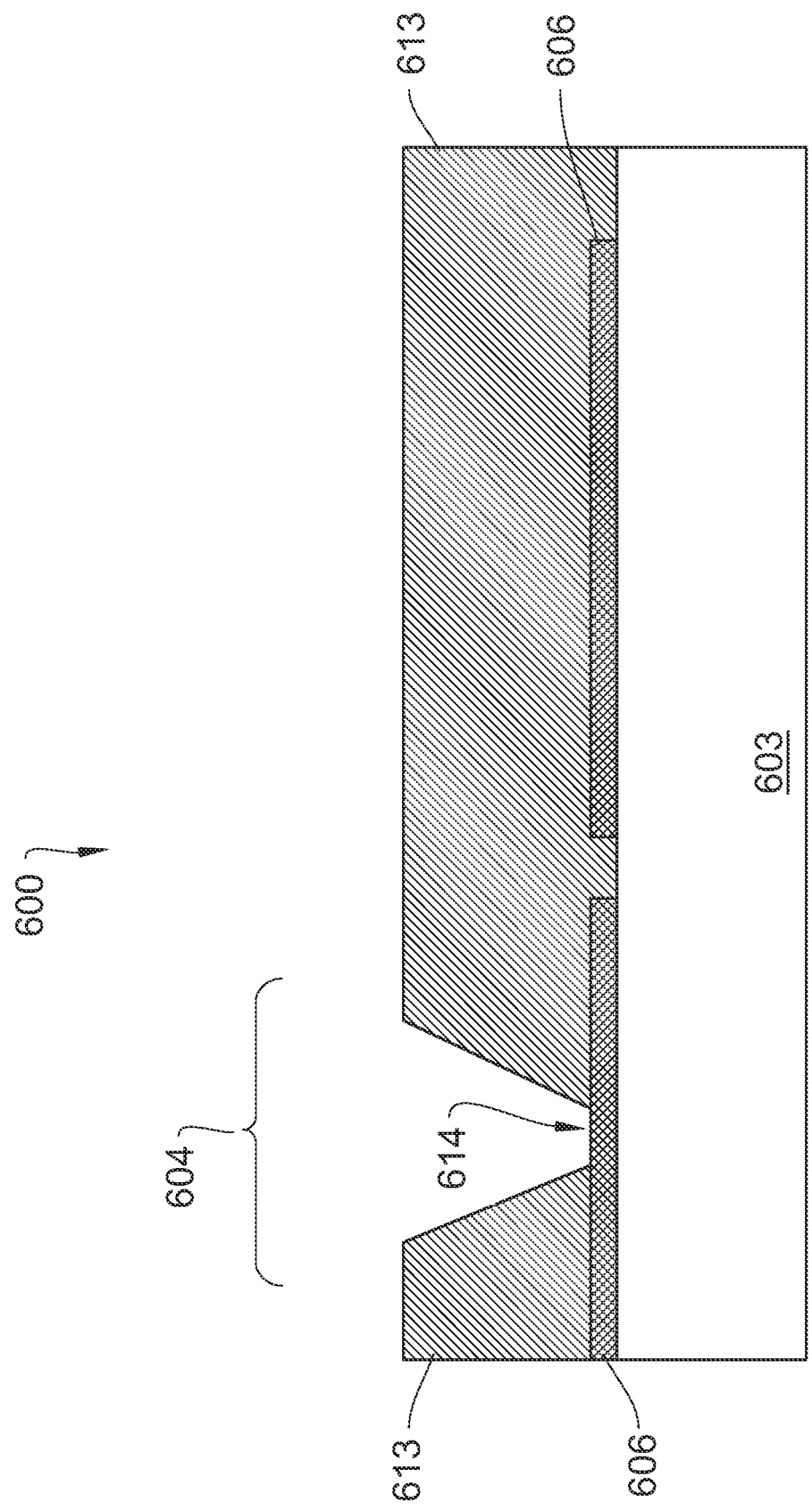

FIG. 6B is a cross sectional view of a first step in the process of forming the shutter assembly 600 according to an illustrative embodiment of the invention. As shown in FIG. 6B, a sacrificial layer 613 is deposited and patterned. Polyimide is a preferred sacrificial material. Other candidate sacrificial materials include polymer materials such as polyamide, fluoropolymer, benzocyclobutene, polyphenyl quinoxylene, parylene, or polynorbornene. These materials are chosen for their ability to planarize rough surfaces, maintain mechanical integrity at processing temperatures in excess of 250 C, and their ease of etch and/or thermal decomposition during removal. Alternate sacrificial layers can be found among the photoresists: polyvinyl acetate, polyvinyl ethylene, and phenolic or novolac resins, although their use will typically be limited to temperatures below 350 C. An alternate sacrificial layer is $SiO_2$, which can be removed preferentially as long as other electronic or structural layers are resistant to the hydrofluoric acid solutions used for its removal ($Si_3N_4$ is so resistant). Another alternate sacrificial layer is silicon, which can be removed preferentially as long as other electronic and structural layers are resistant to the fluorine plasmas or $XeF_2$ used for its removal (most metals and/or $Si_3N_4$ are so resistant). Yet another alternate sacrificial layer is aluminum, which can be removed preferentially as long as other electronic or structural layers are resistant to strong base (concentrated NaOH) solutions (Cr, Ni, Mo, Ta, and Si are so resistant). Still another alternate sacrificial layer is copper, which can be removed preferentially as long as other electronic or structural layers are resistant to nitric or sulfuric acid solutions (Cr, Ni, and Si are so resistant).

Next the sacrificial layer 613 is patterned to expose holes or vias at the anchor regions 604. The preferred polyimide material and other polymer resins can be formulated to include photoactive agents—enabling regions exposed through a UV photomask to be preferentially removed in a developer solution. Other sacrificial layers 613 can be patterned by coating the sacrificial layer in an additional layer of photoresist, photopatterning the photoresist, and finally using the photoresist as an etching mask. Other sacrificial layers can be patterned by coating the sacrificial layer with a hard mask, which can be a thin layer of $SiO_2$ or metal such as chromium. A photopattern is then transferred to the hard mask by means of photoresist and wet chemical etching. The pattern developed in the hard mask can be very resistant to dry chemical, anisotropic, or plasma etching—techniques which can be used to impart very deep and narrow anchor holes into the sacrificial layer.

After the anchor 604 or via regions have been opened in the sacrificial layer, the exposed and underlying conducting surface 614 can be etched, either chemically or via the sputtering effects of a plasma, to remove any surface oxide layers. Such a contact etching step can improve the ohmic contact between the underlying conductor and the shutter material.

After patterning of the sacrificial layer, any photoresist layers or hard masks can be removed through use of either solvent cleans or acid etching.

Figure 6C:
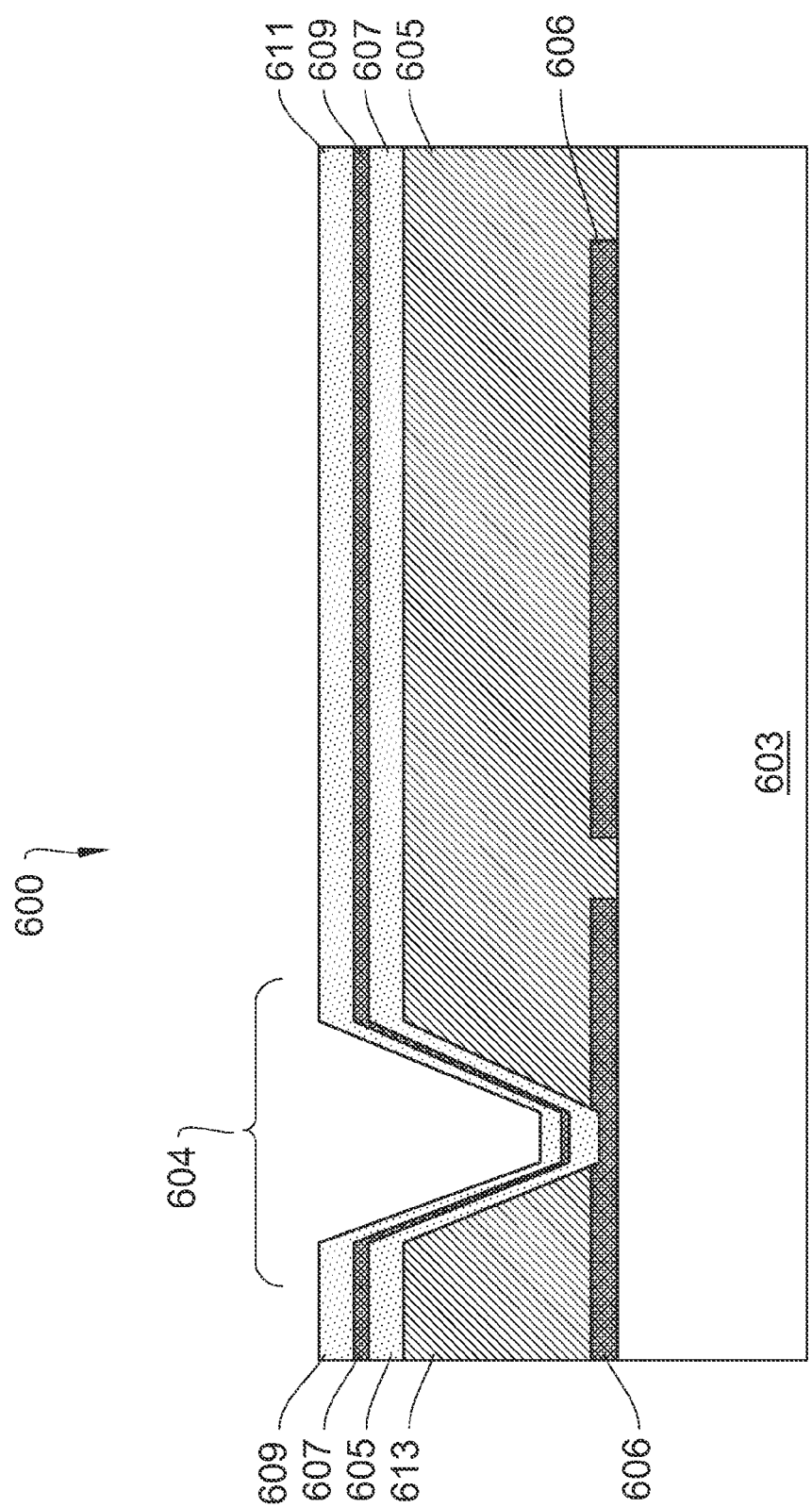

Next, in the process for building shutter assembly 600, as shown in FIG. 6C, the shutter materials are deposited. The shutter assembly 600 is composed of multiple thin films 605, 607, and 609. In a preferred embodiment the first mechanical layer 605 is an amorphous silicon layer, deposited first, followed by a conductor layer 607 comprised of aluminum, followed by a second layer 609 of amorphous silicon. The deposition temperature used for the shutter materials 605, 607, and 609 is below that at which physical degradation occurs for the sacrificial layer. For instance, polyimide is known to decompose at temperatures above 400 C. The shutter materials 605, 607 and 609 can be deposited at temperatures below 400 C, thus allowing usage of polyimide as a sacrificial material. Hydrogenated amorphous silicon is a useful mechanical material for layers 605 and 609 since it can be grown to thicknesses in the range of 0.1 to 3 microns, in a relatively stress-free state, by means of plasma-assisted chemical vapor deposition (PECVD) from silane gas at temperatures in the range of 250 to 350 C. Phosphene gas ($PH_3$) is used as a dopant so that the amorphous silicon can be grown with resistivities below 1 ohm-cm. In alternate embodiments, a similar PECVD technique can be used for the deposition of $Si_3N_4$, silicon-rich $Si_3N_4$, or $SiO_2$ materials as the mechanical layer 605 or for the deposition of diamond-like carbon, Ge, SiGe, CdTe, or other semiconducting materials for mechanical layer oxynitride 605. An advantage of the PECVD deposition technique is that the deposition can be quite conformal, that is, it can coat a variety of inclined surfaces or the inside surfaces of narrow via holes. Even if the anchor or via holes which are cut into the sacrificial material present nearly vertical sidewalls, the PECVD technique can provide a continuous coating between the bottom and top horizontal surfaces of the anchor.

In addition to the PECVD technique, alternate techniques available for the growth of shutter layers 605 or 609 include RF or DC sputtering, metal-organic chemical vapor deposition, evaporation, electroplating or electroless plating.

For the conducting layer 607, a metal thin film such as Al is preferred, although alternates such as Cu, Ni, Mo, or Ta can be chosen. The inclusion of such a conducting material serves two purposes. It reduces the overall sheet resistance of the shutter material and it helps to block the passage of visible light through the shutter material. (Amorphous silicon can be doped to be conductive, however, if grown to thicknesses of less than 2 microns can transmit visible light to some degree.) The conducting material can be deposited either by sputtering or, in a more conformal fashion, by chemical vapor deposition techniques, electroplating, or electroless plating.

Figure 6D:
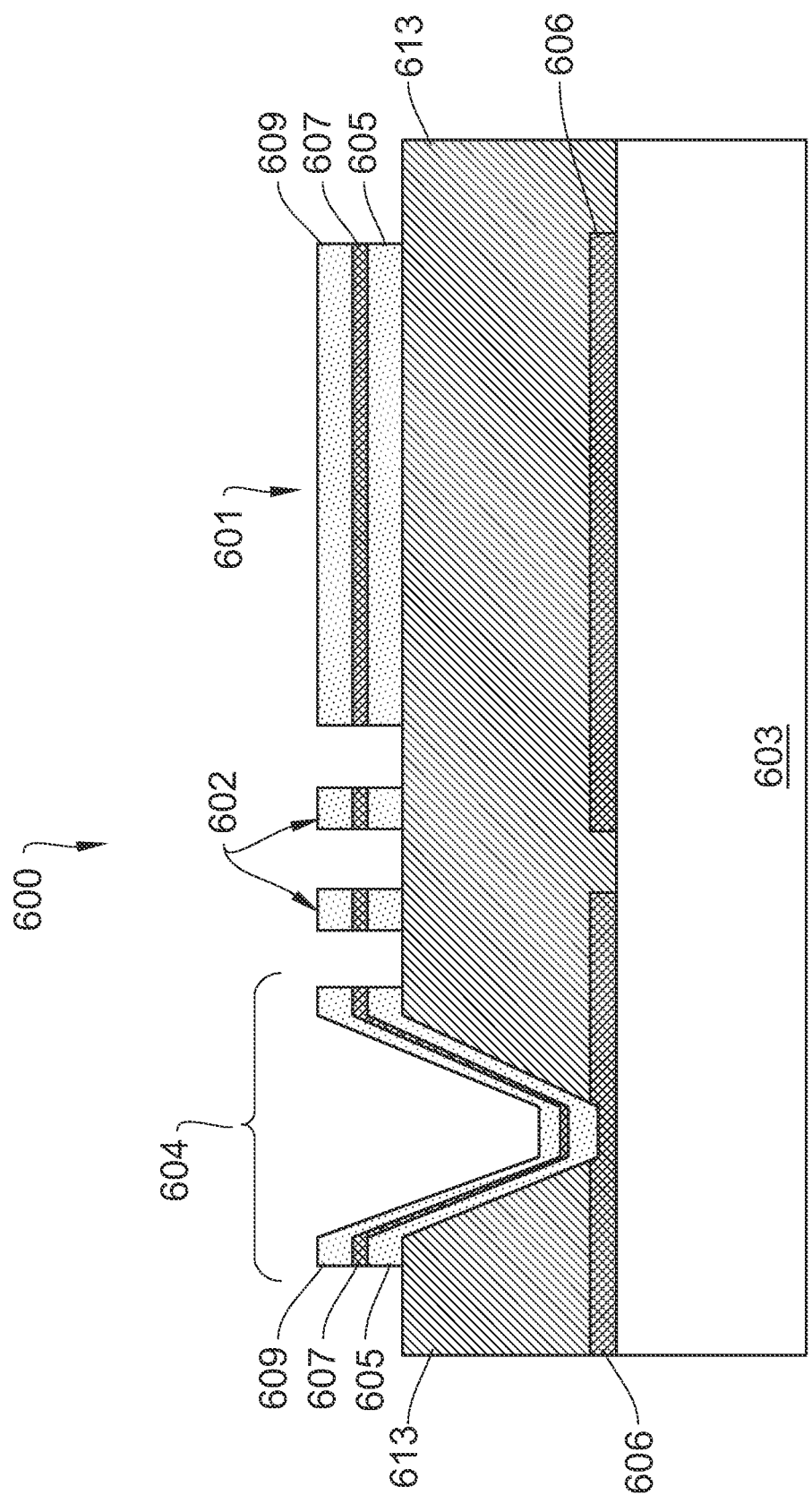

The process for building the shutter assembly 600 continues in FIG. 6D. The shutter layers 605, 607, and 609 are photomasked and etched while the sacrificial layer 613 is still on the wafer. First a photoresist material is applied, then exposed through a photomask, and then developed to form an etch mask. Amorphous silicon, silicon nitride, and silicon oxide can then be etched in fluorine-based plasma chemistries. $SiO_2$ mechanical layers can be etched using HF wet chemicals; and any metals in the conductor layers can be etched with either wet chemicals or chlorine-based plasma chemistries.

The pattern shapes applied through the photomask at FIG. 6D influence the mechanical properties, such as stiffness, compliance, and the voltage response in the actuators and shutters of the shutter assembly 600. The shutter assembly 600 includes a compliant beam 602, shown in cross section. Compliant beam 602 is shaped such that the width is less than the total height or thickness of the shutter material. It is preferable to maintain a beam dimensional ratio of at least 1.4:1, with the beams 602 being taller or thicker than they are wide.

Figure 6E:
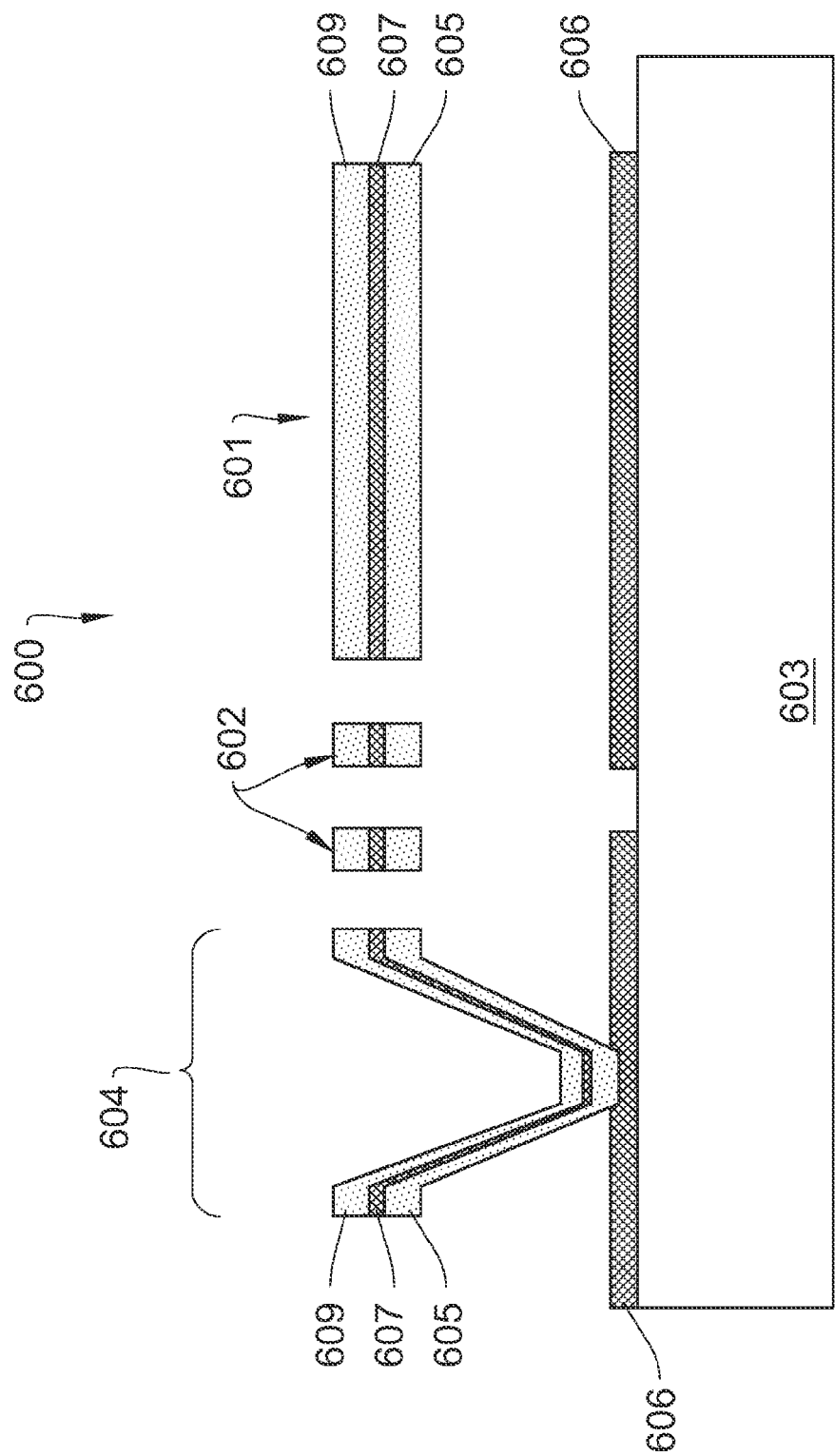

The process for building the shutter assembly 600 continues as depicted in FIG. 6E. The sacrificial layer 613 is removed, which frees-up all moving parts from the substrate 603, except at the anchor points. Polyimide sacrificial materials are preferably removed in an oxygen plasma. Other polymer materials used for sacrificial layer 613 can also be removed in an oxygen plasma, or in some cases by thermal pyrolysis. Some sacrificial layers 613 (such as $SiO_2$) can be removed by wet chemical etching or by vapor phase etching.

In a final process, not shown in FIG. 6E but shown in FIG. 6A, a dielectric coating 611 is deposited on all exposed surfaces of the shutter. Dielectric coatings 611 can be applied in conformal fashion, such that all bottom, tops, and side surfaces of the shutters 601 and beams 602 are uniformly coated using chemical vapor deposition. $Al_2O_3$ is a preferred dielectric coating for layer 611, which is deposited by atomic layer deposition to thicknesses in the range of 10 to 100 nanometers.

Finally, anti-stiction coatings can be applied to the surfaces of all shutters 601 and beams 602. These coatings prevent the unwanted stickiness or adhesion between two independent beams of an actuator. Applicable coatings include carbon films (both graphite and diamond-like) as well as fluoropolymers, and/or low vapor pressure lubricants. These coatings can be applied by either exposure to a molecular vapor or by decomposition of a precursor compounds by means of chemical vapor deposition. Anti-stiction coatings can also be created by the chemical alteration of shutter surfaces, as in the fluoridation, silanization, siloxidation, or hydrogenation of insulating surfaces.

The Sidewall Beams Process

U.S. Pat. No. 7,271,945, incorporated herein by reference in its entirety, describes a number of useful designs for shutter assemblies and actuators. One class of suitable actuators for use in MEMS-based shutter displays include compliant actuator beams for controlling shutter motion that is transverse to or in-the-plane of the display substrate. The voltage necessary for the actuation of such shutter assemblies decreases as the actuator beams become more compliant. The control of actuated motion also improves if the beams are shaped such that in-plane motion is preferred or promoted with respect to out-of-plane motion. In a preferred design the compliant actuator beams have a rectangular cross section, such as beam 602 of FIG. 6A, such that the beams are taller or thicker than they are wide.

The stiffness of a long rectangular beam with respect to bending within a particular plane scales with the thinnest dimension of that beam in that plane to the third power. It is of interest, therefore, to reduce the width of the compliant beams as far as possible to reduce the actuation voltages for in-plane motion. When using conventional photolithography equipment to define and fabricate the shutter and actuator structures, however, the minimum width of the beams is usually limited to the resolution of the exposure optics. And although photolithography equipment has been developed for defining patterns in photoresist with features as narrow as 15 nanometers, such equipment is expensive and the areas over which patterning can be accomplished in a single exposure are limited. For economical photolithography over large panels of glass, the patterning resolution or minimum feature size is typically limited to 1 micron or 2 microns or greater.

U.S. Patent Application Publication No. US 2007/0002156 describes a technique, illustrated in FIGS. 7A through 7D, whereby a shutter assembly 700 with compliant actuator beams 716 can be fabricated at dimensions well below the conventional lithography limits on large glass panels. In the process of FIGS. 7A through 7D, the compliant beams of shutter assembly 700 are formed as sidewall features on a mold made from a sacrificial material. The process is referred to as a sidewall beams process.

Figure 7A:
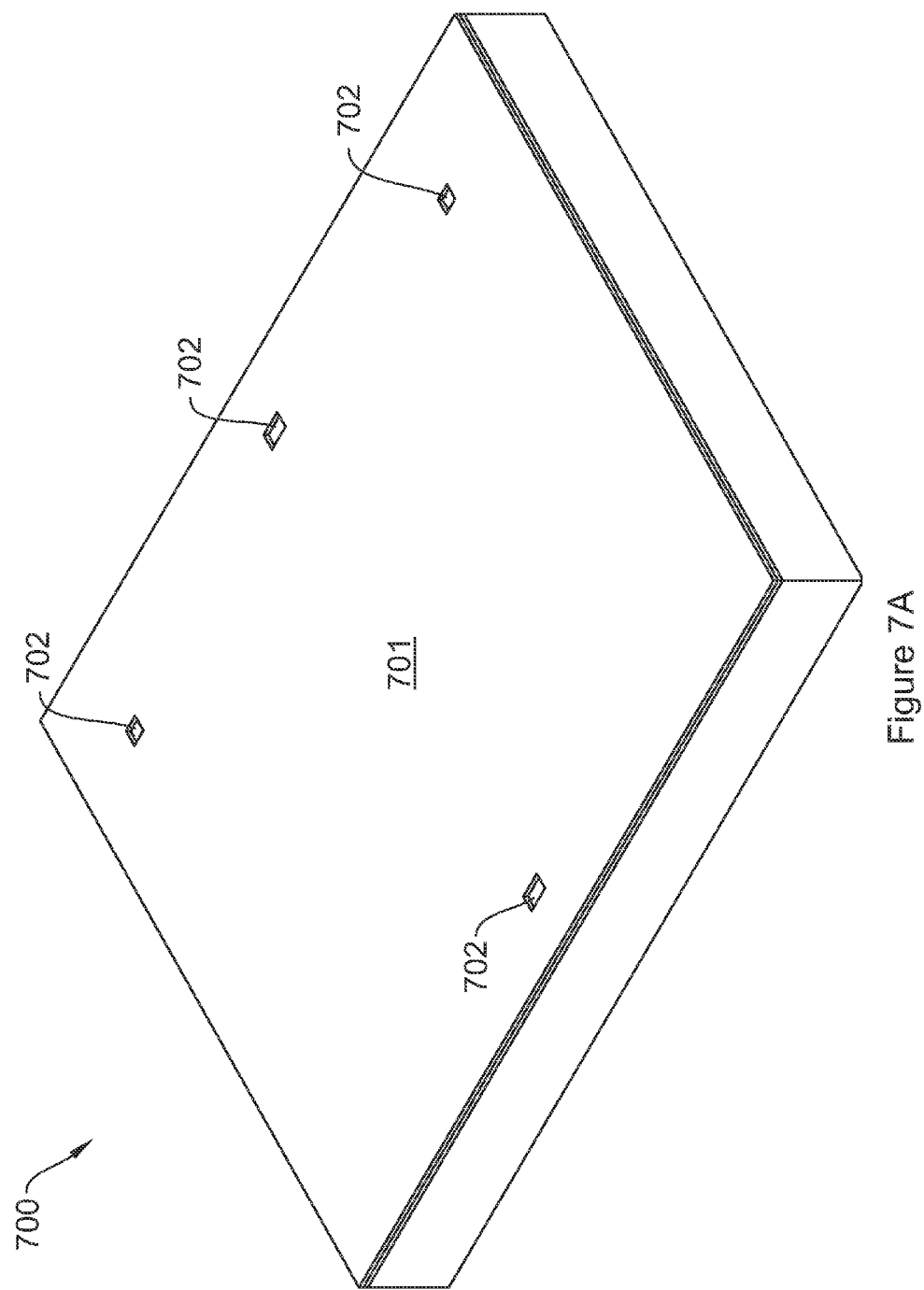
FIGS. 7A-7D are isometric views of stages of construction of an alternate shutter assembly with narrow sidewall beams, according to an illustrative embodiment of the invention.

The process of forming a shutter assembly 700 with sidewall beams begins, as shown in FIG. 7A, with the deposition and patterning of a first sacrificial material 701. The pattern defined in the first sacrificial material creates openings or vias 702 within which anchors for the shutter will eventually be formed. The deposition and patterning of the first sacrificial material 701 is similar in concept, and uses similar materials, as those described for the deposition and patterning described in relation to FIGS. 6A-6E.

Figure 7B:
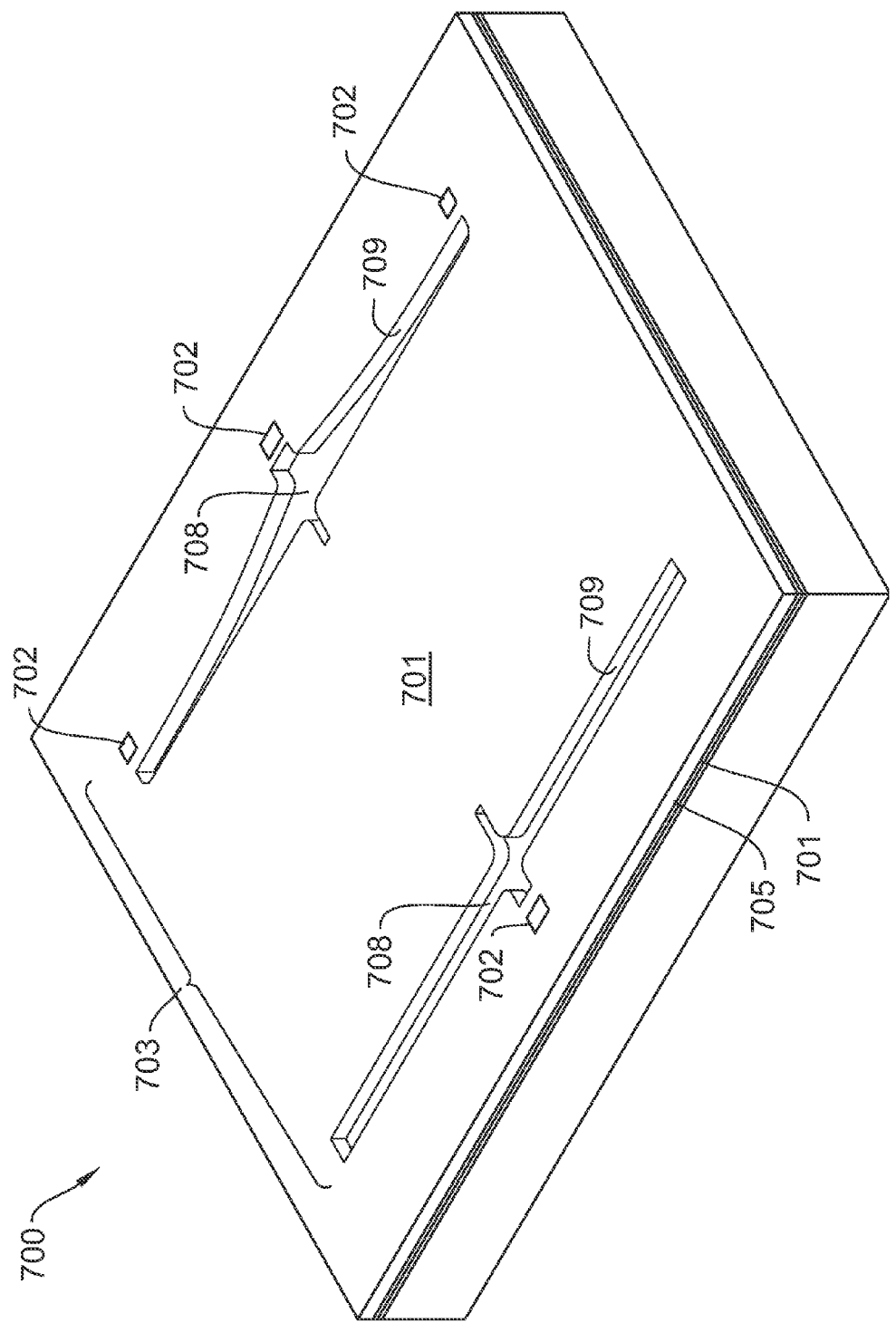

The process of forming sidewall beams continues with the deposition and patterning of a second sacrificial material 705. FIG. 7B shows the shape of a mold 703 that is created after patterning of the second sacrificial material 705. The mold 703 also includes the first sacrificial material 701 with its previously defined vias 702. The mold 703 in FIG. 7B includes two distinct horizontal levels: The bottom horizontal level 708 of mold 703 is established by the top surface of the first sacrificial layer 701 and is accessible in those areas where the second sacrificial layer 705 has been etched away. The top horizontal level 710 of the mold 703 is established by the top surface of the second sacrificial layer 705. The mold 703 illustrated in FIG. 7B also includes substantially vertical sidewalls 709.

Materials for use as sacrificial materials 701 and 705 are described above with respect to sacrificial material 613.

Figure 7C:
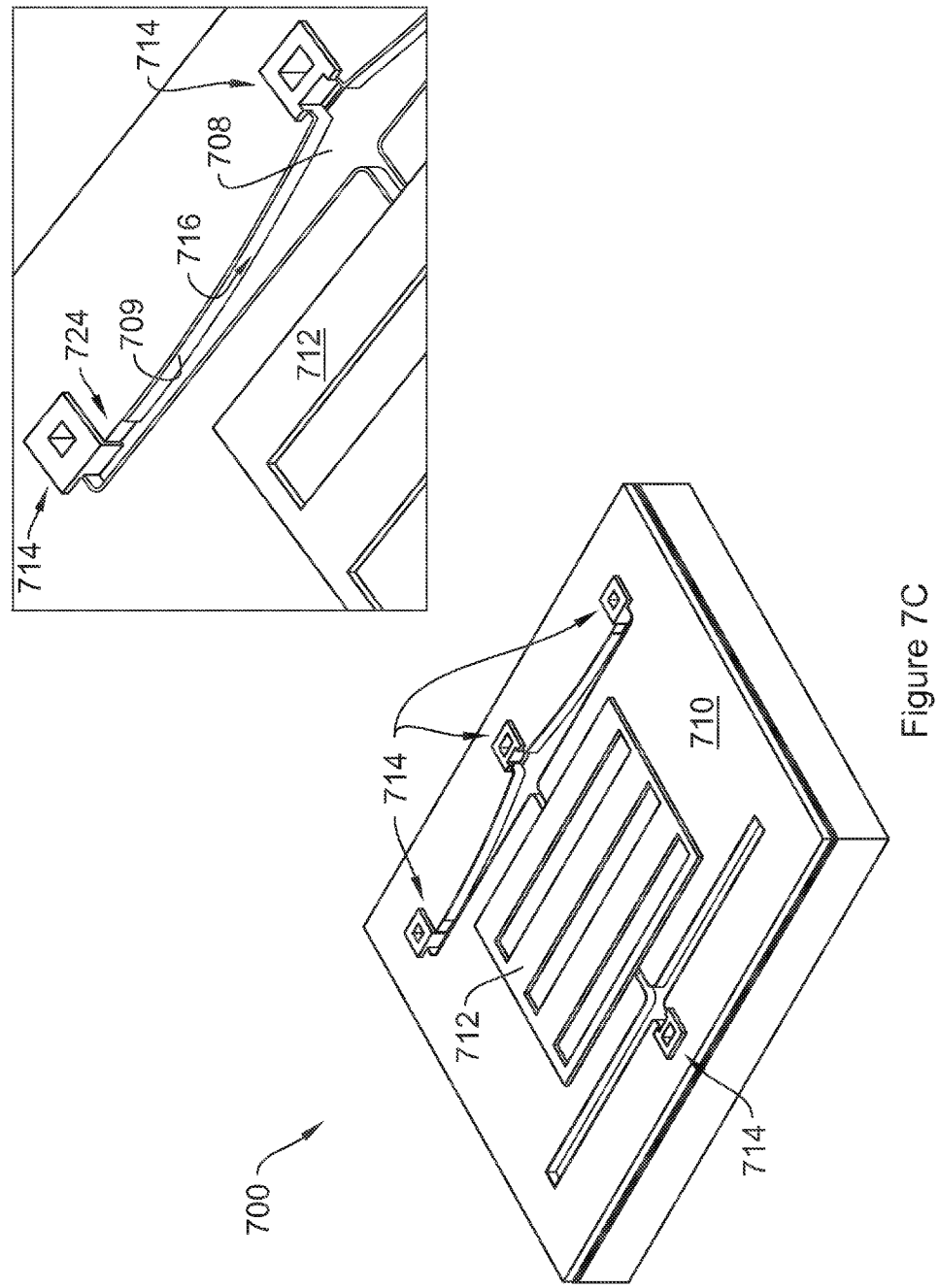

The process of forming sidewall beams continues with the deposition and patterning of the shutter material onto all of the exposed surfaces of the sacrificial mold 703, as depicted in FIG. 7C. The preferred materials for use in shutter 712 are described above with respect to the shutter materials 605, 607, and 609. Alternate shutter materials and/or shutter coatings are described in Brosnihan (U.S. Pat. No. 7,405,852). The shutter material is deposited to a thickness of less than about 2 microns. In some implementations, the shutter material is deposited to have a thickness of less than about 1.5 microns. In other implementations, the shutter mater is deposited to have a thickness of less than about 1.0 microns, and as thin as about 0.10 microns. After deposition, the shutter material (which may be a composite shutter as described above) is patterned, as shown in FIG. 7C. The pattern developed into the photoresist is designed such that shutter material remains in the region of shutter 712 as well as at the anchors 714.

Particular equipment and chemistries are also chosen for the etching process used at the step shown in FIG. 7C, known in the art as an anisotropic etch. The anisotropic etch of the shutter material is carried out in a plasma atmosphere with a voltage bias applied to the substrate, or to an electrode in proximity to the substrate. The biased substrate (with electric field perpendicular to the surface of the substrate) leads to acceleration of ions toward the substrate at an angle nearly perpendicular to the substrate. Such accelerated ions, coupled with the etching chemicals, lead to etch rates that are much faster in a direction that is normal to the plane of the substrate as compared to directions parallel to the substrate. Undercut-etching of shutter material in the regions protected by photoresist is thereby substantially eliminated. Along sidewall surfaces 709 of mold 703, which are substantially parallel to the track of the accelerated ions, the shutter material is also substantially protected from the anisotropic etch. Such protected sidewall shutter material will later form compliant beams 716 for supporting the shutter 712. Along other (non-photoresist-protected) horizontal surfaces of the mold, such as top horizontal surface 710 or bottom horizontal surface 708, the shutter material has been completely removed by the etch.

The anisotropic etch used to form sidewall beams 716 can be achieved in either an RF or DC plasma etching device as long as provision for electrical bias of the substrate, or of an electrode in close proximity of the substrate, is supplied. For the case of RF plasma etching, an equivalent self-bias can be obtained by disconnecting the substrate holder from the grounding plates of the excitation circuit, thereby allowing the substrate potential to float in the plasma. In one implementation it is possible to provide an etching gas such as $CHF_3$, $C_4F_8$, or $CHCl_3$ in which both carbon and hydrogen and/or carbon and fluorine are constituents in the etch gas. When coupled with a directional plasma, achieved again through voltage biasing of the substrate, the liberated C, H, and/or F atoms can migrate to the sidewalls 709 where they build up a passive or protective quasipolymer coating. This quasi-polymer coating further protects the sidewall beams 716 from etching or chemical attack.

Figure 7D:
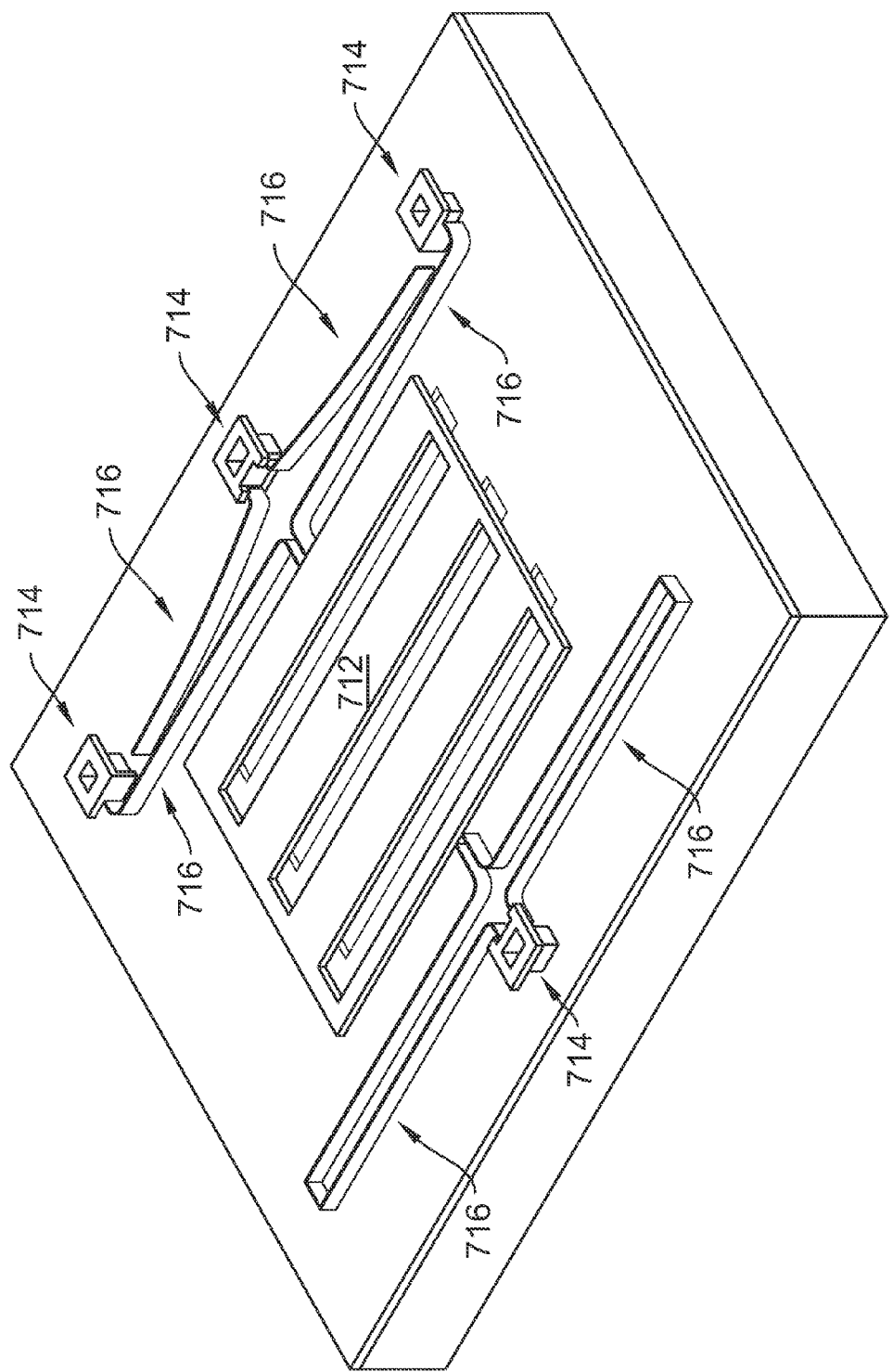

The process of forming sidewall beams is completed with the removal of the remainder of the second sacrificial layer 705 and the first sacrificial layer 701, the result being shown in FIG. 7D. The process of removing sacrificial material is similar to that described with respect to FIG. 6E. The material deposited on the sidewalls 709 of the mold 703 remain as the compliant beams 716. The compliant beams 716 mechanically connect the anchors 714 to the shutter 712. The anchors connect to an aperture layer 725. The compliant beams 716 are tall and narrow. The width of the sidewall beams 716, as formed from the surface of the mold 703, is similar to the thickness of the shutter material as deposited. In some cases the beam width at 716 will be the same as the thickness of the horizontal shutter material at 712, in other cases the beam width will be only about ½ the thickness of the shutter material. The height of the sidewall beams 716 is determined by the thickness of the second sacrificial material 705, or in other words, by the depth of the mold 703 as created during the patterning step described in relation to FIG. 7B. As long as the thickness of the deposited shutter material is chosen to be less than 2 microns (for many applications the thickness range of 0.1 to 2.0 micron is suitable), the method illustrated in FIGS. 7A-7D is well suited for the production of very narrow beams. Conventional photolithography would limit the patterned features shown in FIGS. 7A, 7B, and 7C to much larger dimensions, for instance allowing minimum resolved features no smaller than 2 microns or 5 microns.

FIG. 7D depicts an isometric view of a shutter assembly 700, formed after the release step in the above-described process, yielding compliant beams with cross sections of high aspect ratio. As long as the thickness of the second sacrificial layer is, for example, greater than 4 times larger than the thickness of the shutter material, the resulting ratio of beam height to beam width will be produced to a similar ratio, i.e. greater than 4.

An optional step, not illustrated above but included as part of the process leading to FIG. 7C, involves isotropic etching of sidewall beams 716 to separate or decouple beams formed along the sidewalls of mold 703. For instance, the shutter material at point 724 has been removed from the sidewall through use of an in isotropic etch. An isotropic etch is one whose etch rate is the same in all directions, so that sidewall material in regions such as point 724 is no longer protected. The isotropic etch can be accomplished in the typical plasma etch equipment as long as a bias voltage is not applied to the substrate. Isotropic etch can also be achieved using wet chemical or vapor phase etching techniques. The separation of beams at point 724 is achieved through a distinct sequence of photoresist dispense, patterning, and etch. The photoresist pattern in this case is designed to protect the sidewall beams 716 from the isotropic etch chemistry but expose the sidewall beams at point 724.

As a final step in the sidewall process, an encapsulating dielectric, such as dielectric 611 is deposited around the outside surfaces of the sidewall beams.

In order to protect the shutter material deposited on sidewalls 709 of the mold 703 and to produce sidewall beams 716 of substantially uniform cross section, some particular process guidelines can be followed. For instance, in FIG. 7B, the sidewalls 709 can be made as vertical as possible. Slopes at the sidewalls 709 and/or exposed surfaces become susceptible to the anisotropic etch. Vertical sidewalls 709 can be produced if the patterning step at FIG. 7B, the patterning of the second sacrificial material 705, is also carried out in anisotropic fashion. The use of an additional photoresist coating or a hard mask in conjunction with patterning of the second sacrificial layer 705 makes it possible to employ aggressive plasmas and/or high substrate bias in the anisotropic etch of the second sacrificial material 705 without fear of excessive wear of the photoresist. Vertical sidewalls 709 can also be produced in photoimageable sacrificial materials as long as care is taken to control the depth of focus during the UV exposure and excessive shrinkage is avoided during final cure of the resist.

Another process specification that helps during sidewall beam processing regards the conformality of the shutter material deposition. The surfaces of the mold 703 are preferably covered with similar thicknesses of shutter material, regardless or the orientation of those surfaces, either vertical or horizontal. Such conformality can be achieved when depositing with a chemical vapor deposition technique (CVD). In particular, the following conformal techniques can be employed: plasma enhanced chemical vapor deposition (PECVD), low pressure chemical vapor deposition (LPCVD), and atomic or self-limited layer deposition (ALD). In the above CVD techniques the growth rate of the thin film can be limited by reaction rates on a surface as opposed to exposing the surface to a directional flux of source atoms. In such conformal deposition techniques, the thickness of material grown on vertical surfaces is preferably at least 50% of the thickness of material grown on horizontal surfaces. Alternatively, shutter materials can be conformally deposited from solution by electroless plating or electroplated, as long as a metal seed layer is provided that uniformly coats all surfaces before plating.

Anchor Structure

Given the limitations of the MEMS sidewall beams process described above, many of the structures available in larger mechanical structures (e.g. dowels, pins, hinges, trusses, etc.) are either impossible or impractical. Instead, concepts more closely related to cardboard corrugation are needed, specifically, the creation of complex, shell structures. Shells are well defined in the two references, *Theory of Plates and Shells* by Stephen P. Timoshenko and S. Woinowsky-Kreiger (1964), and *Thin Elastic Shells* by Harry Kraus (1967).

The shutter assembly, beams, and anchor structures are shell structures formed using the MEMS sidewall beams process described above. The load-bearing anchoring structure is constructed using two basic elements, a sidewall and a shelf. Both of these surfaces may be totally or partially flat, curved, angled, or multi-faceted, with the distinction that a sidewall is a primarily non-horizontal surface with respect to the plane of the substrate, and a shelf is a surface primarily parallel to the plane of the substrate. The sidewall and shelf surfaces are substantially orthogonal to each other, where the angle between such substantially orthogonal surfaces shall not be less than 20 degrees or greater than 160 degrees.

The anchor structure is formed using a combination of the above-described sidewalls and shelves in order to enhance the second moment of inertia about one or more axes. Also known as the second moment of area, the second moment of inertia of a structure predicts its resistance to bending and is dependent on the geometry of the cross-section of the structure. For example, 1-beams have a higher second moment of inertia than other beams of the same cross-sectional area and are the preferred building material because of their resistance to bending. Constructing anchor structures from coupled or interconnected sidewalls and shelves creates structures with a higher second moment of inertia that resists the deflection of beams attached to them. The above effect is better understood when we look at the simplest structural element using this principle.

The use of a combination of sidewalls and shelves to create a corrugated anchor structure not only increases the second moment of inertia about one or more axes but also increases the polar moment of inertia about one or more axes and therefore increases the torsional stiffness of the anchor structure. Any increase in the second moment of inertia by changing the anchor structure will also generally result in an increase of the polar moment of inertia of that same anchor structure. In any subsequent references to the enhancement of the second moment of inertia, an enhancement of the polar moment of inertia is also implied, and vice versa.

Figure 13A:
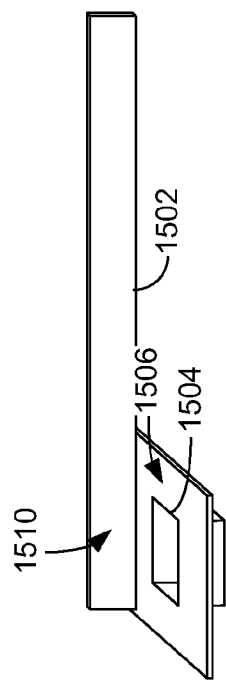
FIGS. 13A-C represent trimetric views of illustrative embodiments of the anchor structure elements.

FIG. 13A illustrates a simple anchor structure, constructed from the combination of the sidewalls and shelves described above. These elements can be combined in various embodiments to construct a stiffer anchor structure. One of the critical functions of the anchor structure is to secure the shutter assembly to the underlying substrate. The substrate surface onto which the anchor is attached is also referred to as a primary or horizontal surface. The part of the anchor structure attached or coupled to the substrate surface and is comprised of one or more sidewalls is the non-horizontal elevating portion (NHEP) 1504. In one embodiment, this NHEP is formed by at least one sidewall. Other embodiments may be formed by the combination of two or more vertically-coupled NHEPs that form a vertical corner rising from the substrate. Yet other embodiments may be formed out of two or more vertically unconnected (or partially-coupled) NHEPs. These non-horizontal elevating portions also provide the critical vertical separation of the beams and shutter body from the substrate.

Figure 14A:
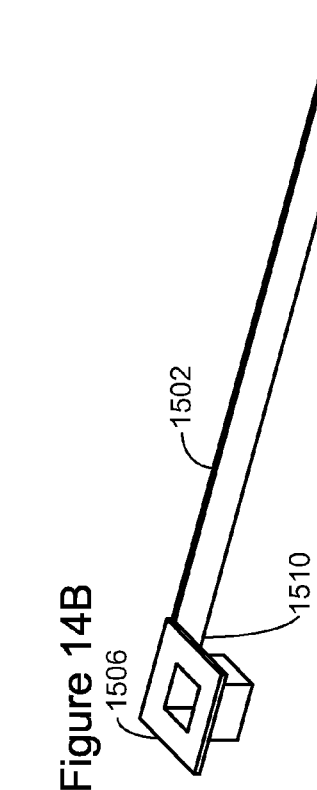
FIGS. 14A-D represent trimetric views of additional illustrative embodiments of the anchor structure elements.
Figure 14B:
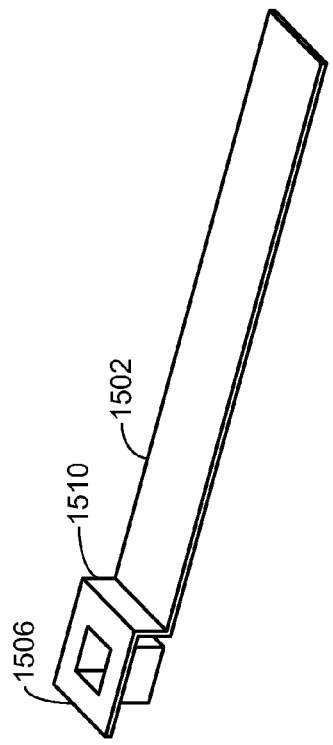
Figure 14C:
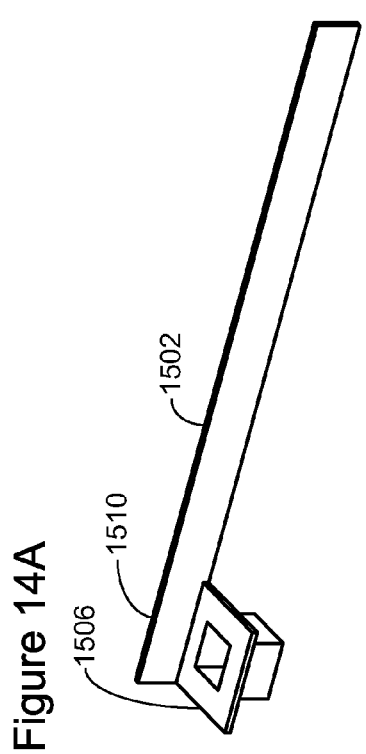
Figure 14D:
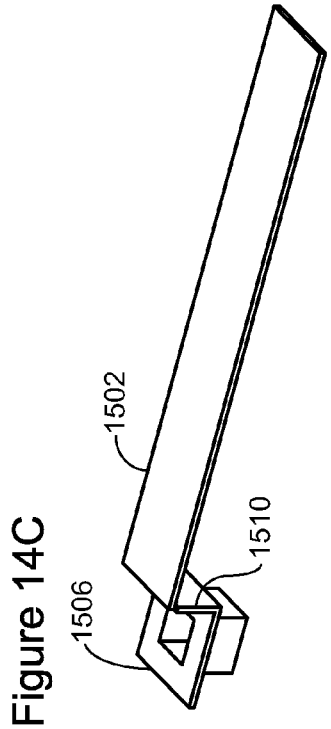

Coupled to the NHEP is the substantially horizontal shelf, 1506. In one embodiment the substantially-horizontal shelf portions are all coupled, generating a surface with increased torsional stiffness in all axes. In alternate embodiments, the shelf portions may be partially coupled or connected. The shelf represents a substantially-horizontal surface on which to create a non-horizontal, shell-stiffening portion (NHSSP) 1510 to which the beam 1502 is coupled or connected. The beam 1502 can be connected to NHSSP 1510 at any location other than that connected to the shelf 1506. FIG. 14 depicts some of these possible configurations. Although in the embodiment illustrated in FIG. 13A the NHSSP is placed on top of the shelf, alternate embodiments where the NHSSP "hangs" from the shelf are also possible, as depicted in FIG. 14B. FIGS. 14C-D depict embodiments where beam 1502 is a horizontal beam, and it attaches to the upper portion of the NHSSP from the substantially horizontal shelf 1506. FIG. 14D shows a similar embodiment to FIG. 14C where beam 1502 is also horizontal but in this case the beam attaches to the lower portion of the NHSSP. Because the above structures are created using a MEMS sidewall process, they are essentially portions of a single shell.

The structure shown in FIG. 13A has significant advantages in stiffness and support of any beams coupled to it, especially over the simple coupling of beams to the non-horizontal elevating portions (NHEP). To see why. We see in FIG. 13A that the non-horizontal shell stiffening portion 1510 is provided with a much larger surface of support 1506 than if it were simply connected to the NHEP 1504. This translates into a smaller tendency by the beam 1502 to bend as a result of the shutter movement. Similarly, any rotation along the axis of the beam 1502 is countered by the resistance of the much larger surface of the shelf 1506.

Figure 17:
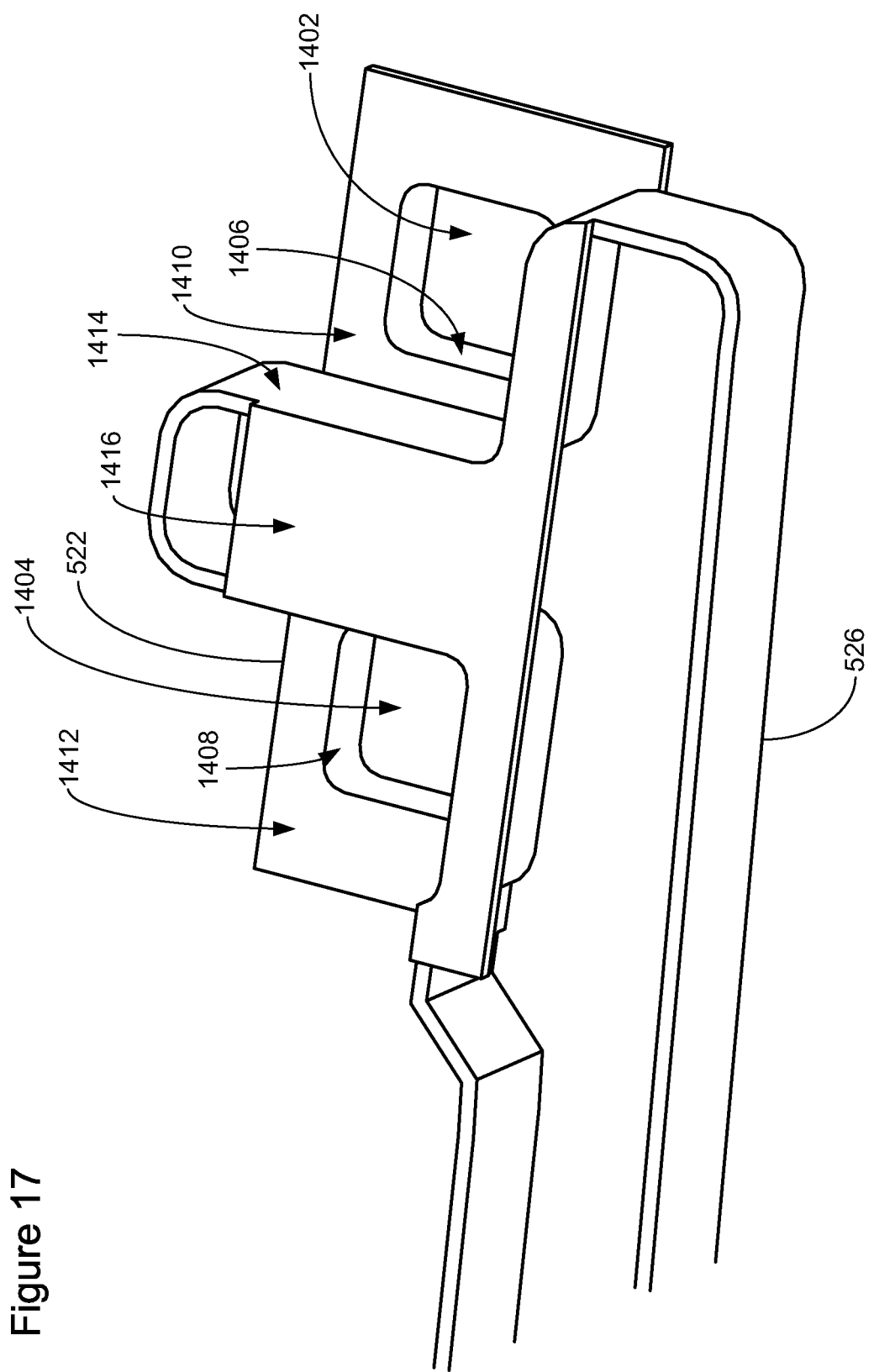
FIG. 17 is a trimetric view of an illustrative embodiment of the anchor structure for the drive beam of an example two-spring shutter.

The combination of non-horizontal portions (be they elevating portions, NHEP, or shell stiffening portions, NHSSP) coupled to substantially-horizontal shelf sections has the effect of creating structural folds, similar to corrugated cardboard construction, such as in FIG. 17. These structural folds provide additional stiffness to the anchor and also ensure the required elevation for the beams above the substrate.

Figure 13B:
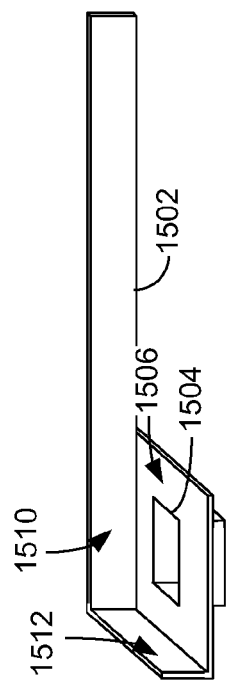

FIG. 13B illustrates an example embodiment that further enhances the stiffness of the anchor by adding NHSSP 1512, which couples to NHSSP 1510 and shelf 1506. The resulting anchor structure increases the resistance of the beam 1502 to vertical deflection, and also increases the resistance of the beam 1502 to torsion, or rotation along its length axis. This in turn increases the resistance of such a beam to forces that may deflect the beam and resultantly the shutter attached to the beam up or down. Note that many structures would make this possible, including one where the angle of the NHSSP to the shelf is substantially shallow, as long as the NHSSPs are continuously coupled to each other and the shelf.

Figure 13C:
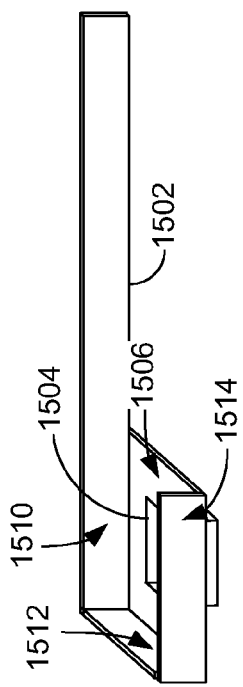

Finally, FIG. 13C extends from FIG. 13B by adding NHSSP 1514, which couples to both NHSSP 1512 and shelf 1506, and further stiffens the anchor structure.

While FIGS. 13A-C illustrate the case when the anchor structure is built using near-orthogonal surfaces, it is clear many embodiments are possible utilizing alternate angles. While the most efficient increase in stiffness is generated by maximizing the orthogonality between elements, any continuous change of angle between elements contributes to stiffness. Therefore, though the optimal angle is 90 degrees, the stiffness is affected given any change of angle between NHEP 1512 and NHEP 1510. Thus, we can see in the illustrative embodiments of FIGS. 12D (round bend), 12E (semi-circular loop) and 12F (Triangular bend) that a similar effect to that of FIG. 12A is created.

FIG. 12D illustrates an example embodiment (similar to that of FIG. 12B) where the substantially-orthogonal NHSSPs 1510 and 1512 are implemented as a single, continuous entity. In such an embodiment, two or more unit normal vectors taken from the surface of the non-horizontal shell stiffening portion 1520 are substantially different.

Similarly, in FIG. 12E, the combined NHSSPs 1510, 1512, and 1514 of FIG. 13C are combined into a single, continuous U structure, where again, two or more unit normal vectors taken from the surface of the non-horizontal shell stiffening portion 1522 are substantially different.

Finally, angles other than near-orthogonal ones may be used, as seen in FIG. 12F. NHSSPs coupled to each other at an angle less than 90 degrees and closer to 45 degrees is used to generate an anchor structure that is resistant to deflection and torsion.

Figure 10:
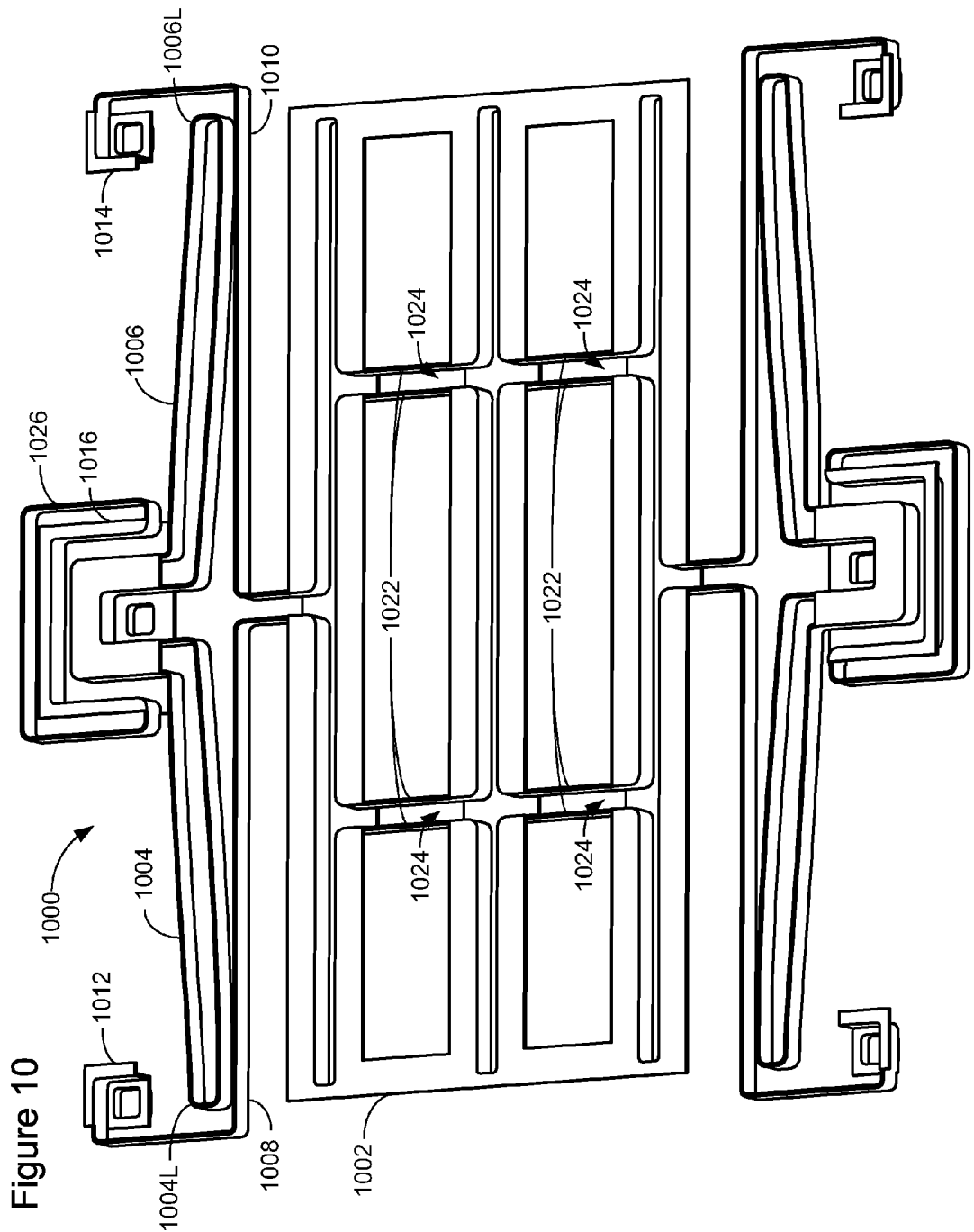
FIG. 10 is a plan view of a four-spring shutter assembly according to an illustrative embodiment of the invention.

As was seen in the standard embodiment illustrated in FIG. 10, the above is the minimum, but significantly enhanced performance may be obtained when more sidewall/shelf combinations are used. Thus, as seen in the various anchor structures in the illustrative examples shown in FIGS. 10, 11, 12, 15, 16, and 17, the above concept may be embodied through various shelf/sidewall pairings.

Dual Anchors

Figure 8A:
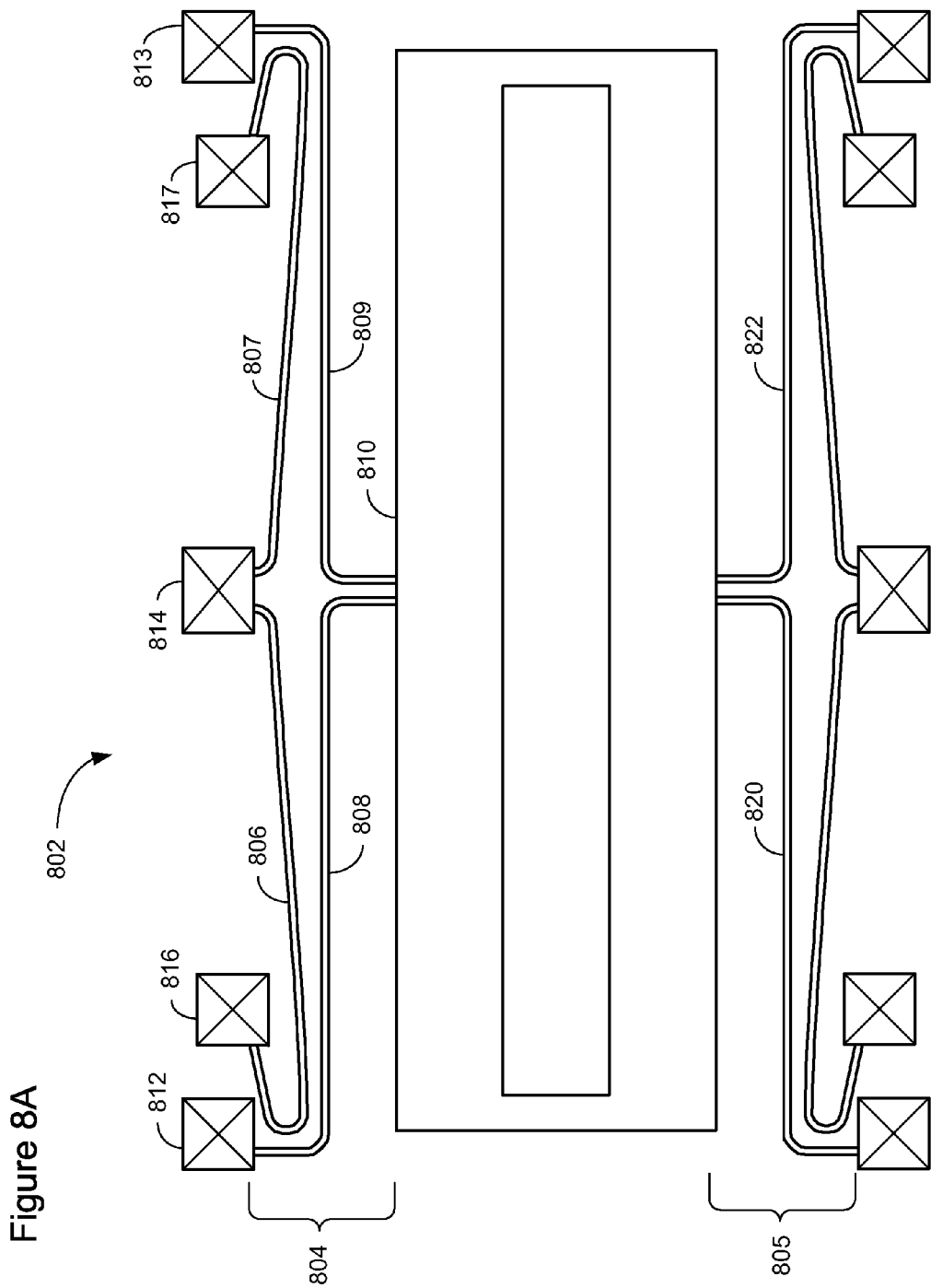
FIG. 8A-B are a plan view of a shutter assembly which includes dual anchors on the drive beams, and a drive beam formed into a loop which is attached to a single anchor, according to illustrative embodiments of the invention.

FIG. 8A illustrates a portion of a light modulation assembly 802 including dual compliant actuator assemblies 804 and 805 which are functionally similar to the actuators 402 and 404 designed for the shutter assembly 400 according to an illustrative embodiment of the invention. A design like this is referred to as a four-spring design, for each shutter end has two load beams (808, 809, 820, 822) attached to them. The actuators on one side, e.g. the shutter-open actuators, include drive beams (806, 807) along with compliant load beams (808, 809). The load beams (808, 809) support the shutter 810 at one of its ends, and are attached to respective load beam anchors (812, 813) at the other. Both of the drive beams (806, 807) are attached to a central drive beam anchor 814 at one end of said beam and attached to supplementary drive beam anchors (816, 817) at the other end of the beam. The arrangement is repeated on the other end of the shutter (820, 822). The load beams on the other side of the shutter (820, 822) are associated with the shutter-closed actuator 805.

The supplementary drive beam anchors (816, 817) act to limit the deformation or shape change which might otherwise occur within the drive beams (806, 807). A mechanical beam, such as beam 806, which is fixed, supported, or anchored at two points along its length will more easily retain its shape even under the influence of residual stresses or external loads. Note that the drive beam 806 is still free to move or deform at points in between the anchors 814 and 816 and is therefore partially compliant, so that the actuation voltage of the actuator assembly 804 is still less than would be the case with a completely rigid drive beam.

Looped Beams

Figure 8B:
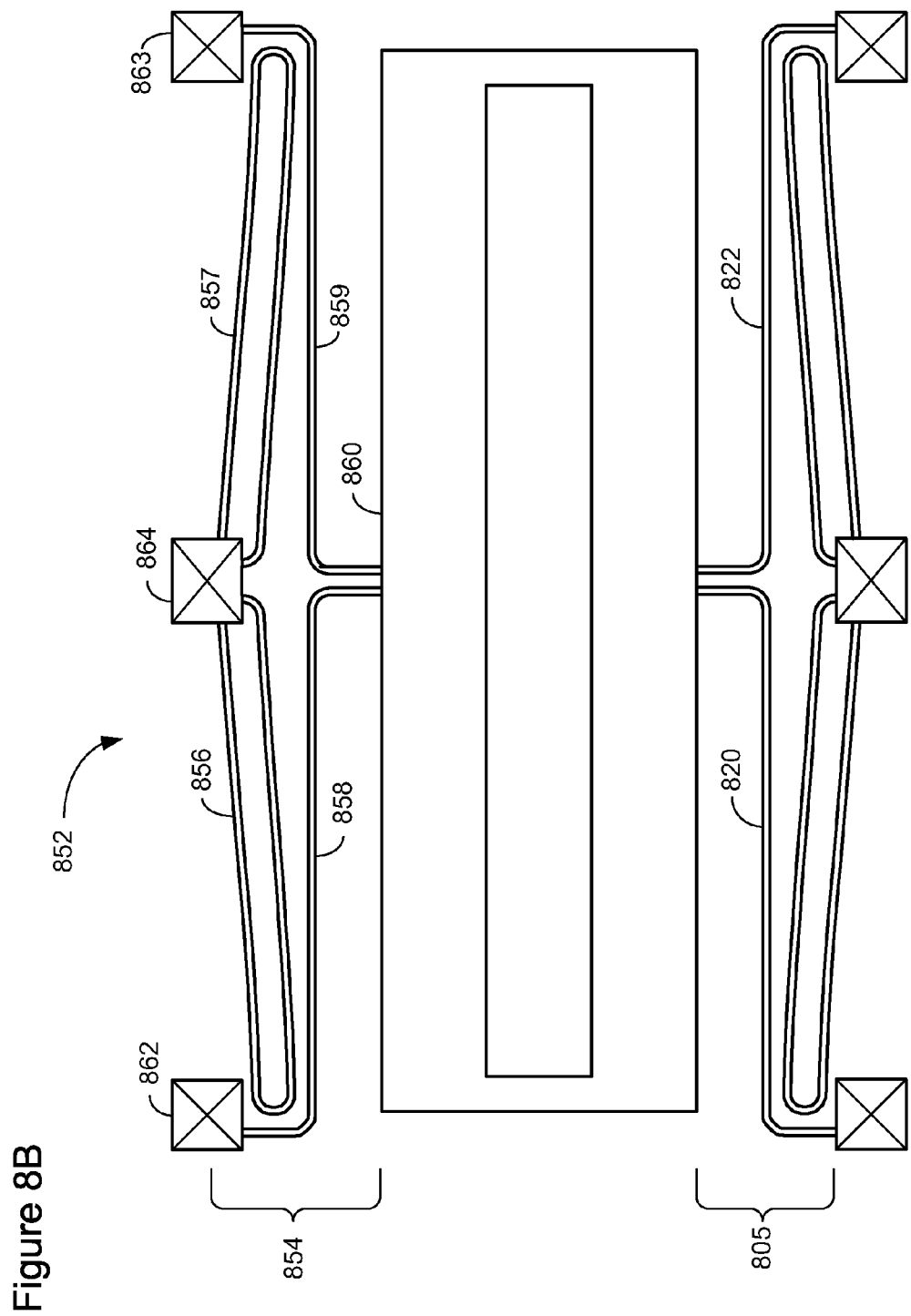

FIG. 8B illustrates a portion of a shutter assembly 852 including dual compliant actuator assembly 854, which is functionally similar to the actuator 404 designed for the shutter assembly 400 according to an illustrative embodiment of the invention. The actuator assembly 854 includes compliant drive beams (856, 857) along with compliant load beams (858, 859). The load beams (858, 859) support the shutter 860 on one end and are respectively attached to load beam anchors (862, 863) at the other end. The drive beams (856, 857) are formed into a loop wherein each end of the drive beam is attached to a common anchor 864. Along the loop there is a section of outgoing beam which is substantially parallel to a returning section of the same beam. When formed in a sidewall beam process, the stresses which would tend to deform the outgoing section of the looped drive beam (856, 857) will mirror or oppose the stresses along the returning section of beam. The forces which would otherwise cause the drive beam to bend or move from its designed position are therefore substantially cancelled, and the distal position of the looped drive beams (856, 857) does not move substantially after removal from the mold.

Partial or Asymmetrical Looped Beams

Figure 9:
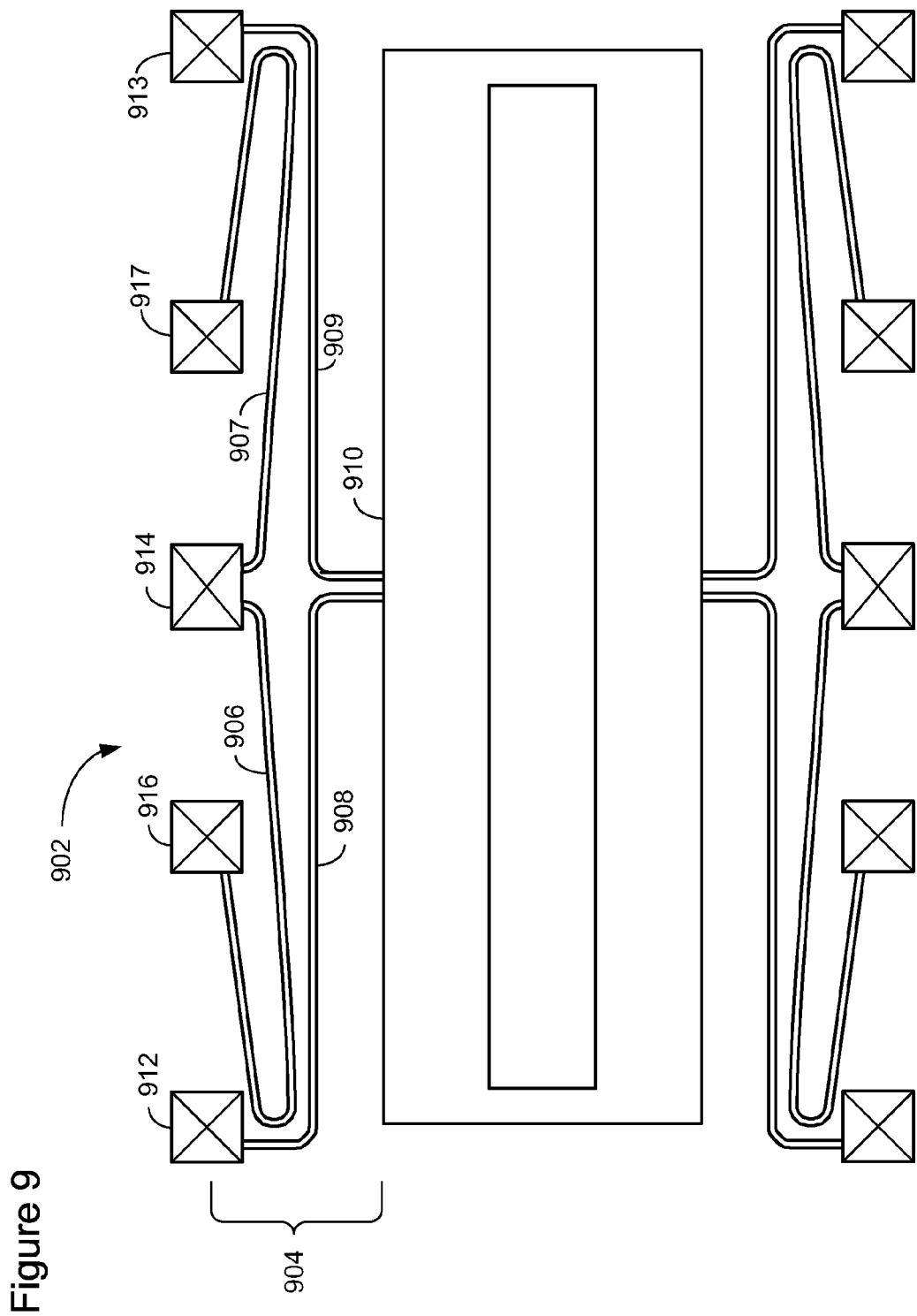
FIG. 9 is a plan view of a shutter assembly which includes dual anchors on the drive beams and in which the drive beam is formed into a loop, according to an illustrative embodiment of the invention.

FIG. 9 illustrates a portion of a shutter assembly 902 including dual compliant actuator assembly 904 which is functionally similar to the actuator assembly 404 designed for the shutter assembly 400 according to one illustrative embodiment of the invention. The actuator assembly 904 includes compliant drive beams (906, 907) along with compliant load beams (908, 909). The load beams (908, 909) support the shutter 910 on one end and are attached to respective load beam anchors (912, 913) at the other end. Both of the drive beams (906, 907) are attached to a central drive beam anchor 914 at one end and attached to respective drive beam supplementary anchors (916, 917) at the other end.

The drive beam supplementary anchors (916, 917) are positioned and the drive beams (906, 907) are shaped so as to form a partial loop. Along the loop there is a section of beam which projects out from the central anchor 914 which is substantially parallel to a returning section of the same beams before they are respectively attached to supplementary anchors (916, 917). The lengths of these two straight line sections in the loop are not equal. This asymmetry provides the opportunity to create or allow for an advantageous shape change in the loop after release from the mold. Either because of residual stresses, or because of a length change (shrinkage or expansion) along the drive beams (906, 907), the forces experienced at the distal end of the loop can cause it be move in a direction parallel to the substrate. A small or controlled motion of the distal end of drive beam 906 after release from the mold and in a direction toward the load beams (908, 909) can thereby be promoted. This motion can be accomplished with a minimum risk that the drive beams (906, 907) and the load beams (908, 909) will actually touch before the encapsulating dielectric is applied.

FIG. 10 shows an trimetric projection of light-modulator assembly 1000 including dual-compliant actuators on each end of the shutter 1002, according to an illustrative embodiment of the invention. The actuator assembly includes compliant drive beams (1004, 1006) along with compliant load beams (1008, 1010). The load beams (1008, 1010) support shutter 1002 at one end and are each attached to a load beam anchor (1012, 1014) at the other end. The drive beams (1004, 1006) are formed into a loop wherein each end of the drive beam is attached to common anchor 1016. The drive beams are cantilevered (supported only on one side) to anchor 1016, and loops (1004L, 1006L) are free to move.

As discussed with respect to shutter assembly 852, the inclusion of a looped shape for drive beams 1004L and 1006L helps to minimize any in-plane deflection of the drive beams that might result from stresses in the beams. However, there is still a concern that the drive beams are prone to change their elevation above the substrate as a result of its own stresses.

A change in elevation above the substrate of the shutter load beam (1008, 1010) could subsequently change the elevation of the shutter. The designer prefers to maintain the shutter at a certain fixed elevation above the aperture. If the shutter is too close to the substrate, the result could be the shutter permanently "sticking" to the substrate. Such contact risks the loss of shutter movement, and could result in a potential loss of a pixel in the display. Conversely, if the shutter were elevated above its design elevation, light leakage may increase. This would result in loss of optical contrast at that pixel.

Figure 11:
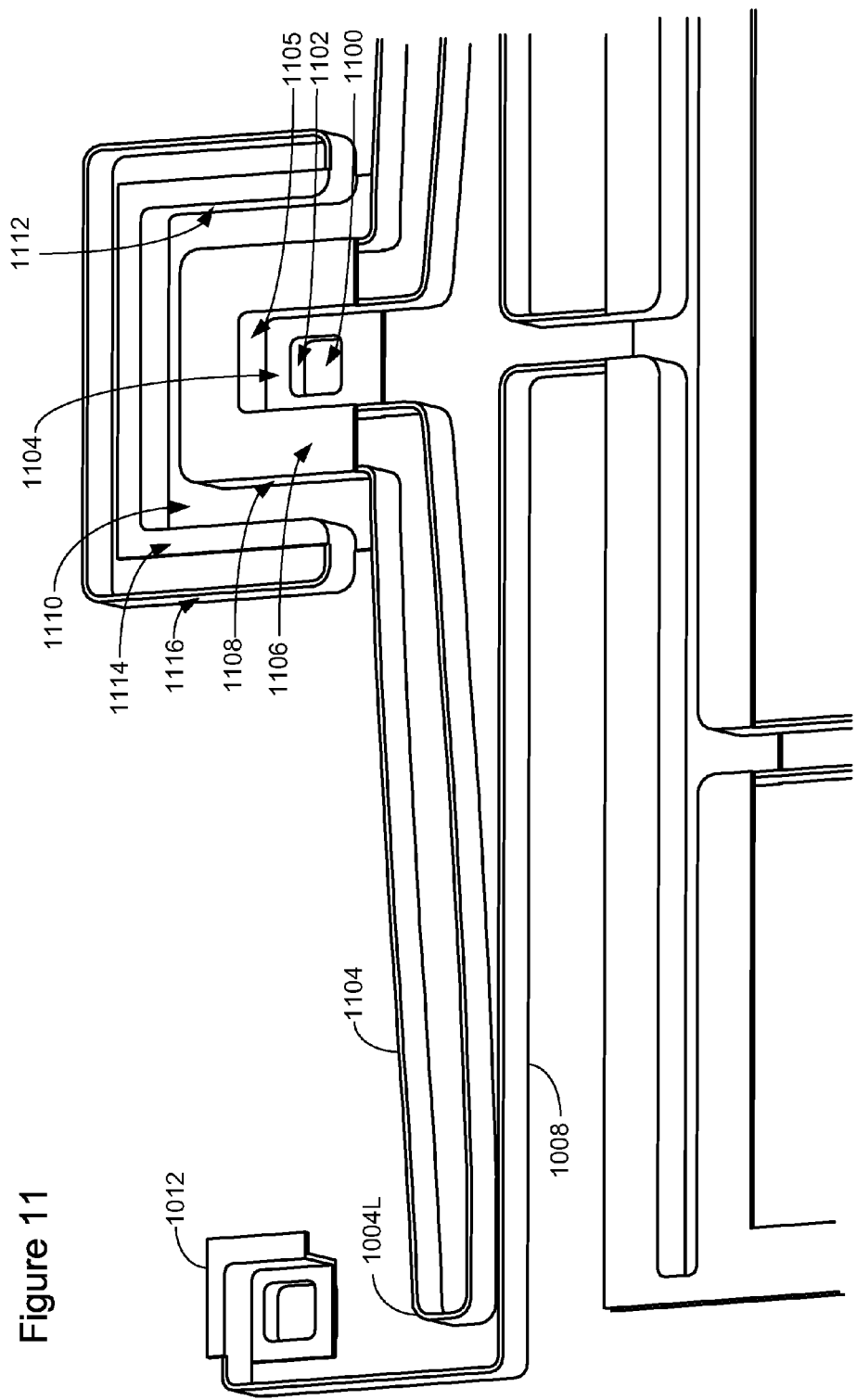
FIG. 11 is a trimetric view of an illustrative embodiment of the drive beam anchor and compliant beam anchor structures.

As seen in FIG. 10, the design of anchor 1016 of the drive electrode of the four-spring shutter assembly 1000 has significant stiffening elements. (A closer view of this drive electrode is depicted in FIG. 11.) Its anchor base 1100 is securely attached to the substrate. Coupled to the anchor base, sidewall well 1102 is comprised of several NHEP sidewalls and provides the critical rise in elevation of the beams above the substrate. Shelf 1104 is coupled to the top of the sidewall well 1102. A set of NHSSP sidewalls 1105 couples to shelf 1104 and 1106, which in turn couples to NHSSP 1108 and then to shelf 1110. This corrugated structure formed by the intersections of NHSSP sidewalls and shelves provide improved resistance to deflection and torsion of beam 1004 and 1006, i.e. an enhancement of the second and polar moments of inertia.

In one embodiment, an anchor can be constructed in which the three-sided sidewall 1105 and 1108 and shelf 1106 are not continuous. In other words, there is a break in 1105, 1108, and 1106 along the symmetry axis of the anchor. However, if a structure like this is used, the looped ends of the drive beams (1004, 1006) tend to deflect towards the substrate under certain stresses. The resulting deflection down in elevation at the looped end of the beams has been shown to be as much as 1.5 micrometers. Such a downward deflection could cause the drive beams to touch the substrate, hindering the movement of the beams. Under different stresses, the drive beams may tend to deflect away from the substrate. Any out-of-plane deflection would misalign the drive beams (1004, 1006) to the shutter load beams (1008, 1010) and would reduce the electrostatic force between them and impair actuation.

Figure 18A:
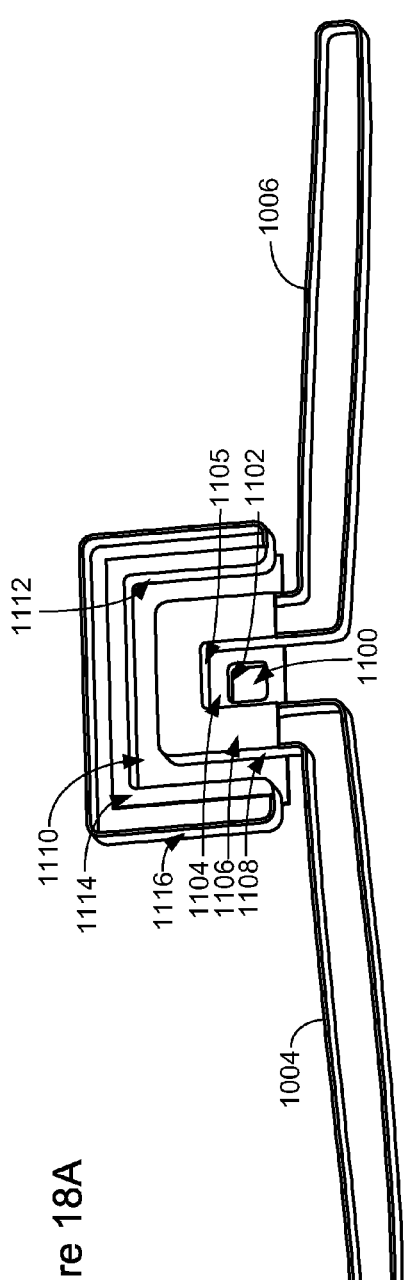
FIGS. 18A-B represent close-up trimetric views of illustrative embodiments of the anchor structure elements.
Figure 18B:
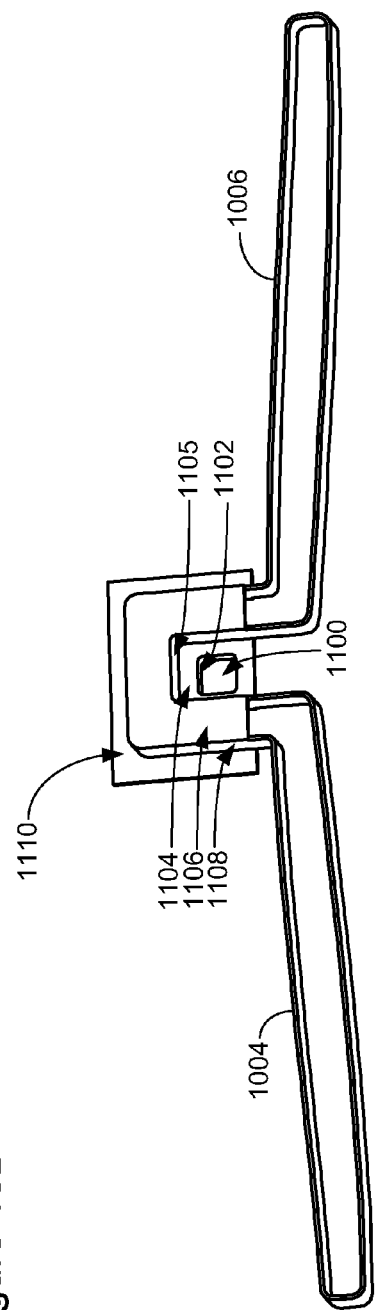

The addition of the continuous sidewall and shelf combination (1105, 1106, 1108) creates a stiffer anchor, more resistant to deflection and torsion, as seen in FIG. 18B. In another embodiment, depicted in FIG. 18A, an additional shelf 1110 is formed that couples to sidewall 1108 and to sidewall 1112, which continues and connects to outside loop sidewall 1116 and couples to shelf 1114. Again, the substantially orthogonal sidewall-shelf combinations create a corrugation effect that translates into an enhancement of the second moment of inertia of the anchor of drive beams 1004 and 1006. Using such an embodiment, the drive beams has been shown to deflect out-of-plane by only 0.15 micrometers. The inclusion of anchors with structures implementing two or more perpendicular wall-shelf combinations creates a solid base for the compliant beam that resists flexing and torsion along the beam.

In one embodiment, space is efficiently used by making the width of shelf 1104 (that is, the distance connecting sidewall 1105 to the sidewall well less than 100 times the thickness of the side beam. This results in a small anchor footprint with minimal distance between parallel walls.

Figure 15:
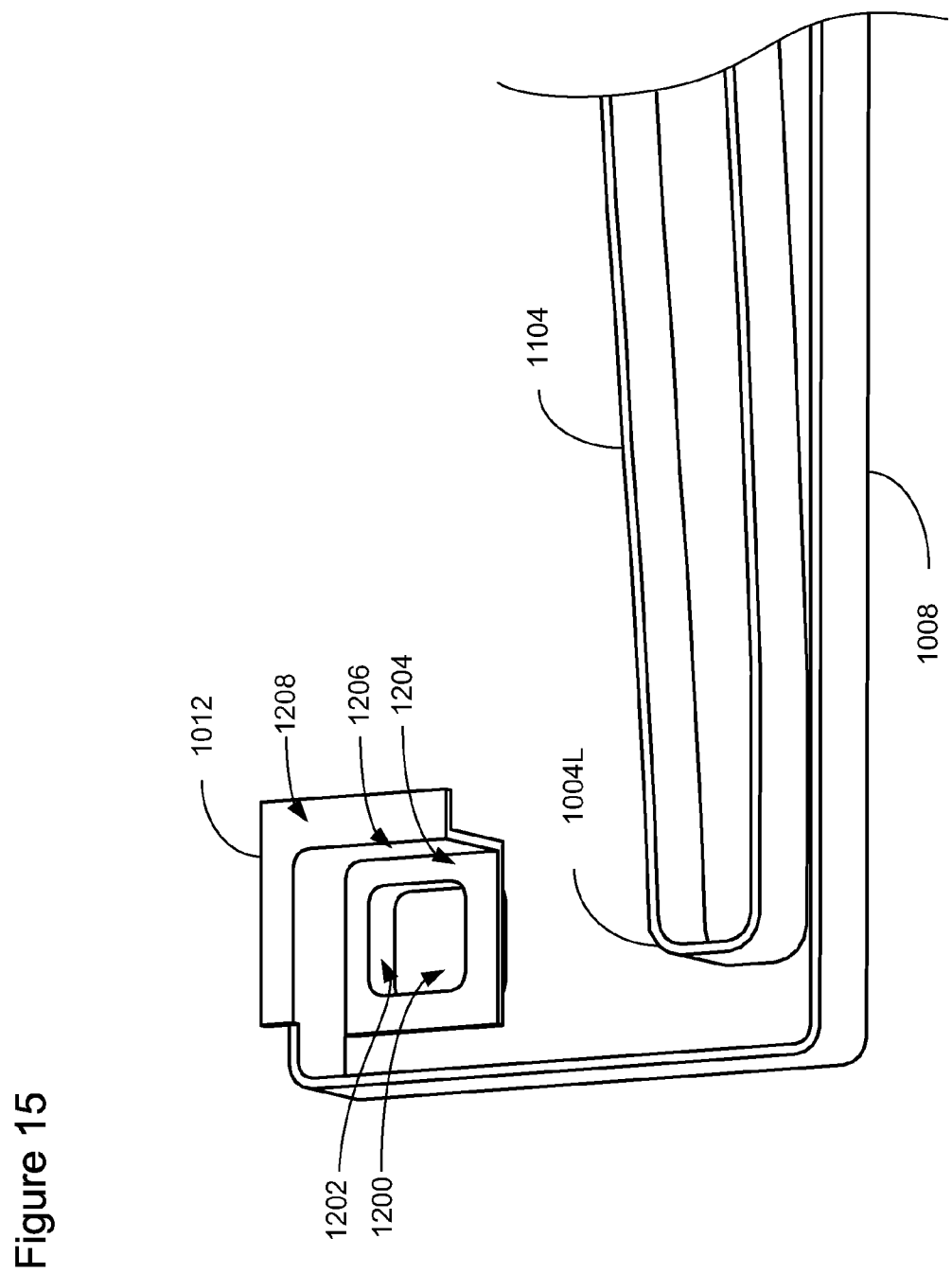
FIG. 15 is a trimetric view of an illustrative embodiment of a compliant load beam anchor.

A similar structure may be used in the construction of the shutter load beam anchors (1012, 1014). FIG. 15 illustrates an embodiment of shutter anchor 1012, which is the anchor for shutter load beam 1008. This anchor is a mirror of anchor 1014. The anchor base 1200 is attached to the substrate, and the anchor bottom well is formed by the NHEP sidewall 1202, which is coupled to base 1200. Shelf 1204 is coupled to NHEP sidewall well 1202 and serves as the base for the NHSSP sidewall 1206. The compliant shutter load beam 1008 is coupled to NHSSP sidewall 1206. There is also an additional shelf 1208 coupled to NHSSP sidewall 1206 that enhances the anchor stiffness. The coupling of the substantially orthogonal shelf-sidewall combinations serves to stiffen (by increasing its second and polar moments of inertia) the anchoring point for compliant shutter load beam 1008. A stiffer anchor resists torsion and vertical deflection of the compliant shutter load beam 1008 from its own stresses or that of the shutter.

Figure 16:
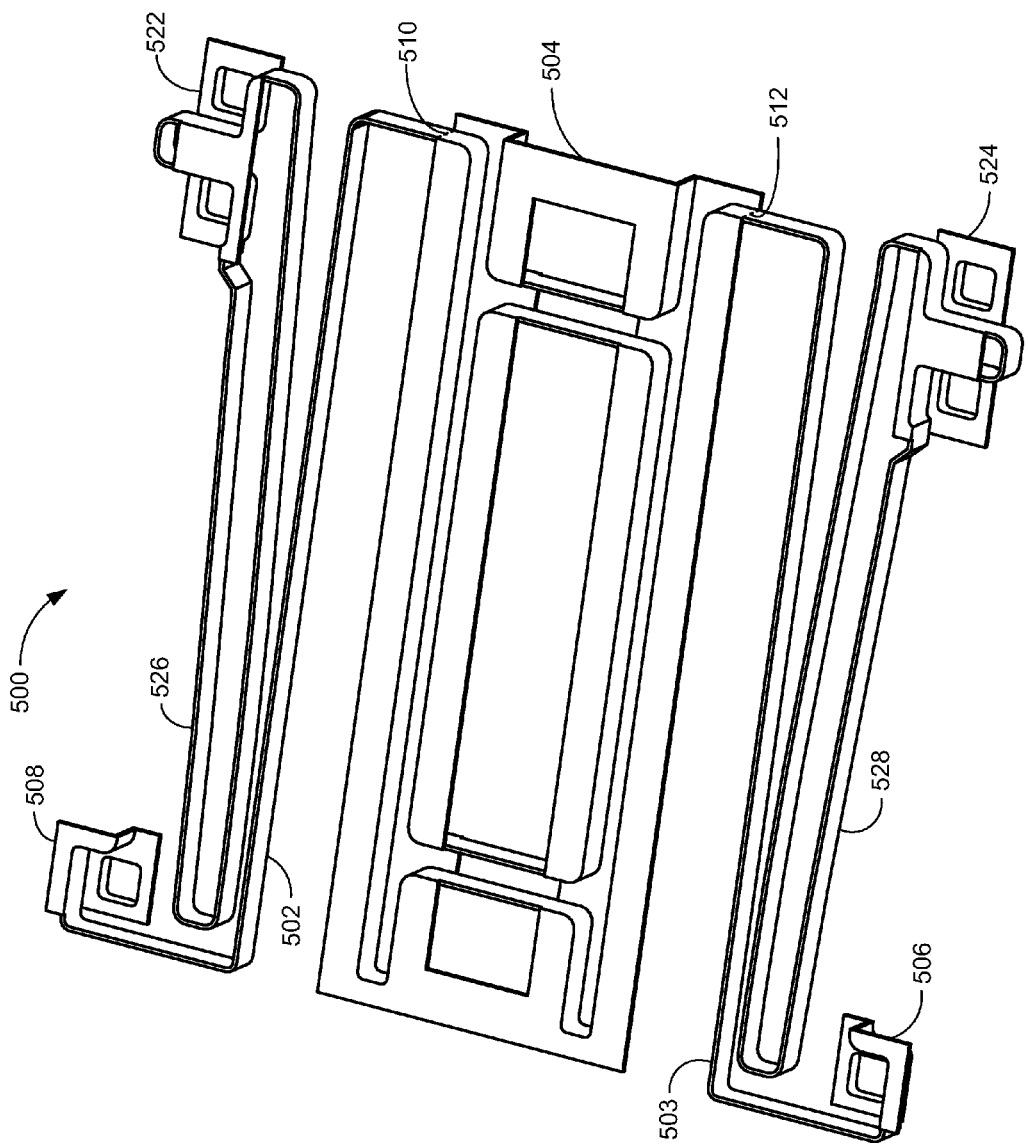
FIG. 16 is a trimetric view of an illustrative embodiment of an example two-spring shutter.

FIG. 16 depicts a trimetric projection of a possible embodiment of the two-spring shutter seen in FIG. 5. As in the four-spring embodiment, a drive beam (526, 528) that is attached to an anchor (522, 524) is designed to electrostatically attract a compliant shutter load beam (502, 503), which is attached to an anchor (508, 506) and shutter 504 at a shutter connection point (510, 512). Unlike the four-spring shutter assembly, the compliant load beam (502, 503) of the two-spring embodiment spans the complete shutter structure 504. While efficient, a longer beam tends to amplify any undesirable behavior due to torsional or deflection effects of drive beams (526, 528), load beams (502, 503), and shutter 504.

The critical area for supporting the load beam 502 occurs at anchor point 508. The anchor is made stiffer by the inclusion of two perpendicular shelf-sidewall combinations in a fashion similar to that described in FIG. 15 above.

FIG. 17 is a close-up of an illustrative embodiment of drive beam anchor 522 from FIG. 16 in a two-spring embodiment. The drive beam anchor is attached to the substrate by two anchor bases (1402, 1404), around which NHEP sidewall wells (1406, 1408) are coupled. Shelves (1410, 1412) are coupled to the NHEP sidewall wells around their periphery. NHSSP sidewall 1414 couples to and connects shelves (1410, 1412) and continues around to form the looped drive beam 526. An additional shelf 1416 is connected on top of NHSSP 1414, which provides additional anchor stiffness. Again, by providing two or more substantially orthogonal sidewall/shelf combinations, a structure is created that is a solid base for the beam, allowing less out-of-plane flexing of the cantilevered beam attached to it.

Constructing substantially orthogonal sidewall and shelf combinations in anchors can similarly be used where the shutter load beam connects to the shutter and in the shutter structure itself. These sidewall and shelf combinations in the shutter structure create stiffening ribs that not only maximize the second moment of inertia with respect to shutter elevation but also minimize shutter deformation and torsion due to inherent and/or applied stresses.

In concluding the detailed description, it should be noted that it would be obvious to those skilled in the art that many variations and modifications can be made to the preferred embodiment without substantially departing from the principles of the present invention. Also, such variations and modifications are intended to be included herein within the scope of the present invention as set forth in the appended claims. Further, in the claims hereafter, the structures, materials, acts and equivalents of all means or step-plus function elements are intended to include any structure, materials or acts for performing their cited functions.

It should be emphasized that the above-described embodiments of the present invention, particularly any preferred embodiments are merely possible examples of the implementations, merely set forth for a clear understanding of the principles of the invention. Any variations and modifications may be made to the above-described embodiments of the invention without departing substantially from the spirit of the principles of the invention. All such modifications and variations are intended to be included herein within the scope of the disclosure and present invention and protected by the following claims.

The present invention has been described in sufficient detail with a certain degree of particularity. The utilities thereof are appreciated by those skilled in the art. The invention may be embodied in other specific forms without departing from the spirit or essential characteristics thereof. The forgoing embodiments are therefore to be considered in all respects illustrative, rather than limiting of the invention. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

What is claimed is:

1. A MEMS device comprising:
   a substrate including a surface;
   a shutter suspended over the surface, the shutter including a first side and second side, the second side being substantially opposite to the first side along an axis of movement of the shutter;
   a first actuator coupled to the first side of the shutter via a first compliant beam; and
   a second actuator coupled to the second side of the shutter via a second compliant beam,
   wherein the first actuator is the only actuator coupled to the first side of the shutter.

2. The MEMS device of claim 1, wherein the first compliant beam includes an attachment point to the shutter that is substantially along the axis of movement of the shutter.

3. The MEMS device of claim 2, wherein the second compliant beam includes an attachment point to the shutter that is substantially along the axis of movement of the shutter.

4. The MEMS device of claim 1, wherein the shutter is in a first position along the axis of movement in response to the first actuator being in a relaxed state and the second actuator being in an actuated state.

5. The MEMS device of claim 1, wherein the shutter is in a second position along the axis of movement in response to the first actuator being in an actuated state and the second actuator being in a relaxed state.

6. The MEMS device of claim 1, wherein the shutter includes one or more shutter apertures.

7. The MEMS device of claim 1, wherein the first compliant beam includes a first electrode.

8. The MEMS device of claim 7, wherein the second compliant beam includes a second electrode.

9. The MEMS device of claim 1, wherein the surface includes an aperture for allowing the passage of light over which the shutter is at least partially suspended.

10. A MEMS device comprising:
    a substrate including a surface;
    a shutter suspended over the surface, the shutter including a first side and second side, the second side being substantially opposite to the first side along an axis of movement of the shutter;
    a first means for moving the shutter coupled to the first side of the shutter via a first compliant beam; and
    a second means for moving the shutter coupled to the second side of the shutter via a second compliant beam,
    wherein the first means is the only means coupled to the first side of the shutter.

11. The MEMS device of claim 10, wherein the first compliant beam includes an attachment point to the shutter that is substantially along the axis of movement of the shutter.

12. The MEMS device of claim 11, wherein the second compliant beam includes an attachment point to the shutter that is substantially along the axis of movement of the shutter.

13. The MEMS device of claim 10, wherein the shutter is in a first position along the axis of movement in response to the first means for moving the shutter being in a relaxed state and the second means for moving the shutter being in an actuated state.

14. The MEMS device of claim 10, wherein the shutter is in a second position along the axis of movement in response to the first means for moving the shutter being in an actuated state and the second means for moving the shutter being in a relaxed state.

15. The MEMS device of claim 10, wherein the shutter includes one or more shutter apertures.

16. The MEMS device of claim 10, wherein the first compliant beam includes a first electrode.

17. The MEMS device of claim 16, wherein the second compliant beam includes a second electrode.

18. The MEMS device of claim 10, wherein the surface includes an aperture for allowing the passage of light over which the shutter is at least partially suspended.

19. The MEMS device of claim 1, wherein the second actuator is the only actuator coupled to the second side of the shutter.

20. The MEMS device of claim 10, wherein the second means is the only means coupled to the second side of the shutter.

* * * * *